United States Patent
Huangfu et al.

(10) Patent No.: US 11,336,301 B2
(45) Date of Patent: May 17, 2022

(54) POLAR CODING METHOD AND APPARATUS

(71) Applicant: HUAWEI TECHNOLOGIES CO., LTD., Guangdong (CN)

(72) Inventors: Yourui Huangfu, Hangzhou (CN); Jian Wang, Hangzhou (CN); Rong Li, Hangzhou (CN); Yunfei Qiao, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/132,597

(22) Filed: Dec. 23, 2020

(65) Prior Publication Data

US 2021/0184695 A1 Jun. 17, 2021

Related U.S. Application Data

(63) Continuation of application No. 16/664,660, filed on Oct. 25, 2019, now Pat. No. 10,917,115, which is a continuation of application No. 16/236,002, filed on Dec. 28, 2018, now Pat. No. 10,511,329, which is a (Continued)

(30) Foreign Application Priority Data

Jul. 28, 2017 (CN) .......................... 201710632016.8

(51) Int. Cl.
*H03M 13/13* (2006.01)
*H04L 1/00* (2006.01)

(52) U.S. Cl.
CPC .......... *H03M 13/13* (2013.01); *H04L 1/0041* (2013.01); *H04L 1/0043* (2013.01); *H04L 1/0057* (2013.01)

(58) Field of Classification Search
CPC .... H03M 13/13; H04L 1/0041; H04L 1/0043; H04L 1/0057
See application file for complete search history.

(56) References Cited

U.S. PATENT DOCUMENTS

| | | |
|---|---|---|
| 10,511,329 B2 | 12/2019 | Huangfu et al. |
| 2013/0094605 A1 | 4/2013 | Larsson |
| 2015/0349909 A1 | 12/2015 | El-Khamy et al. |

(Continued)

FOREIGN PATENT DOCUMENTS

| | | |
|---|---|---|
| CN | 102164025 | 8/2011 |
| CN | 102694625 | 9/2012 |

(Continued)

OTHER PUBLICATIONS

EPO Communication pursuant to Article 94(3) EPC issued in European Application No. 18837591.9 dated Jun. 2, 2021, 7 pages.

(Continued)

*Primary Examiner* — Kyle Vallecillo
(74) *Attorney, Agent, or Firm* — Fish & Richardson P.C.

(57) ABSTRACT

Example polar coding methods and apparatus are described. One example method includes determining a sequence used to code to-be-coded bits. Polar coding is performed on the to-be-coded bits by using the sequence to obtain coded bits. The sequence is used to represent a reliability order of N polarized channels, N is a mother code length of a polar code, and N is a positive integer power of 2.

13 Claims, 3 Drawing Sheets

Determine a sequence used to code to-be-coded bits — 201

Perform polar coding on the to-be-coded bits by using the sequence to obtain coded bits — 202

Related U.S. Application Data continuation of application No. PCT/CN2018/092908, filed on Jun. 26, 2018.

(56) References Cited

U.S. PATENT DOCUMENTS

| | | | |
|---|---|---|---|
| 2016/0013810 A1 | 1/2016 | Gross et al. | |
| 2016/0164629 A1 | 6/2016 | Ahn et al. | |
| 2016/0204811 A1 | 7/2016 | Goela et al. | |
| 2016/0254876 A1 | 9/2016 | Shen et al. | |
| 2017/0111060 A1 | 4/2017 | Huang et al. | |
| 2018/0205496 A1 | 7/2018 | Kudekar et al. | |
| 2018/0278268 A1* | 9/2018 | Jeong | H04L 1/0041 |
| 2018/0331693 A1* | 11/2018 | Lou | H04L 1/0057 |
| 2018/0351695 A1 | 12/2018 | Yang et al. | |
| 2018/0351696 A1 | 12/2018 | Yang et al. | |
| 2019/0097760 A1 | 3/2019 | Hwang et al. | |
| 2019/0215099 A1 | 7/2019 | Dai et al. | |
| 2020/0076534 A1 | 3/2020 | Wang et al. | |
| 2020/0076535 A1* | 3/2020 | Xu | H04L 43/0847 |
| 2020/0099393 A1 | 3/2020 | Xu et al. | |
| 2020/0099469 A1 | 3/2020 | Jiang et al. | |
| 2020/0177309 A1* | 6/2020 | Jang | H03M 13/036 |
| 2020/0213038 A1 | 7/2020 | Zhou et al. | |
| 2020/0228236 A1 | 7/2020 | Xi et al. | |
| 2020/0266841 A1* | 8/2020 | Hui | H03M 13/6368 |
| 2020/0321986 A1* | 10/2020 | Hui | H03M 13/6362 |

FOREIGN PATENT DOCUMENTS

| | | |
|---|---|---|
| CN | 103023618 | 4/2013 |
| CN | 103281166 | 9/2013 |
| CN | 104918063 | 9/2015 |
| CN | 105743621 | 7/2016 |
| CN | 106506079 | 3/2017 |
| CN | 106803759 A | 6/2017 |
| CN | 106817195 | 6/2017 |
| CN | 106877973 | 6/2017 |
| CN | 106982070 A | 7/2017 |
| CN | 105009541 | 6/2018 |
| CN | 109309503 | 2/2019 |
| EP | 3054599 | 8/2016 |
| KR | 20160096684 A | 8/2016 |
| RU | 2610251 C2 | 2/2017 |
| WO | 2016112285 A3 | 9/2016 |

OTHER PUBLICATIONS

Huawei, HiSilicon, "Details of the Polar code design," 3GPP TSG RAN WG1 Meeting #87, R1-1611254, Reno, USA, Nov. 10-14, 2016, 15 pages.

Huawei, HiSilicon, "Theoretical analysis of the sequence generation," 3GPP TSG RAN WG1 #88bis, R1-1705084, Spokane, USA, Apr. 3-7, 2017, 9 pages.

Office Action issued in Japanese Application No. 2020-504305 dated May 24, 2021, 6 pages (with English translation).

Samsung, "Design of a Nested polar code sequences," 3GPP TSG RAN WG1 #89, R1-1708051, Hangzhou, P.R. China, May 15-19, 2017, 13 pages.

Schürch, "A partial order for the synthesized channels of a polar code," 2016 IEEE International Symposium on Infomnation Theory (ISIT), IEEE, Jul. 15, 2016, 6 pages.

"3GPP TS 38.212 V0.0.0 (May 2017),3rd Generation Partnership Project;Technical Specification Group Radio AccessNetwork;NR;Multiplexing and channel coding(Release 15), 10 pages".

International Search Report and Written Opinion issued in International Application No. PCT/CN2018/092908 dated Aug. 30, 2018, 12 pages.

M. M. Wilde and S. Guha, "Polar Codes for Classical-Quantum Channels," in IEEE Transactions on Information Theory, vol. 59, No. 2, pp. 1175-1187, Feb. 2013. (Year: 2013).

Office Action issued in Chinese Application No. 201810709840.3 dated Jun. 11, 2019, 15 pages (with English translation).

Office Action issued in Chinese Application No. 201810709840.3 dated Sep. 19, 2019, 7 pages (with English Translation).

Office Action issued in Chinese Application No. 201911328159.5 dated Jul. 8, 2020, 1 1 pages (with English translation).

Office Action issued in Korean Application No. 2020-7001667 dated May 6, 2021, 4 pages (with English translation).

Office Action issued in Chinese Application No. 201710632016.8 dated Jun. 28, 2021, 7 pages.

Zhengming, Shui, "Polar Coding Theory and Its Quantized Decoding Algorithm," Doctoral Dissertation, Beijing University of Posts and Telecommunications, Mar. 2015, 67 pages (with English abstract).

Office Action issued in Russian Application No. 2020108334/07(013595) dated Sep. 22, 2021, 49 pages (with English translation).

* cited by examiner

POLAR CODING METHOD AND APPARATUS

CROSS-REFERENCE TO RELATED APPLICATIONS

This application is a continuation of U.S. patent application Ser. No. 16/664,660, filed on Oct. 25, 2019, which is a continuation of U.S. patent application Ser. No. 16/236,002, filed on Dec. 28, 2018, now U.S. Pat. No. 10,511,329, which is a continuation of International Application No. PCT/CN2018/092908, filed on Jun. 26, 2018, which claims priority to Chinese Patent Application No. 201710632016.8, filed on Jul. 28, 2017. All of the afore-mentioned patent applications are hereby incorporated by reference in their entireties.

TECHNICAL FIELD

Embodiments of this application relate to the field of communications technologies, and in particular, to a polar coding method and apparatus.

BACKGROUND

As a most basic wireless access technology, channel coding plays a crucial role in ensuring reliable data transmission. In an existing wireless communications system, channel coding is usually performed by using a turbo code, a low-density parity-check (LDPC) code, and a polar code. The turbo code cannot support information transmission at an excessively low or excessively high bit rate. However, for medium-packet or short-packet transmission, it is difficult for the turbo code and the LDPC code to implement desired performance when lengths of the codes are limited, due to coding/decoding characteristics of the turbo code and the LDPC code. In terms of implementation, the turbo code and the LDPC code have relatively high calculation complexity in a coding/decoding implementation process. Theoretically, it is proved that the polar code is a good code that can achieve a Shannon capacity and has relatively simple coding/decoding complexity, and for this reason, the polar code becomes more widely applied.

However, with rapid evolution of the wireless communications system, a future communications system, such as a fifth generation (5G) communications system, has some new characteristics. For example, three most typical communications scenarios include an enhanced mobile broadband (eMBB) Internet, massive machine type communication (mMTC), and ultra-reliable and low latency communications (URLLC). These communications scenarios impose a higher requirement on coding/decoding performance of the polar code.

A reliability order of polarized channels plays an important role in the coding/decoding performance of the polar code. However, in a current phase, accuracy of the reliability order of the polarized channels is not desired. Consequently, further improvement of the coding/decoding performance of the polar code in an application process is affected.

SUMMARY

Embodiments of this application provide a polar coding method and apparatus, to improve accuracy of a reliability order of polarized channels.

According to a first aspect, a polar coding method is provided. At least two sequences with relatively good performance are selected based on a performance determining rule. Same sequence numbers at a same sorting location in the at least two sequences are determined. The determined same sequence numbers are determined as sequence numbers whose reliability remains unchanged in sequences, and the sequence numbers whose reliability remains unchanged in the sequences are sorted based on orders of the sequence numbers in the at least two sequences. Sequence numbers in the at least two sequences other than the determined sequence numbers whose reliability remains unchanged are compared to select some subsequences, and locations of elements in the subsequences may be mutually exchanged. A sorting sequence obtained from above is used as a sorting sequence used for polar coding in this embodiment of this application. In this way, for the sorting sequence obtained by using the foregoing method, a plurality of sequences with relatively good performance can be comprehensively considered, and a sequence number whose reliability remains unchanged is determined by using an intersection set between different sequences. This helps improve accuracy of a reliability order of polarized channels and improve coding/decoding performance of a polar code.

In a possible design, a sequence used to code to-be-coded bits is determined, where the sequence is used to represent a reliability order of N polarized channels; and polar coding is performed on the to-be-coded bits by using the sequence to obtain coded bits, where N is a mother code length of a polar code, and N is a positive integer power of 2.

In a possible design, a length of the to-be-coded bits is K, the K to-be-coded bits are mapped to K polarized channels in the N polarized channels, and reliability of the K polarized channels is higher than reliability of remaining N–K polarized channels.

In a possible design, the sequence used to code the to-be-coded bits is determined based on the mother code length N and a preset sequence.

In a possible design, the sequence used to code the to-be-coded bits is all or a subset of another sequence, the another sequence includes $N_{max}$ sequence numbers, the $N_{max}$ sequence numbers are arranged in the another sequence based on reliability of the $N_{max}$ polarized channels, $N_{max}$ is a positive integer power of 2, and $N_{max} \geq N$.

In a possible design, the sequence meets a nesting characteristic, and the nesting characteristic is as follows: A sequence with a relatively short mother code length of $N_2$ is obtained based on a sequence with a relatively long mother code length of $N_1$. Elements whose sequence numbers are less than or equal to $N_2$ are extracted from the sequence with the relatively long mother code length of $N_1$, and an obtained subsequence is the sequence with the relatively short mother code length of $N_2$. An order of the elements in the obtained sequence with the relatively short mother code length of $N_2$ is the same as an order of these elements in the sequence with the relatively long mother code length of $N_1$.

In a possible design, $N_{max}$ is a maximum mother code length of a polar code, for example, $N_{max}=1024$, or $N_{max}=512$. The sequence needs to meet the nesting characteristic. When a sequence with a maximum mother code length is determined, another sequence with a relatively short mother code length may be obtained based on the sequence with the maximum mother code length. For example, a sequence with a length of 1024 and whose maximum mother code length is 1024 is determined. Elements whose element values are less than or equal to 64 are extracted from the sequence with the length of 1024 to form a subsequence with a length of 64. An order of the elements in the obtained subsequence with the length of 64 is the same as an order of these elements in the sequence with the length of 1024. That is, the extracted subsequence meets the nesting characteristic. Similarly, sequences of lengths 128, 256, and 512 may be extracted from the sequence with the length of 1024. The obtained sequences with the short mother code lengths are applied in this embodiment of this application to code the to-be-coded bits.

In a possible design, the sequence may be a part or all of any one of sequences (1) to (30) in the specification. When N=1024, the sequence may be a part or all of any one of sequences S1 to S20 in the specification.

In a possible design, when a value of N is 64, 128, 256, or 512, the sequence may be extracted from a preset sequence with a maximum mother code length based on the nesting characteristic, or a sequence corresponding to a code length in the sequences (1) to (30) in the specification may be directly used.

Polar construction is performed by using the sequence, so as to help improve accuracy of evaluating reliability of a polarized channel, thereby improving coding/decoding performance of a polar code.

A minimum value of a sequence number in any one of the sequences S1 to S20 in the specification is 1, and sequence numbers are arranged in ascending order of reliability of the N polarized channels. In a possible design, if the sequence numbers in the sequence are arranged in ascending order of the reliability of the N polarized channels and a minimum value of the sequence numbers of the sequence is 0, a new sequence is obtained by sequentially subtracting 1 from the sequence numbers in any sequence, and sequence performance is not affected.

Similarly, in a possible design, if the sequence numbers in the sequence are arranged in descending order of the reliability of the N polarized channels, a new sequence may be obtained by arranging sequence numbers in any one of sequences S1 to S20 in the specification in a reverse order, and the sequence performance is also not affected.

In a possible design, the sequence may also be represented by using a sequence of normalized reliability or equivalent reliability of channels. For example, if a sorting location of a channel x in the sequence is n (a minimum sequence number in the sequence is denoted as 1), reliability of the channel may be represented by n or normalized n/N.

In a possible design, locations of a few elements in any one of the sequences S1 to S20 in the specification may be mutually exchanged. For example, a location of a sequence number may be adjusted within a specified amplitude. For example, the specified amplitude is 5, and a location of an element whose sequence number is 10 may be adjusted within a range from five locations on the left of the element to five locations on the right of the element.

According to a second aspect, a polar coding apparatus is provided, and the apparatus has functions of implementing the method according to any one of the first aspect or the possible designs of the first aspect. The functions may be implemented by using hardware, or may be implemented by hardware executing corresponding software. The hardware or the software includes one or more modules corresponding to the functions.

In a possible design, when some or all of the functions are implemented by using hardware, the polar coding apparatus includes: an input interface circuit, configured to obtain to-be-coded bits; a logic circuit, configured to perform behaviors described in any one of the first aspect or the possible designs of the first aspect; and an output interface circuit, configured to output a coded bit sequence.

Optionally, the polar coding apparatus may be a chip or an integrated circuit.

In a possible design, when some or all of the functions are implemented by using software, the polar coding apparatus includes: a memory, configured to store a program; and a processor, configured to execute the program stored in the memory. When the program is executed, the polar coding apparatus may implement the method according to any one of the first aspect or the possible designs of the first aspect.

Optionally, the memory may be a physically independent unit, or may be integrated into the processor.

In a possible design, when some or all of the functions are implemented by using software, the polar coding apparatus includes a processor. A memory configured to store a program is located outside the coding apparatus. The processor is connected to the memory by using a circuit/wire, and is configured to read and execute the program stored in the memory.

According to a third aspect, a communications system is provided, where the communications system includes a transmit end and a receive end, and the transmit end may perform the method according to the first aspect or any possible design of the first aspect.

According to a fourth aspect, a computer storage medium is provided, where the computer storage medium stores a computer program, and the computer program includes an instruction used to perform the method according to any one of the first aspect or the possible designs of the first aspect.

According to a fifth aspect, an embodiment of this application provides a computer program product including an instruction. When the instruction runs on a computer, the computer performs the method in the foregoing aspect.

DESCRIPTION OF EMBODIMENTS

Figure 1:
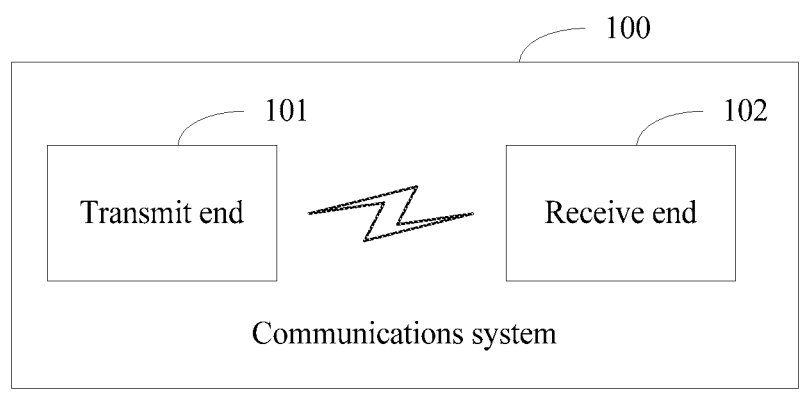
FIG. 1 is a schematic architectural diagram of a communications system applied to an embodiment of this application.

The following describes in detail the embodiments of this application with reference to the accompanying drawings.

The embodiments of this application provide a polar coding method and apparatus. At least two sequences with relatively good performance are selected based on a performance determining rule. Same sequence numbers at a same sorting location in the at least two sequences are determined. The determined same sequence numbers are determined as sequence numbers whose reliability remains unchanged in sequences, and the sequence numbers whose reliability remains unchanged in the sequences are sorted based on orders of the sequence numbers in the at least two sequences. Sequence numbers in the at least two sequences other than the determined sequence numbers whose reliability remains unchanged are compared to select some subsequences, and locations of elements in the subsequences may be mutually exchanged. A sorting sequence obtained from above is used as a sorting sequence used for polar coding in the embodiments of this application. In this way, for the sorting sequence obtained by using the foregoing method, a plurality of sequences with relatively good performance can be comprehensively considered, and a sequence number whose reliability remains unchanged is determined by using an intersection set between different sequences. This helps improve accuracy of a reliability order of polarized channels and improve coding/decoding performance of a polar code.

To facilitate understanding of the embodiments of this application, a polar code is briefly described below.

A coding policy of the polar code is to transmit useful information of a user by using a noiseless channel, and transmit agreed information or no information at all on a noisy channel. The polar code is also a linear block code, a coding matrix of the polar code is $G_N$, a coding process is $x_1^N = u_1^N G_N$, where $u_1^N = (u_1, u_2, \ldots, u_N)$ is a binary row vector, a length of $u_1^N$ (namely, a code length) is N, $G_N$ is an N×N matrix, and $G_N = F_2^{\otimes(log_2(N))}$. $F_2^{\otimes(log_2(N))}$ is defined as a kronecker product of $log_2^N$ matrices $F_2$. The matrix $$F_2 = \begin{bmatrix} 1 & 0 \\ 1 & 1 \end{bmatrix}.$$

In the coding process of the polar code, some bits in $u_1^N$ are used to carry information, and are referred to as an information bit set, and a set of indexes of the information bits is denoted as A. The other bits are set to fixed values on which a receive end and a transmit end pre-agreed, and are referred to as a fixed bit set or a frozen bit set (frozen bits), and a set of indexes of these bits is represented by a complementary set $A^c$ of A. The coding process of the polar code is equivalent to $x_1^N = u_A G_N(A) \otimes u_{A^c} G_N$. ($A^c$) where $G_N(A)$ is a sub-matrix obtained by using rows corresponding to the indexes in the set A, and $G_N$ (AC) is a sub-matrix obtained by using rows corresponding to the indexes in the set $A^c$. $u_A$ is a set of information bits in $u_1^N$, and a quantity of the information bits is K. $u_{A^c}$ is a set of fixed bits in $u_1^N$, a quantity of the fixed bits is (N−K), and the fixed bits are known bits. These fixed bits are generally set to 0. However, the fixed bits may be set to any value provided that the receive end and the transmit end pre-agree on the value. Therefore, coding output of the polar code may be simplified as $x_1^N = u_A G_N(A)$, where $u_A$ is the set of information bits in $u_1^N$, $u_A$ is a row vector with a length of K, namely, |A|=K, |•| indicates a quantity of elements in the set, K is a size of an information block, $G_N(A)$ is the sub-matrix that is in the matrix $G_N$ and that is obtained by using the rows corresponding to the indexes in the set A, and $G_N(A)$ is a K×N matrix.

A construction process of the polar code is a selection process of the set A, and determines performance of the polar code. The construction process of the polar code generally includes: determining, based on a mother code length N, that there are N polarized channels, where the N polarized channels respectively correspond to N rows in the coding matrix; and calculating reliability of the polarized channels, using indexes of the first K polarized channels with relatively high reliability as elements in the set A, and using indexes corresponding to remaining (N−K) polarized channels as elements in the set $A^c$ of the indexes of the fixed bits. The set A determines locations of the information bits, and the set $A^c$ determines locations of the fixed bits.

A sequence in the embodiments of this application is used to represent a reliability order of the N polarized channels. N is a mother code length of the polar code, and N is a positive integer power of 2.

In a case, the sequence may include sequence numbers of the N polarized channels, and the sequence numbers of the N polarized channels are arranged in the sequence based on reliability of the N polarized channels, for example, may be arranged in descending order of the reliability, or may be arranged in ascending order of the reliability. For ease of description, such a sequence is referred to as a Q sequence.

In another case, the sequence may include values of the reliability of the N polarized channels. Optionally, the value of the reliability may be a value of normalized reliability or a value of equivalent reliability. For example, if a sorting location of a channel x in the sequence is y and a minimum sequence number in the sequence is denoted as 1, reliability of the channel may be represented by y or normalized y/N. Similarly, the values of the reliability of the N polarized channels may be arranged in the sequence in descending order of the reliability, or may be arranged in ascending order of the reliability. For ease of description, such a sequence is referred to as a Z sequence.

It can be learned that the Q sequence and the Z sequence may be mutually converted. In other words, the Z sequence may be obtained if the Q sequence is known, and vice versa.

A value of an element in the sequence may range from 0 to N−1, or may range from 1 to N. In the embodiments of this application, an example in which the value of the element in the sequence ranges from 1 to N is used for description. It can be learned that another sequence whose elements have a value ranging from 0 to N−1 may be obtained by sequentially subtracting 1 from values of elements in the sequence. The two sequences have same performance, and each can represent the reliability order of the N polarized channels. In the embodiments of this application, an example in which the elements in the sequence are arranged in ascending order of the reliability is used for description. It may be understood that a sequence in which the elements are arranged in descending order of the reliability may be obtained by arranging the elements in the sequence in a reverse order. The two sequences have same performance, and each can represent the reliability order of the N polarized channels.

As shown in FIG. 1, a communications system 100 applied to an embodiment of this application includes a transmit end 101 and a receive end 102. The transmit end 101 may alternatively be referred to as a coding end, and the receive end 102 may alternatively be referred to as a decoding end. The transmit end 101 may be a base station, and the receive end 102 is a terminal; or the transmit end 101 is a terminal, and the receive end 102 is a base station. The base station is an apparatus that is deployed in a radio access network and that is configured to provide a wireless communication function for the terminal. The base station may include various forms of a macro base station, a micro base station, a relay station, or an access point, or the like. The base station may be applied to systems with different wireless access technologies, such as a Long Term Evolution (LTE) system, or more possible communications systems such as a fifth generation (5G) communications system. The base station may further be another network device that has a function of a base station, and specially, may further be a terminal that serves as a base station in D2D communication. The terminal may include various handheld devices, in-vehicle devices, wearable devices, or computing devices that have a wireless communication function, or another processing device connected to a wireless modem, various forms of user equipment (UE) or a mobile station (MS), or the like.

Based on a communications system architecture shown in FIG. 1, in the embodiments of this application, a polar coding method may be performed by the transmit end 101. The polar coding method provided in the embodiments of this application is described below in detail.

Figure 2:
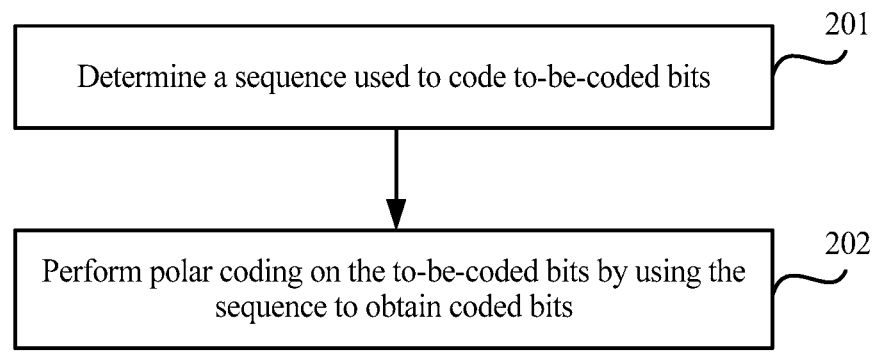
FIG. 2 is a schematic flowchart of a polar coding method according to an embodiment of this application.

Based on the communications system architecture shown in FIG. 1, as shown in FIG. 2, a specific procedure of a polar coding method provided in an embodiment of this application is as follows.

Step 201: Determine a sequence used to code to-be-coded bits.

The sequence is used to represent a reliability order of N polarized channels, N is a mother code length of a polar code, and N is a positive integer power of 2.

Step 202: Perform polar coding on the to-be-coded bits by using the sequence to obtain coded bits.

If a length of the to-be-coded bits is K, the K to-be-coded bits are mapped to K polarized channels in the N polarized channels, and reliability of the K polarized channels is higher than reliability of remaining N−K polarized channels.

Specifically, sequence numbers of the K polarized channels are selected in descending order of reliability based on the determined sequence used to code the to-be-coded bits, and the K to-be-coded bits are placed in the selected K polarized channels.

In actual application, the sequence used to code the to-be-coded bits may be stored in an offline manner. After a transmission parameter (for example, a code length and a bit rate) is given, an information bit set and a frozen bit set that are used to construct the polar code are determined by using the pre-stored sequence. For a specific determining method, refer to the foregoing description of the polar coding process, and details are not described herein again. In addition, in this embodiment of this application, if the sequence used to code the to-be-coded bits is a sequence with a relatively short code length, the sequence with the relatively short code length may be extracted from a stored sequence with a relatively long mother code length based on a nesting characteristic of the sequence.

Examples of Q sequences and Z sequences with various mother code lengths are provided below, and the provided Q sequences and Z sequences both may be used to code the to-be-coded bits. In the following example, elements in the sequence are arranged in ascending order of reliability of the N polarized channels. $L_n^{(m)}$ represents a subsequence in the sequence, n is a sequence number of the subsequence in the sequence, $1 \leq n \leq N$, n is a positive integer, m represents a length of an $n^{th}$ subsequence in the sequence, locations of elements in the subsequence $L_n^{(m)}$ are changeable, and sequence numbers at locations outside the subsequence in the sequence are fixed. When the locations of the elements in the subsequence $L_n^{(m)}$ are exchanged in $L_n^{(m)}$, a sequence obtained after the exchange may be obtained based on sequences provided below.

Example 1

(1) When N=64, the sequence is a Q sequence, and the Q sequence may include 11 subsequences whose element locations are changeable. A value of n ranges from 1 to 11, and the sequence may be:

$[1, 2, L_1^{(m=3)}, 17, 33, L_2^{(m=9)}, 21, 35, 25, L_3^{(m=2)}, L_4^{(m=2)}, L_5^{(m=3)}, 15, 22, L_6^{(m=3)}, 42, 29, L_7^{(m=2)}, 45, L_8^{(m=2)}, L_9^{(m=2)}, L_{10}^{(m=2)}, 40, 30, L_{11}^{(m=2)}, 46, 52, 47, 54, 55, 58, 59, 61, 32, 48, 56, 60, 62, 63, 64]$.

In a possible example, $L_n^{(m)}$ may be as follows: $L_1^{(m=3)}=(5, 9, 3)$; $L_2^{(m=9)}=(7, 4, 13, 6, 19, 10, 34, 18, 11)$; $L_3^{(m=2)}=(8, 37)$; $L_4^{(m=2)}=(12, 41)$; $L_5^{(m=3)}=(20, 14, 49)$; $L_6^{(m=6)}=(27, 36, 39, 23, 38, 26)$; $L_7^{(m=2)}=(50, 43)$; $L_8^{(m=2)}=(16, 51)$; $L_9^{(m=2)}=(24, 53)$; $L_{10}^{(m=2)}=(57, 28)$; and $L_{11}^{(m=2)}=(44, 31)$.

In this example, the Q sequence is specifically: [1, 2, (5, 9, 3), 17, 33, (7, 4, 13, 6, 19, 10, 18, 11), 21, 35, 25, (8, 37), (12, 41), (20, 14, 49), 15, 22, (27, 36, 39, 23, 38, 26), 42, 29, (50, 43), 45, (16, 51), (24, 53), (57, 28), 40, 30, (44, 31), 46, 52, 47, 54, 55, 58, 59, 61, 32, 48, 56, 60, 62, 63, 64].

(2) When N=64, the sequence is a Z sequence, and the Z sequence may include two subsequences whose element locations are changeable. A value of n is 1 or 2. The sequence may be $[1, 2, L_1^{(m=7)}, L_2^{(m=48)}, 55, 56, 61, 57, 62, 63, 64]$.

In a possible example, $L_n^{(m)}$ may be as follows: $L_1^{(m=7)}=(5, 9, 3, 11, 8, 20, 4)$; and $L_2^{(m=48)}=(13, 16, 22, 10, 25, 27, 40, 6, 15, 12, 24, 17, 28, 32, 42, 19, 34, 29, 45, 36, 47, 49, 58, 7, 14, 18, 30, 21, 33, 31, 46, 23, 35, 38, 48, 39, 50, 52, 59, 26, 37, 41, 51, 43, 53, 54, 60, 44)$.

In this example, the Z sequence is specifically: [1, 2, (5, 9, 3, 11, 8, 20, 4), (13, 16, 22, 10, 25, 27, 40, 6, 15, 12, 24, 17, 28, 32, 42, 19, 34, 29, 45, 36, 47, 49, 58, 7, 14, 18, 30, 21, 33, 31, 46, 23, 38, 48, 39, 50, 52, 59, 26, 37, 41, 51, 43, 53, 54, 60, 44), 55, 56, 61, 57, 62, 63, 64].

(3) When N=128, the sequence is a Q sequence, and the Q sequence may include 23 subsequences whose element locations are changeable. A value of n ranges from 1 to 23. The sequence may be: $[1, 2, L_1^{(m=3)}, 17, 33, L_2^{(m=10)}, 21, 35, 25, L_3^{(m=4)}, L_4^{(m=2)}, L_5^{(m=4)}, L_6^{(m=2)}, 22, L_7^{(m=8)}, 68, 42, 29, 70, L_8^{(m=11)}, 77, L_9^{(m=5)}, L_{10}^{(m=2)}, L_{11}^{(m=7)}, 52, L_{12}^{(m=3)}, 54, 78, L_{13}^{(m=4)}, L_{14}^{(m=3)}, L_{15}^{(m=3)}, 90, L_{16}^{(m=3)}, 103, 106, L_{17}^{(m=2)}, 107, L_{18}^{(m=2)}, L_{19}^{(m=2)}, L_{20}^{(m=2)}, L_{21}^{(m=3)}, L_{22}^{(m=4)}, 94, 108, 95, 110, 116, 111, 118, 119, 122, L_{23}^{(m=2)}, 125, 96, 112, 120, 124, 126, 127, 128]$.

In a possible example, $L_n^{(m)}$ may be as follows: $L_1^{(m=3)}=(5, 9, 3)$; $L_2^{(m=10)}=(7, 65, 4, 13, 6, 19, 10, 34, 18, 11)$; $L_3^{(m=4)}=(66, 8, 37, 67)$; $L_4^{(m=2)}=(12, 41)$; $L_5^{(m=4)}=(20, 14, 69, 49)$; $L_6^{(m=2)}=(15, 73)$; $L_7^{(m=8)}=(27, 36, 81, 39, 23, 38, 26, 97)$; $L_8^{(m=11)}=(50, 75, 43, 71, 45, 82, 16, 51, 74, 24, 53)$; $L_9^{(m=5)}=(83, 57, 28, 98, 40)$; $L_{10}^{(m=2)}=(85, 30)$; $L_{11}^{(m=7)}=(44, 99, 31, 89, 72, 46, 101)$; $L_{12}^{(m=3)}=(47, 76, 105)$; $L_{13}^{(m=4)}=(55, 84, 58, 113)$; $L_{14}^{(m=3)}=(86, 79, 59)$; $L_{15}^{(m=3)}=(100, 87, 61)$; $L_{16}^{(m=3)}=(102, 91, 32)$; $L_{17}^{(m=2)}=(48, 93)$; $L_{18}^{(m=2)}=(56, 114)$; $L_{19}^{(m=2)}=(80, 109)$; $L_{20}^{(m=2)}=(60, 115)$; $L_{21}^{(m=3)}=(88, 62, 117)$; $L_{22}^{(m=4)}=(92, 63, 121, 104)$; and $L_{23}^{(m=2)}=(123, 64)$.

In this example, the Q sequence is specifically: [1, 2, (5, 9, 3), 17, 33, (7, 65, 4, 13, 6, 19, 10, 34, 18, 11), 21, 35, 25, (66, 8, 37, 67), (12, 41), (20, 14, 69, 49), (15, 73), 22, (27, 36, 81, 39, 23, 38, 26, 97), 68, 42, 29, 70, (50, 75, 43, 71, 45, 82, 16, 51, 74, 24, 53), 77, (83, 57, 28, 98, 40), (85, 30), (44, 99, 31, 89, 72, 46, 101), 52, (47, 76, 105), 54, 78, (55, 84, 58, 113), (86, 79, 59), (100, 87, 61), 90, (102, 91, 32), 103, 106, (48, 93), 107, (56, 114), (80, 109), (60, 115), (88, 62, 117), (92, 63, 121, 104), 94, 108, 95, 110, 116, 111, 118, 119, 122, (123, 64), 125, 96, 112, 120, 124, 126, 127, 128].

(4) When N=128, the sequence is a Z sequence, and the Z sequence may include one subsequence whose element locations are changeable. A value of n is 1. The sequence may be: $[1, 2, L_1^{(m=121)}, 125, 121, 126, 127, 128]$.

In a possible example, $L_n^{(m)}$ may be as follows: $L_1^{(m=121)}$=(5, 10, 3, 12, 8, 22, 4, 14, 17, 25, 11, 28, 31, 52, 6, 16, 13, 27, 18, 33, 38, 55, 20, 40, 34, 60, 44, 64, 67, 91, 7, 15, 19, 35, 23, 39, 37, 62, 26, 43, 48, 65, 50, 70, 73, 94, 30, 46, 53, 72, 56, 76, 78, 97, 59, 80, 84, 101, 87, 104, 107, 120, 9, 21, 24, 42, 29, 45, 49, 69, 32, 54, 47, 74, 57, 77, 83, 99, 36, 51, 58, 79, 63, 82, 86, 103, 68, 88, 90, 106, 95, 110, 112, 122, 41, 61, 66, 85, 71, 89, 92, 109, 75, 93, 96, 111, 100, 113, 115, 123, 81, 98, 102, 114, 105, 116, 117, 124, 108, 118, 119).

In this example, the Z sequence is specifically: [1, 2, (5, 10, 3, 12, 8, 22, 4, 14, 17, 25, 11, 28, 31, 52, 6, 16, 13, 27, 18, 33, 38, 55, 20, 40, 34, 60, 44, 64, 67, 91, 7, 15, 19, 35, 23, 39, 37, 62, 26, 43, 48, 65, 50, 70, 73, 94, 30, 46, 53, 72, 56, 76, 78, 97, 59, 80, 84, 101, 87, 104, 107, 120, 9, 21, 24, 42, 29, 45, 49, 69, 32, 54, 47, 74, 57, 77, 83, 99, 36, 51, 58, 79, 63, 82, 86, 103, 68, 88, 90, 106, 95, 110, 112, 122, 41, 61, 66, 85, 71, 89, 92, 109, 75, 93, 96, 111, 100, 113, 115, 123, 81, 98, 102, 114, 105, 116, 117, 124, 108, 118, 119), 125, 121, 126, 127, 128].

(5) When N=256, the sequence is a Q sequence, and the Q sequence may include 25 subsequences whose element locations are changeable. A value of n ranges from 1 to 25. The sequence may be: [1, 2, $L_1^{(m=3)}$, 17, 33, $L_2^{(m=11)}$, 21, 35, 25, $L_3^{(m=28)}$, 29, $L_4^{(m=18)}$, $L_5^{(m=6)}$, $L_6^{(m=4)}$, $L_7^{(m=10)}$, $L_8^{(m=2)}$, $L_9^{(m=56)}$, $L_{10}^{(m=6)}$, $L_{11}^{(m=9)}$, $L_{12}^{(m=6)}$, $L_{13}^{(m=15)}$, $L_{14}^{(m=8)}$, $L_{15}^{(m=6)}$, $L_{16}^{(m=10)}$, $L_{17}^{(m=2)}$, 215, 189, $L_{18}^{(m=4)}$, 219, $L_{19}^{(m=5)}$, $L_{20}^{(m=4)}$, $L_{21}^{(m=5)}$, $L_{22}^{(m=3)}$, $L_{23}^{(m=4)}$, 222, 236, 223, $L_{24}^{(m=5)}$, $L_{25}^{(m=4)}$, 253, 224, 240, 248, 252, 254, 255, 256].

In a possible example, $L_n^{(m)}$ may be as follows: $L_1^{(m=3)}$=(5, 9, 3); $L_2^{(m=11)}$=(7, 65, 4, 13, 6, 19, 129, 10, 34, 18, 11), $L_3^{(m=28)}$=(66, 8, 37, 67, 130, 12, 41, 20, 133, 14, 69, 49, 15, 73, 22, 131, 27, 36, 81, 137, 39, 23, 38, 26, 97, 68, 42, 145); $L_4^{(m=18)}$=(70, 50, 75, 161, 43, 193, 71, 45, 132, 82, 16, 51, 135, 74, 24, 53, 134, 77); $L_5^{(m=6)}$=(83, 138, 57, 28, 98, 40); $L_6^{(m=4)}$=(139, 85, 30, 146); $L_7^{(m=10)}$=(44, 99, 141, 31, 89, 147, 72, 162, 46, 101); $L_8^{(m=2)}$=(149, 52); $L_9^{(m=56)}$=(47, 76, 105, 165, 194, 54, 163, 78, 153, 55, 84, 58, 113, 86, 136, 195, 79, 59, 169, 100, 140, 197, 87, 177, 61, 90, 102, 148, 142, 143, 91, 201, 32, 103, 106, 150, 48, 93, 209, 164, 154, 151, 107, 56, 166, 114, 155, 80, 225, 167, 109, 60, 115, 196, 170, 157); $L_{10}^{(m=6)}$=(88, 62, 117, 171, 198, 178); $L_{11}^{(m=9)}$=(92, 202, 199, 63, 144, 173, 121, 104, 179); $L_{12}^{(m=6)}{}_{12}$=(203, 94, 152, 210, 181, 108) $L_{13}^{(m=15)}$=(95, 205, 156, 110, 211, 185, 116, 168, 158, 226, 111, 213, 118, 172, 227); $L_{14}^{(m=8)}$=(159, 217, 119, 174, 122, 200, 180, 229) $L_{15}^{(m=6)}$=(175, 123, 64, 233, 204, 182); $L_{16}^{(m=10)}$= (125, 206, 241, 183, 212, 96, 186, 207, 187, 214); $L_{17}^{(m=2)}$=(228, 112); $L_{18}^{(m=4)}$=(218, 160, 120, 230); $L_{19}^{(m=5)}$=(231, 176, 124, 234, 221); $L_{20}^{(m=4)}$=(126, 235, 184, 242); $L_{21}^{(m=5)}$=(188, 208, 237, 127, 243); $L_{22}^{(m=3)}$= (216, 245, 190); $L_{23}^{(m=4)}$=(220, 249, 191, 232) $L_{24}^{(m=5)}$= (238, 244, 239, 246, 128); and $L_{25}^{(m=4)}$=(247, 250, 251, 192).

In this example, the Q sequence is specifically: [1, 2, (5, 9, 3), 17, 33, (7, 65, 4, 13, 6, 19, 129, 10, 34, 18, 11), 21, 35, 25, (66, 8, 37, 67, 130, 12, 41, 20, 133, 14, 69, 49, 15, 73, 22, 131, 27, 36, 81, 137, 39, 23, 38, 26, 97, 68, 42, 145), 29, (70, 50, 75, 161, 43, 193, 71, 45, 132, 82, 16, 51, 135, 74, 24, 53, 134, 77), (83, 138, 57, 28, 98, 40), (139, 85, 30, 146), (44, 99, 141, 31, 89, 147, 72, 162, 46, 101), (149, 52), (47, 76, 105, 165, 194, 54, 163, 78, 153, 55, 84, 58, 113, 86, 136, 195, 79, 59, 169, 100, 140, 197, 87, 177, 61, 90, 102, 148, 142, 143, 91, 201, 32, 103, 106, 150, 48, 93, 209, 164, 154, 151, 107, 56, 166, 114, 155, 80, 225, 167, 109, 60, 115, 196, 170, 157), (88, 62, 117, 171, 198, 178), (92, 202, 199, 63, 144, 173, 121, 104, 179), (203, 94, 152, 210, 181, 108), (95, 205, 156, 110, 211, 185, 116, 168, 158, 226, 111, 213, 118, 172, 227), (159, 217, 119, 174, 122, 200, 180, 229), (175, 123, 64, 233, 204, 182), (125, 206, 241, 183, 212, 96, 186, 207, 187, 214), (228, 112), 215, 189, (218, 160, 120, 230), 219, (231, 176, 124, 234, 221), (126, 235, 184, 242), (188, 208, 237, 127, 243), (216, 245, 190), (220, 249, 191, 232), 222, 236, 223, (238, 244, 239, 246, 128), (247, 250, 251, 192), 253, 224, 240, 248, 252, 254, 255, 256].

(6) When N=256, the sequence is a Z sequence, and the Z sequence may include one (n=1) subsequence whose element locations are changeable. The sequence may be: [1, 2, $L_1^{(m=249)}$, 253, 249, 254, 255, 256].

In a possible example, $L_n^{(m)}$ may be as follows: $L_1^{(m=249)}$=(5, 10, 3, 12, 8, 23, 4, 15, 18, 27, 11, 31, 34, 61, 6, 17, 13, 29, 19, 36, 43, 65, 21, 45, 38, 72, 50, 77, 82, 123, 7, 16, 20, 39, 24, 44, 42, 74, 28, 48, 55, 79, 58, 87, 91, 127, 33, 52, 62, 90, 66, 96, 100, 134, 71, 102, 108, 142, 115, 148, 156, 193, 9, 22, 25, 47, 32, 51, 57, 85, 35, 64, 53, 92, 68, 98, 107, 138, 40, 60, 69, 101, 76, 104, 113, 147, 83, 116, 121, 153, 128, 163, 168, 202, 46, 73, 80, 110, 88, 117, 124, 160, 93, 125, 133, 167, 141, 171, 178, 208, 103, 136, 143, 174, 149, 180, 185, 213, 159, 187, 192, 218, 197, 221, 228, 244, 14, 26, 37, 59, 30, 67, 63, 105, 41, 70, 75, 111, 81, 119, 120, 157, 49, 78, 84, 118, 89, 126, 132, 164, 99, 131, 137, 170, 146, 176, 183, 212, 54, 86, 97, 130, 94, 135, 140, 175, 109, 145, 150, 181, 158, 186, 191, 217, 114, 152, 161, 189, 166, 196, 200, 223, 173, 203, 205, 225, 210, 232, 235, 248, 56, 95, 106, 144, 112, 151, 155, 188, 122, 154, 162, 195, 169, 198, 204, 226, 129, 165, 172, 201, 179, 206, 209, 230, 184, 211, 215, 233, 220, 237, 239, 250, 139, 177, 182, 207, 190, 214, 216, 236, 194, 219, 222, 238, 227, 240, 242, 251, 199, 224, 229, 241, 231, 243, 245, 252, 234, 246, 247).

In this example, the Q sequence is specifically: [1, 2, (5, 10, 3, 12, 8, 23, 4, 15, 18, 27, 11, 31, 34, 61, 6, 17, 13, 29, 19, 36, 43, 65, 21, 45, 38, 72, 50, 77, 82, 123, 7, 16, 20, 39, 24, 44, 42, 74, 28, 48, 55, 79, 58, 87, 91, 127, 33, 52, 62, 90, 66, 96, 100, 134, 71, 102, 108, 142, 115, 148, 156, 193, 9, 22, 25, 47, 32, 51, 57, 85, 35, 64, 53, 92, 68, 98, 107, 138, 40, 60, 69, 101, 76, 104, 113, 147, 83, 116, 121, 153, 128, 163, 168, 202, 46, 73, 80, 110, 88, 117, 124, 160, 93, 125, 133, 167, 141, 171, 178, 208, 103, 136, 143, 174, 149, 180, 185, 213, 159, 187, 192, 218, 197, 221, 228, 244, 14, 26, 37, 59, 30, 67, 63, 105, 41, 70, 75, 111, 81, 119, 120, 157, 49, 78, 84, 118, 89, 126, 132, 164, 99, 131, 137, 170, 146, 176, 183, 212, 54, 86, 97, 130, 94, 135, 140, 175, 109, 145, 150, 181, 158, 186, 191, 217, 114, 152, 161, 189, 166, 196, 200, 223, 173, 203, 205, 225, 210, 232, 235, 248, 56, 95, 106, 144, 112, 151, 155, 188, 122, 154, 162, 195, 169, 198, 204, 226, 129, 165, 172, 201, 179, 206, 209, 230, 184, 211, 215, 233, 220, 237, 239, 250, 139, 177, 182, 207, 190, 214, 216, 236, 194, 219, 222, 238, 227, 240, 242, 251, 199, 224, 229, 241, 231, 243, 245, 252, 234, 246, 247), 253, 249, 254, 255, 256].

(7) When N=512, the sequence is a Q sequence, and the Q sequence may include 10 subsequences whose element locations are changeable. A value of n ranges from 1 to 10. The sequence may be: [1, 2, $L_1^{(m=3)}$, 17, 33, $L_2^{(m=11)}$, $L_3^{(m=4)}$, $L_4^{(m=419)}$, $L_5^{(m=6)}$, $L_6^{(m=28)}$, $L_7^{(m=23)}$, $L_8^{(m=5)}$, 507, $L_9^{(m=2)}$, $L_{10}^{(m=2)}$, 508, 510, 511, 512].

In a possible example, $L_n^{(m)}$ may be as follows: $L_1^{(m=3)}$=(5, 9, 3); $L_2^{(m=11)}$=(7, 65, 4, 13, 6, 19, 129, 10, 34, 18, 11); $L_3^{(m=4)}$=(257, 21, 35, 25); $L_4^{(m=419)}$=(66, 8, 37, 67, 130, 12, 41, 20, 133, 14, 69, 49, 15, 73, 258, 22, 131, 27, 36, 81, 259, 137, 39, 23, 261, 38, 26, 97, 68, 265, 42, 145, 29, 70, 50, 75, 161, 43, 273, 193, 71, 45, 132, 82, 16, 289, 51, 135, 74, 24, 53, 321, 134, 77, 83, 138, 57, 28, 260, 98, 40, 385, 139, 85, 30, 262, 146, 44, 99, 141, 31, 89, 263, 147, 72, 266, 162, 46, 101, 149, 52, 47, 76, 267, 105, 274, 165, 194, 54, 163, 269, 78, 153, 275, 55, 84, 58, 113, 86, 136, 290, 195, 79, 291, 59, 277, 169, 100, 140, 197, 87, 177, 61, 90, 281, 102, 148, 293, 142, 322, 143, 91, 201, 32, 103, 264, 106, 323, 150, 297, 48, 93, 209, 268, 386, 325, 305, 164, 154, 151, 107, 56, 166, 387, 329, 270, 114, 155, 80, 225, 167, 276, 109, 271, 60, 115, 196, 170, 157, 88, 62, 278, 292, 279, 117, 171, 198, 178, 282, 92, 202, 389, 294, 199, 63, 144, 337, 173, 283, 121, 104, 179, 295, 203, 94, 324, 393, 298, 152, 210, 285, 181, 108, 95, 205, 299, 353, 326, 156, 110, 401, 306, 301, 211, 185, 327, 116, 168, 158, 226, 307, 330, 111, 213, 118, 172, 331, 227, 388, 309, 159, 417, 338, 217, 272, 119, 280, 333, 390, 174, 122, 200, 180, 229, 339, 313, 391, 175, 394, 284, 123, 64, 341, 449, 354, 395, 233, 204, 296, 286, 182, 125, 206, 241, 287, 300, 355, 183, 402, 212, 397, 345, 96, 186, 207, 328, 403, 187, 357, 308, 419, 214, 302, 228, 303, 361, 112, 418, 215, 405, 310, 189, 450, 332, 218, 160, 120, 230, 334, 409, 311, 421, 219, 369, 231, 392, 176, 314, 340, 335, 124, 234, 315, 342, 451, 221, 425, 356, 126, 235, 184, 396, 242, 317, 343, 346, 404, 288, 398, 453, 433, 188, 358, 208, 237, 347, 362, 127, 243, 406, 216, 399, 304, 359, 420, 457, 349, 245, 190, 220, 312, 363, 465, 407, 422, 249, 191, 370, 410, 411, 481, 232, 316, 365, 423, 336, 371, 222, 452, 426, 413, 454, 318, 236, 344, 373, 223, 427, 434, 238, 348, 244, 455, 319, 377, 429, 239, 360, 459, 400, 435, 458, 246, 350, 128, 408, 437, 364, 466, 351, 247, 250, 461, 412, 366, 441, 375, 424, 467, 251, 372, 192, 482, 414, 367, 469, 374, 428, 415, 253, 483, 430, 224, 456, 473, 378, 436, 320, 485); $L_5^{(m=6)}$=(431, 489, 460, 240, 379, 438); $L_6^{(m=28)}$=(462, 381, 248, 442, 352, 470, 439, 463, 252, 497, 468, 368, 443, 475, 484, 380, 416, 254, 445, 486, 471, 376, 474, 432, 487, 490, 255, 477); $L_7^{(m=23)}$=(440, 493, 382, 499, 464, 491, 383, 472, 498, 444, 501, 446, 447, 476, 488, 478, 494, 505, 256, 492, 479, 384, 500); $L_8^{(m=5)}$=(503, 495, 502, 448, 506); $L_9^{(m=2)}$=(480, 509); and $L_{10}^{(m=2)}$=(504, 496).

In this example, the Q sequence is specifically: [1, 2, (5, 9, 3), 17, 33, (7, 65, 4, 13, 6, 19, 129, 10, 34, 18, 11), (257, 21, 35, 25), (66, 8, 37, 67, 130, 12, 41, 20, 133, 14, 69, 49, 15, 73, 258, 22, 131, 27, 36, 81, 259, 137, 39, 23, 261, 38, 26, 97, 68, 265, 42, 145, 29, 70, 50, 75, 161, 43, 273, 193, 71, 45, 132, 82, 16, 289, 51, 135, 74, 24, 53, 321, 134, 77, 83, 138, 57, 28, 260, 98, 40, 385, 139, 85, 30, 262, 146, 44, 99, 141, 31, 89, 263, 147, 72, 266, 162, 46, 101, 149, 52, 47, 76, 267, 105, 274, 165, 194, 54, 163, 269, 78, 153, 275, 55, 84, 58, 113, 86, 136, 290, 195, 79, 291, 59, 277, 169, 100, 140, 197, 87, 177, 61, 90, 281, 102, 148, 293, 142, 322, 143, 91, 201, 32, 103, 264, 106, 323, 150, 297, 48, 93, 209, 268, 386, 325, 305, 164, 154, 151, 107, 56, 166, 387, 329, 270, 114, 155, 80, 225, 167, 276, 109, 271, 60, 115, 196, 170, 157, 88, 62, 278, 292, 279, 117, 171, 198, 178, 282, 92, 202, 389, 294, 199, 63, 144, 337, 173, 283, 121, 104, 179, 295, 203, 94, 324, 393, 298, 152, 210, 285, 181, 108, 95, 205, 299, 353, 326, 156, 110, 401, 306, 301, 211, 185, 327, 116, 168, 158, 226, 307, 330, 111, 213, 118, 172, 331, 227, 388, 309, 159, 417, 338, 217, 272, 119, 280, 333, 390, 174, 122, 200, 180, 229, 339, 313, 391, 175, 394, 284, 123, 64, 341, 449, 354, 395, 233, 204, 296, 286, 182, 125, 206, 241, 287, 300, 355, 183, 402, 212, 397, 345, 96, 186, 207, 328, 403, 187, 357, 308, 419, 214, 302, 228, 303, 361, 112, 418, 215, 405, 310, 189, 450, 332, 218, 160, 120, 230, 334, 409, 311, 421, 219, 369, 231, 392, 176, 314, 340, 335, 124, 234, 315, 342, 451, 221, 425, 356, 126, 235, 184, 396, 242, 317, 343, 346, 404, 288, 398, 453, 433, 188, 358, 208, 237, 347, 362, 127, 243, 406, 216, 399, 304, 359, 420, 457, 349, 245, 190, 220, 312, 363, 465, 407, 422, 249, 191, 370, 410, 411, 481, 232, 316, 365, 423, 336, 371, 222, 452, 426, 413, 454, 318, 236, 344, 373, 223, 427, 434, 238, 348, 244, 455, 319, 377, 429, 239, 360, 459, 400, 435, 458, 246, 350, 128, 408, 437, 364, 466, 351, 247, 250, 461, 412, 366, 441, 375, 424, 467, 251, 372, 192, 482, 414, 367, 469, 374, 428, 415, 253, 483, 430, 224, 456, 473, 378, 436, 320, 485), (431, 489, 460, 240, 379, 438), (462, 381, 248, 442, 352, 470, 439, 463, 252, 497, 468, 368, 443, 475, 484, 380, 416, 254, 445, 486, 471, 376, 474, 432, 487, 490, 255, 477), (440, 493, 382, 499, 464, 491, 383, 472, 498, 444, 501, 446, 447, 476, 488, 478, 494, 505, 256, 492, 479, 384, 500), (503, 495, 502, 448, 506), 507, (480, 509), (504, 496), 508, 510, 511, 512].

(8) When N=512, the sequence is a Z sequence, and the Z sequence may include one (n=1) subsequence whose element locations are changeable. The sequence may be: [1, 2, $L_1^{(m=507)}$, 510, 511, 512].

In a possible example, $L_n^{(m)}$ may be as follows: $L_1^{(m=507)}$=(5, 10, 3, 12, 8, 24, 4, 15, 18, 28, 11, 32, 35, 67, 6, 17, 13, 30, 20, 38, 46, 72, 22, 49, 40, 80, 55, 87, 93, 146, 7, 16, 21, 41, 25, 48, 45, 83, 29, 53, 60, 90, 64, 100, 104, 153, 34, 57, 69, 103, 73, 111, 117, 164, 79, 119, 127, 177, 135, 183, 197, 264, 9, 23, 26, 51, 33, 56, 63, 97, 36, 71, 58, 105, 76, 114, 125, 171, 42, 66, 77, 118, 86, 121, 133, 182, 94, 136, 144, 192, 154, 207, 216, 285, 50, 82, 91, 130, 101, 138, 147, 203, 107, 149, 163, 215, 175, 222, 235, 299, 120, 169, 178, 229, 187, 237, 248, 309, 202, 253, 263, 323, 274, 331, 350, 407, 14, 27, 39, 65, 31, 75, 70, 122, 44, 78, 85, 131, 92, 141, 143, 198, 54, 89, 96, 139, 102, 151, 162, 211, 115, 161, 170, 221, 181, 231, 243, 308, 59, 99, 112, 160, 109, 165, 173, 230, 129, 180, 188, 238, 200, 252, 260, 319, 134, 190, 204, 255, 214, 273, 280, 333, 227, 286, 290, 344, 304, 361, 369, 424, 62, 110, 124, 179, 132, 189, 196, 254, 145, 193, 206, 270, 217, 275, 287, 346, 155, 212, 226, 282, 236, 294, 301, 353, 246, 307, 315, 362, 328, 380, 389, 435, 172, 232, 240, 296, 256, 310, 317, 374, 269, 324, 332, 386, 347, 392, 399, 445, 276, 335, 351, 394, 360, 405, 413, 450, 368, 414, 422, 456, 432, 465, 474, 494, 19, 37, 43, 81, 47, 88, 95, 148, 52, 98, 106, 156, 113, 168, 176, 247, 61, 108, 116, 174, 128, 184, 186, 249, 137, 191, 201, 262, 213, 272, 277, 340, 68, 123, 126, 185, 140, 195, 205, 271, 152, 210, 218, 278, 225, 295, 297, 355, 159, 224, 233, 292, 242, 303, 313, 363, 258, 320, 325, 375, 336, 385, 396, 440, 74, 142, 150, 208, 158, 220, 228, 288, 167, 234, 239, 306, 250, 311, 322, 378, 199, 245, 257, 321, 265, 326, 337, 387, 284, 338, 348, 393, 359, 406, 412, 452, 219, 267, 279, 330, 291, 345, 356, 400, 298, 349, 364, 410, 376, 417, 427, 459, 316, 379, 423, 388, 429, 419, 469, 397, 438, 446, 463, 449, 478, 482, 497, 84, 157, 166, 241, 194, 251, 259, 318, 209, 261, 268, 334, 283, 341, 354, 402, 223, 281, 289, 339, 302, 352, 366, 408, 312, 416, 383, 426, 431, 464, 244, 300, 293, 357, 314, 367, 377, 420, 329, 382, 390, 430, 398, 434, 442, 471, 343, 391, 403, 439, 409, 447, 454, 476, 418, 451, 460, 485, 466, 487, 488, 502, 266, 305, 327, 381, 342, 384, 395, 436, 358, 404, 401, 444, 415, 448, 455, 480, 365, 411, 421, 458, 428, 453, 468, 483, 437, 470, 461, 489, 475, 491, 496, 505, 373, 425, 433, 462, 441, 467, 472, 490, 443, 473, 481, 495, 477, 492, 500, 508, 457, 484, 479, 498, 486, 501, 499, 507, 493, 503, 504, 509, 506).

In this example, the Z sequence is specifically: [1, 2, (5, 10, 3, 12, 8, 24, 4, 15, 18, 28, 11, 32, 35, 67, 6, 17, 13, 30, 20, 38, 46, 72, 22, 49, 40, 80, 55, 87, 93, 146, 7, 16, 21, 41, 25, 48, 45, 83, 29, 53, 60, 90, 64, 100, 104, 153, 34, 57, 69, 103, 73, 111, 117, 164, 79, 119, 127, 177, 135, 183, 197, 264, 9, 23, 26, 51, 33, 56, 63, 97, 36, 71, 58, 105, 76, 114, 125, 171, 42, 66, 77, 118, 86, 121, 133, 182, 94, 136, 144, 192, 154, 207, 216, 285, 50, 82, 91, 130, 101, 138, 147, 203, 107, 149, 163, 215, 175, 222, 235, 299, 120, 169, 178, 229, 187, 237, 248, 309, 202, 253, 263, 323, 274, 331, 350, 407, 14, 27, 39, 65, 31, 75, 70, 122, 44, 78, 85, 131, 92, 141, 143, 198, 54, 89, 96, 139, 102, 151, 162, 211, 115, 161, 170, 221, 181, 231, 243, 308, 59, 99, 112, 160, 109, 165, 173, 230, 129, 180, 188, 238, 200, 252, 260, 319, 134, 190, 204, 255, 214, 273, 280, 333, 227, 286, 290, 344, 304, 361, 369, 424, 62, 110, 124, 179, 132, 189, 196, 254, 145, 193, 206, 270, 217, 275, 287, 346, 155, 212, 226, 282, 236, 294, 301, 353, 246, 307, 315, 362, 328, 380, 389, 435, 172, 232, 240, 296, 256, 310, 317, 374, 269, 324, 332, 386, 347, 392, 399, 445, 276, 335, 351, 394, 360, 405, 413, 450, 368, 414, 422, 456, 432, 465, 474, 494, 19, 37, 43, 81, 47, 88, 95, 148, 52, 98, 106, 156, 113, 168, 176, 247, 61, 108, 116, 174, 128, 184, 186, 249, 137, 191, 201, 262, 213, 272, 277, 340, 68, 123, 126, 185, 140, 195, 205, 271, 152, 210, 218, 278, 225, 295, 297, 355, 159, 224, 233, 292, 242, 303, 313, 363, 258, 320, 325, 375, 336, 385, 396, 440, 74, 142, 150, 208, 158, 220, 228, 288, 167, 234, 239, 306, 250, 311, 322, 378, 199, 245, 257, 321, 265, 326, 337, 387, 284, 338, 348, 393, 359, 406, 412, 452, 219, 267, 279, 330, 291, 345, 356, 400, 298, 349, 364, 410, 376, 417, 427, 459, 316, 370, 379, 423, 388, 429, 419, 469, 397, 438, 446, 463, 449, 478, 482, 497, 84, 157, 166, 241, 194, 251, 259, 318, 209, 261, 268, 334, 283, 341, 354, 402, 223, 281, 289, 339, 302, 352, 366, 408, 312, 416, 383, 426, 431, 464, 244, 300, 293, 357, 314, 367, 377, 420, 329, 382, 390, 430, 398, 434, 442, 471, 343, 391, 403, 439, 409, 447, 454, 476, 418, 451, 460, 485, 466, 487, 488, 502, 266, 305, 327, 381, 342, 384, 395, 436, 358, 404, 401, 444, 415, 448, 455, 480, 365, 411, 421, 458, 428, 453, 468, 483, 437, 470, 461, 489, 475, 491, 496, 505, 373, 425, 433, 462, 441, 467, 472, 490, 443, 473, 481, 495, 477, 492, 500, 508, 457, 484, 479, 498, 486, 501, 499, 507, 493, 503, 504, 509, 506), 510, 511, 512].

(9) When N=1024, the sequence is a Q sequence, and the Q sequence may include three subsequences whose element locations are changeable. A value of n ranges from 1 to 3. The sequence may be: [1, 2, $L_1^{(m=3)}$=17, 33, $L_2^{(m=1011)}$, $L_3^{(m=7)}$, 1020, 1022, 1023, 1024].

In a possible example, $L_n^{(m)}$ may be as follows: $L_1^{(m=3)}$=(5, 9, 3); $L_2^{(m=1011)}$=(7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 879, 981, 942, 765, 496, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021); and $L_3^{(m=2)}$=(1016, 1008).

In this example, the Q sequence is specifically: [1, 2, (5, 9, 3), 17, 33, (7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021), (1016, 1008), 1020, 1022, 1023, 1024].

(10) When N=1024, the sequence is a Z sequence, and the Z sequence may include one (n=1) subsequence whose element locations are changeable. The sequence may be: [1, 2, $L_1^{(m=1010)}$, 1022, 1023, 1024].

In a possible example, $L_n^{(m)}$ may be as follows: $L_1^{(m=1019)}$=(5, 11, 3, 13, 8, 25, 4, 16, 29, 12, 34, 37, 71, 6, 18, 14, 31, 21, 40, 48, 77, 23, 52, 42, 85, 58, 93, 100, 162, 7, 17, 22, 43, 26, 51, 47, 89, 30, 56, 63, 97, 68, 108, 112, 170, 36, 60, 73, 111, 78, 120, 127, 185, 84, 130, 139, 201, 149, 208, 226, 323, 9, 24, 27, 54, 35, 59, 67, 104, 38, 75, 61, 114, 81, 124, 137, 194, 44, 70, 82, 129, 92, 132, 146, 206, 101, 150, 159, 219, 172, 239, 251, 356, 53, 88, 98, 143, 109, 152, 163, 234, 116, 165, 184, 250, 198, 259, 277, 378, 131, 192, 202, 269, 213, 280, 296, 395, 232, 303, 319, 416, 339, 431, 464, 574, 15, 28, 41, 69, 32, 80, 74, 133, 46, 83, 91, 144, 99, 156, 158, 227, 57, 95, 103, 153, 110, 168, 183, 244, 125, 182, 193, 258, 205, 272, 288, 390, 62, 107, 122, 181, 118, 186, 196, 270, 141, 204, 214, 281, 230, 301, 314, 411, 147, 217, 235, 306, 248, 338, 348, 433, 266, 357, 364, 452, 386, 482, 498, 613, 66, 119, 136, 203, 145, 215, 224, 304, 160, 221, 238, 332, 252, 340, 358, 454, 173, 246, 265, 350, 279, 371, 383, 468, 293, 389, 406, 484, 426, 518, 536, 641, 195, 273, 284, 373, 307, 396, 408, 508, 331, 419, 432, 530, 460, 542, 557, 667, 341, 435, 465, 547, 480, 570, 588, 681, 496, 590, 609, 698, 633, 727, 757, 844, 20, 39, 45, 86, 49, 94, 102, 164, 55, 106, 115, 174, 123, 191, 200, 294, 65, 117, 126, 197, 140, 209, 212, 297, 151, 218, 231, 317, 247, 337, 345, 445, 72, 134, 138, 210, 154, 223, 236, 336, 169, 243, 254, 346, 263, 372, 374, 471, 177, 262, 274, 368, 287, 385, 403, 486, 311, 412, 420, 510, 439, 528, 551, 654, 79, 157, 167, 240, 176, 256, 267, 359, 189, 276, 283, 388, 299, 397, 415, 514, 228, 291, 309, 413, 324, 423, 440, 532, 352, 441, 461, 545, 479, 572, 585, 687, 255, 328, 347, 428, 365, 453, 473, 559, 377, 463, 488, 581, 512, 597, 621, 708, 407, 500, 516, 611, 534, 625, 601, 740, 553, 648, 670, 720, 678, 772, 791, 849, 90, 175, 187, 286, 222, 300, 313, 410, 242, 316, 330, 434, 351, 446, 469, 563, 261, 349, 362, 444, 384, 467, 492, 577, 398, 502, 504, 595, 524, 618, 630, 723, 290, 381, 370, 475, 404, 494, 513, 604, 427, 522, 538, 628, 555, 638, 659, 747, 451, 540, 566, 651, 579, 673, 693, 765, 599, 684, 711, 802, 730, 807, 814, 878, 326, 387, 425, 520, 447, 526, 549, 643, 477, 568, 561, 664, 592, 675, 695, 783, 490, 583, 606, 705, 623, 690, 737, 795, 646, 743, 714, 817, 761, 831, 848, 899, 506, 616, 635, 717, 656, 733, 750, 822, 662, 754, 787, 847, 769, 836, 871, 938, 701, 799, 776, 858, 806, 875, 866, 929, 837, 884, 894, 949, 920, 961, 975, 993, 10, 33, 76, 121, 50, 135, 105, 211, 64, 155, 171, 225, 128, 249, 257, 333, 87, 166, 142, 237, 180, 260, 292, 361, 178, 298, 268, 382, 312, 399, 414, 533, 96, 161, 207, 275, 190, 295, 282, 393, 220, 308, 321, 417, 335, 436, 449, 541, 241, 327, 344, 443, 355, 462, 470, 567, 367, 481, 499, 587, 509, 614, 626, 738, 113, 188, 199, 302, 245, 315, 334, 430, 229, 343, 353, 456, 366, 466, 483, 580, 271, 363, 376, 489, 392, 472, 497, 600, 405, 521, 531, 619, 552, 649, 660, 759, 289, 391, 401, 519, 422, 507, 537, 634, 438, 544, 571, 650, 582, 669, 685, 774, 476, 562, 591, 680, 603, 691, 713, 788, 636, 706, 729, 810, 745, 820, 842, 915, 148, 216, 264, 342, 233, 360, 369, 485, 285, 379, 394, 501, 409, 525, 535, 627, 310, 402, 421, 511, 437, 554, 564, 652, 455, 550, 578, 666, 602, 694, 709, 780, 320, 429, 448, 558, 459, 565, 586, 677, 493, 589, 617, 697, 631, 715, 735, 804, 515, 615, 642, 718, 657, 731, 748, 823, 674, 762, 771, 835, 790, 855, 872, 931, 325, 458, 487, 593, 505, 612, 624, 719, 529, 622, 644, 739, 661, 758, 770, 833, 548, 653, 672, 752, 688, 763, 784, 853, 704, 789, 798, 860, 813, 879, 889, 942, 584, 676, 696, 778, 726, 792, 801, 868, 732, 811, 824, 886, 838, 895, 904, 951, 751, 826, 843, 898, 859, 908, 916, 956, 869, 919, 928, 966, 937, 976, 985, 1008, 179, 253, 278, 380, 318, 400, 418, 539, 305, 424, 442, 556, 457, 575, 596, 689, 322, 450, 478, 573, 495, 598, 610, 710, 517, 620, 639, 722, 655, 746, 753, 834, 329, 474, 491, 608, 523, 637, 629, 734, 546, 647, 663, 749, 679, 773, 775, 851, 569, 668, 692, 766, 703, 782, 796, 861, 724, 805, 812, 880, 825, 890, 901, 948, 354, 527, 503, 645, 560, 671, 665, 767, 594, 683, 699, 786, 712, 793, 809, 876, 607, 700, 716, 797, 744, 818, 827, 887, 755, 828, 840, 897, 857, 911, 918, 962, 640, 721, 741, 819, 768, 846, 854, 905, 777, 841, 863, 913, 874, 923, 934, 969, 800, 870, 881, 930, 893, 940, 925, 980, 902, 946, 954, 973, 957, 989, 995, 1013, 375, 576, 543, 682, 605, 702, 707, 803, 632, 728, 736, 821, 756, 832, 850, 907, 658, 742, 764, 829, 781, 852, 865, 914, 794, 873, 862, 922, 888, 933, 939, 974, 686, 779, 760, 856, 808, 867, 882, 926, 816, 885, 892, 943, 903, 936, 950, 982, 839, 896, 909, 947, 917, 955, 964, 987, 924, 960, 970, 998, 977, 991, 1001, 1017, 725, 785, 815, 883, 830, 891, 900, 945, 845, 910, 906, 958, 921, 952, 965, 992, 864, 912, 927, 968, 935, 963, 979, 996, 944, 981, 971, 999, 986, 1004, 1006, 1015, 877, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018).

In this example, the Z sequence is specifically: [1, 2, (5, 11, 3, 13, 8, 25, 4, 16, 19, 29, 12, 34, 37, 71, 6, 18, 14, 31, 21, 40, 48, 77, 23, 52, 42, 85, 58, 93, 100, 162, 7, 17, 22, 43, 26, 51, 47, 89, 30, 56, 63, 97, 68, 108, 112, 170, 36, 60, 73, 111, 78, 120, 127, 185, 84, 130, 139, 201, 149, 208, 226, 323, 9, 24, 27, 54, 35, 59, 67, 104, 38, 75, 61, 114, 81, 124, 137, 194, 44, 70, 82, 129, 92, 132, 146, 206, 101, 150, 159, 219, 172, 239, 251, 356, 53, 88, 98, 143, 109, 152, 163, 234, 116, 165, 184, 250, 198, 259, 277, 378, 131, 192, 202, 269, 213, 280, 296, 395, 232, 303, 319, 416, 339, 431, 464, 574, 15, 28, 41, 69, 32, 80, 74, 133, 46, 83, 91, 144, 99, 156, 158, 227, 57, 95, 103, 153, 110, 168, 183, 244, 125, 182, 193, 258, 205, 272, 288, 390, 62, 107, 122, 181, 118, 186, 196, 270, 141, 204, 214, 281, 230, 301, 314, 411, 147, 217, 235, 306, 248, 338, 348, 433, 266, 357, 364, 452, 386, 482, 498, 613, 66, 119, 136, 203, 145, 215, 224, 304, 160, 221, 238, 332, 252, 340, 358, 454, 173, 246, 265, 350, 279, 371, 383, 468, 293, 389, 406, 484, 426, 518, 536, 641, 195, 273, 284, 373, 307, 396, 408, 508, 331, 419, 432, 530, 460, 542, 557, 667, 341, 435, 465, 547, 480, 570, 588, 681, 496, 590, 609, 698, 633, 727, 757, 844, 20, 39, 45, 86, 49, 94, 102, 164, 55, 106, 115, 174, 123, 191, 200, 294, 65, 117, 126, 197, 140, 209, 212, 297, 151, 218, 231, 317, 247, 337, 345, 445, 72, 134, 138, 210, 154, 223, 236, 336, 169, 243, 254, 346, 263, 372, 374, 471, 177, 262, 274, 368, 287, 385, 403, 486, 311, 412, 420, 510, 439, 528, 551, 654, 79, 157, 167, 240, 176, 256, 267, 359, 189, 276, 283, 388, 299, 397, 415, 514, 228, 291, 309, 413, 324, 423, 440, 532, 352, 441, 461, 545, 479, 572, 585, 687, 255, 328, 347, 428, 365, 453, 473, 559, 377, 463, 488, 581, 512, 597, 621, 708, 407, 500, 516, 611, 534, 625, 601, 740, 553, 648, 670, 720, 678, 772, 791, 849, 90, 175, 187, 286, 222, 300, 313, 410, 242, 316, 330, 434, 351, 446, 469, 563, 261, 349, 362, 444, 384, 467, 492, 577, 398, 502, 504, 595, 524, 618, 630, 723, 290, 381, 370, 475, 404, 494, 513, 604, 427, 522, 538, 628, 555, 638, 659, 747, 451, 540, 566, 651, 579, 673, 693, 765, 599, 684, 711, 802, 730, 807, 814, 878, 326, 387, 425, 520, 447, 526, 549, 643, 477, 568, 561, 664, 592, 675, 695, 783, 490, 583, 606, 705, 623, 690, 737, 795, 646, 743, 714, 817, 761, 831, 848, 899, 506, 616, 635, 717, 656, 733, 750, 822, 662, 754, 787, 847, 769, 836, 871, 938, 701, 799, 776, 858, 806, 875, 866, 929, 837, 884, 894, 949, 920, 961, 975, 993, 10, 33, 76, 121, 50, 135, 105, 211, 64, 155, 171, 225, 128, 249, 257, 333, 87, 166, 142, 237, 180, 260, 292, 361, 178, 298, 268, 382, 312, 399, 414, 533, 96, 161, 207, 275, 190, 295, 282, 393, 220, 308, 321, 417, 335, 436, 449, 541, 241, 327, 344, 443, 355, 462, 470, 567, 367, 481, 499, 587, 509, 614, 626, 738, 113, 188, 199, 302, 245, 315, 334, 430, 229, 343, 353, 456, 366, 466, 483, 580, 271, 363, 376, 489, 392, 472, 497, 600, 405, 521, 531, 619, 552, 649, 660, 759, 289, 391, 401, 519, 422, 507, 537, 634, 438, 544, 571, 650, 582, 669, 685, 774, 476, 562, 591, 680, 603, 691, 713, 788, 636, 706, 729, 810, 745, 820, 842, 915, 148, 216, 264, 342, 233, 360, 369, 485, 285, 379, 394, 501, 409, 525, 535, 627, 310, 402, 421, 511, 437, 554, 564, 652, 455, 550, 578, 666, 602, 694, 709, 780, 320, 429, 448, 558, 459, 565, 586, 677, 493, 589, 617, 697, 631, 715, 735, 804, 515, 615, 642, 718, 657, 731, 748, 823, 674, 762, 771, 835, 790, 855, 872, 931, 325, 458, 487, 593, 505, 612, 624, 719, 529, 622, 644, 739, 661, 758, 770, 833, 548, 653, 672, 752, 688, 763, 784, 853, 704, 789, 798, 860, 813, 879, 889, 942, 584, 676, 696, 778, 726, 792, 801, 868, 732, 811, 824, 886, 838, 895, 904, 951, 751, 826, 843, 898, 859, 908, 916, 956, 869, 919, 928, 966, 937, 976, 985, 1008, 179, 253, 278, 380, 318, 400, 418, 539, 305, 424, 442, 556, 457, 575, 596, 689, 322, 450, 478, 573, 495, 598, 610, 710, 517, 620, 639, 722, 655, 746, 753, 834, 329, 474, 491, 608, 523, 637, 629, 734, 546, 647, 663, 749, 679, 773, 775, 851, 569, 668, 692, 766, 703, 782, 796, 861, 724, 805, 812, 880, 825, 890, 901, 948, 354, 527, 503, 645, 560, 671, 665, 767, 594, 683, 699, 786, 712, 793, 809, 876, 607, 700, 716, 797, 744, 818, 827, 887, 755, 828, 840, 897, 857, 911, 918, 962, 640, 721, 741, 819, 768, 846, 854, 905, 777, 841, 863, 913, 874, 923, 934, 969, 800, 870, 881, 930, 893, 940, 925, 980, 902, 946, 954, 973, 957, 989, 995, 1013, 375, 576, 543, 682, 605, 702, 707, 803, 632, 728, 736, 821, 756, 832, 850, 907, 658, 742, 764, 829, 781, 852, 865, 914, 794, 873, 862, 922, 888, 933, 939, 974, 686, 779, 760, 856, 808, 867, 882, 926, 816, 885, 892, 943, 903, 936, 950, 982, 839, 896, 909, 947, 917, 955, 964, 987, 924, 960, 970, 998, 977, 991, 1001, 1017, 725, 785, 815, 883, 830, 891, 900, 945, 845, 910, 906, 958, 921, 952, 965, 992, 864, 912, 927, 968, 935, 963, 979, 996, 944, 981, 971, 999, 986, 1004, 1006, 1015, 877, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018), 1022, 1023, 1024].

Example 2

(11) When N=64, the sequence is a Q sequence, and the Q sequence may include 12 subsequences whose element locations are changeable. A value of n ranges from 1 to 12. The sequence may be: [1, 2, $L_1^{(m=3)}$, 17, $L_2^{(m=10)}$, 21, 35, 25, $L_3^{(m=2)}$, $L_4^{(m=2)}$, $L_5^{(m=3)}$, 15, 22, $L_6^{(m=6)}$, $L_7^{(m=2)}$, $L_8^{(m=5)}$, $L_9^{(m=2)}$, $L_{10}^{(m=2)}$, 40, 30, $L_{11}^{(m=2)}$, 46, 52, 47, 54, 55, 58, 59, $L_{12}^{(m=2)}$, 48, 56, 60, 62, 63, 64].

In a possible example, $L_n^{(m)}$ may be as follows: $L_1^{(m=3)}$=(5, 9, 3); $L_2^{(m=10)}$=(33, 7, 4, 13, 6, 19, 10, 34, 18, 11); $L_3^{(m=2)}$=(8, 37); $L_4^{(m=2)}$=(12, 41); $L_5^{(m=3)}$=20, 14, 49); $L_6^{(m=6)}$=(27, 36, 39, 23, 38, 26); $L_7^{(m=2)}$=(42, 29); $L_8^{(m=5)}$=(50, 43, 45, 16, 51); $L_9^{(m=2)}$(24, 53); $L_{10}^{(m=2)}$=(57, 28); $L_{11}^{(m=2)}$=(44, 31); and $L_{12}^{(m=2)}$=(61, 32).

In this example, the Q sequence is specifically: [1, 2, (5, 9, 3), 17, (33, 7, 4, 13, 6, 19, 10, 34, 18, 11), 21, 35, 25, (8, 37), (12, 41), (20, 14, 49), 15, 22, (27, 36, 39, 23, 38, 26), (42, 29), (50, 43, 45, 16, 51), (24, 53), (57, 28), 40, 30, (44, 31), 46, 52, 47, 54, 55, 58, 59, (61, 32), 48, 56, 60, 62, 63, 64].

(12) When N=64, the sequence is a Z sequence, and the Z sequence may include one (n=1) subsequence whose element locations are changeable. The sequence may be: [1, 2, $L_1^{(m=59)}$, 62, 63, 64].

In a possible example, $L_n^{(m)}$ may be as follows: $L_1^{(m=59)}$=(5, 9, 3, 11, 8, 20, 4, 13, 16, 22, 10, 25, 27, 40, 6, 15, 12, 24, 17, 28, 32, 42, 19, 34, 29, 45, 36, 47, 49, 58, 7, 14, 18, 30, 21, 33, 31, 23, 35, 48, 39, 50, 52, 59, 26, 37, 41, 51, 43, 53, 54, 60, 44, 55, 56, 61, 57).

In this example, the Z sequence is specifically: [1, 2, (5, 9, 3, 11, 8, 20, 4, 13, 16, 22, 10, 25, 27, 6, 15, 12, 24, 17, 28, 32, 42, 19, 34, 29, 45, 36, 47, 49, 58, 7, 14, 18, 30, 21, 33, 31, 46, 23, 35, 38, 48, 50, 52, 59, 26, 37, 41, 51, 43, 53, 54, 60, 44, 55, 56, 61, 57), 62, 63, 64].

(13) When N=128, the sequence is a Q sequence, and the Q sequence may include 23 (n=23) subsequences whose element locations are changeable. The sequence may be: [1, 2, $L_1^{(m=3)}$, 17, $L_2^{(m=11)}$, 21, 35, 25, $L_3^{(m=4)}$, $L_4^{(m=2)}$, $L_5^{(m=4)}$, $L_6^{(m=2)}$, 22, $L_7^{(m=9)}$, $L_8^{(m=2)}$, $L_9^{(m=12)}$, 77, $L_{10}^{(m=5)}$, $L_{11}^{(m=2)}$, $L_{12}^{(m=7)}$, 52, $L_{13}^{(m=3)}$, 54, $L_{14}^{(m=5)}$, $L_{15}^{(m=3)}$, $L_{16}^{(m=7)}$, 103, $L_{17}^{(m=3)}$, $L_{18}^{(m=3)}$, $L_{19}^{(m=2)}$, $L_{20}^{(m=2)}$, $L_{21}^{(m=3)}$, $L_{22}^{(m=4)}$, 94, 108, 95, 110, 116, 111, 118, 119, $L_{23}^{(m=5)}$, 112, 120, 124, 126, 127, 128].

In a possible example, $L_n^{(m)}$, may be as follows: $L_1^{(m=3)}$=(5, 9, 3); $L_2^{(m=1)}$=(33, 7, 65, 4, 13, 6, 19, 10, 34, 18, 11); $L_3^{(m=4)}$=(66, 8, 37, 67); $L_4^{(m=2)}$=(12, 41); $L_5^{(m=4)}$=(20, 14, 69, 49); $L_6^{(m=2)}$=(15, 73); $L_7^{(m=9)}$=(27, 36, 81, 39, 23, 38, 26, 97, 68); $L_8^{(m=2)}$=(42, 29); $L_9^{(m=12)}$=(70, 50, 75, 43, 71, 45, 82, 16, 51, 74, 24, 53); $L_{10}^{(m=5)}$=(83, 57, 28, 98, 40); $L_{11}^{(m=2)}$=(85, 30); $L_{12}^{(m=7)}$=(44, 99, 31, 89, 72, 46, 101); $L_{13}^{(m=3)}$=(47, 76, 105); $L_{14}^{(m=s)}$=(78, 55, 84, 58, 113); $L_{15}^{(m=3)}$=(86, 79, 59); $L_{16}^{(m=7)}$=(100, 87, 61, 90, 102, 91, 32); $L_{17}^{(m=3)}$=(106, 48, 93); $L_{18}^{(m=3)}$=(107, 56, 114); $L_{19}^{(m=2)}$=(80, 109); $L_{20}^{(m=2)}$=(60, 115); $L_{21}^{(m=3)}$=(88, 62, 117); $L_{22}^{(m=4)}$=(92, 63, 121, 104); and $L_{23}^{(m=s)}$=(122, 123, 64, 125, 96).

In this example, the Q sequence is specifically: [1, 2, (5, 9, 3), 17, (33, 7, 65, 4, 13, 6, 19, 10, 34, 18, 11), 21, 35, 25, (66, 8, 37, 67), (12, 41), (20, 14, 69, 49), (15, 73), 22, (27, 36, 81, 39, 23, 38, 26, 97, 68), (42, 29), (70, 50, 75, 43, 71, 45, 82, 16, 51, 74, 24, 53), 77, (83, 57, 28, 98, 40), (85, 30), (44, 99, 31, 89, 72, 46, 101), 52, (47, 76, 105), 54, (78, 55, 84, 58, 113), (86, 79, 59), (100, 87, 61, 90, 102, 91, 32), 103, (106, 48, 93), (107, 56, 114), (80, 109), (60, 115), (88, 62, 117), (92, 63, 121, 104), 94, 108, 95, 110, 116, 111, 118, 119, (122, 123, 64, 125, 96), 112, 120, 124, 126, 127, 128].

(14) When N=128, the sequence is a Z sequence, and the Z sequence may include one (n=1) subsequence whose element locations are changeable. The sequence may be: [1, 2, $L_1^{(m=123)}$, 126, 127, 128].

In a possible example, $L_n^{(m)}$ may be as follows: $L_1^{(m=123)}$=5, 10, 3, 12, 8, 22, 4, 14, 17, 25, 11, 28, 31, 52, 6, 16, 13, 27, 18, 33, 38, 55, 20, 40, 34, 60, 44, 64, 67, 91, 7, 15, 19, 35, 23, 39, 37, 62, 26, 43, 48, 65, 50, 70, 73, 94, 30, 46, 53, 72, 56, 76, 78, 97, 59, 80, 84, 101, 87, 104, 107, 120, 9, 21, 24, 42, 29, 45, 49, 69, 32, 54, 47, 74, 57, 77, 83, 99, 36, 51, 58, 79, 63, 82, 86, 103, 68, 88, 90, 106, 95, 110, 112, 122, 41, 61, 66, 85, 71, 89, 92, 109, 75, 93, 96, 111, 100, 113, 115, 123, 81, 98, 102, 114, 105, 116, 117, 124, 108, 118, 119, 125, 121).

In this example, the Z sequence is specifically: [1, 2, (5, 10, 3, 12, 8, 22, 4, 14, 17, 25, 11, 28, 31, 52, 6, 16, 13, 27, 18, 33, 38, 55, 20, 40, 34, 60, 44, 64, 67, 91, 7, 15, 19, 35, 23, 39, 37, 62, 26, 43, 48, 65, 50, 70, 73, 94, 30, 46, 53, 72, 56, 76, 78, 97, 59, 80, 84, 101, 87, 104, 107, 120, 9, 21, 24, 42, 29, 45, 49, 69, 32, 54, 47, 74, 57, 77, 83, 99, 36, 51, 58, 79, 63, 82, 86, 103, 68, 88, 90, 106, 95, 110, 112, 122, 41, 61, 66, 85, 71, 89, 92, 109, 75, 93, 96, 111, 100, 113, 115, 123, 81, 98, 102, 114, 105, 116, 117, 124, 108, 118, 119, 125, 121), 126, 127, 128].

(15) When N=256, the sequence is a Q sequence, and the Q sequence may include 16 subsequences whose element locations are changeable. A value of n ranges from 1 to 16. The sequence may be:

[1, 2, $L_1^{(m=3)}$, 17, $L_2^{(m=12)}$, 21, 35, 25, $L_3^{(m=29)}$, $L_4^{(m=28)}$, $L_5^{(m=12)}$, $L_6^{(m=32)}$, $L_7^{(m=54)}$, $L_8^{(m=9)}$, $L_9^{(m=5)}$, $L_{10}^{(m=4)}$, $L_{11}^{(m=5)}$, $L_{12}^{(m=3)}$, $L_{13}^{(m=4)}$, 222, 236, 223, $L_{14}^{(m=5)}$, $L_{15}^{(m=4)}$, $L_{16}^{(m=2)}$, 240, 248, 252, 254, 255, 256].

In a possible example, $L_n^{(m)}$ may be as follows: $L_1^{(m=3)}$=(5, 9, 3); $L_2^{(m=12)}$=(33, 7, 65, 4, 13, 6, 19, 129, 10, 34, 18, 11); $L_3^{(m=29)}$=(66, 8, 37, 67, 130, 12, 41, 20, 133, 14, 69, 49, 15, 73, 22, 131, 27, 36, 81, 137, 39, 23, 38, 26, 97, 68, 42, 145, 29); $L_4^{(m=28)}$=(70, 50, 75, 161, 43, 193, 71, 45, 132, 82, 16, 51, 135, 74, 24, 53, 134, 77, 83, 138, 57, 28, 98, 40, 139, 85, 30, 146); $L_5^{(m=12)}$=(44, 99, 141, 31, 89, 147, 72, 162, 46, 101, 149, 52); $L_6^{(m=62)}$=(47, 76, 105, 165, 194, 54, 163, 78, 153, 55, 84, 58, 113, 86, 136, 195, 79, 59, 169, 100, 140, 197, 87, 177, 61, 90, 102, 148, 142, 143, 91, 201, 32, 103, 106, 150, 48, 93, 209, 164, 154, 151, 107, 56, 166, 114, 155, 80, 225, 167, 109, 60, 115, 196, 170, 157, 88, 62, 117, 171, 198, 178); $L_7^{(m=54)}$=(92, 202, 199, 63, 144, 173, 121, 104, 179, 203, 94, 152, 210, 181, 108, 95, 205, 156, 110, 211, 185, 116, 168, 158, 226, 111, 213, 118, 172, 227, 159, 217, 119, 174, 122, 200, 180, 229, 175, 123, 64, 233, 204, 182, 125, 206, 241, 183, 212, 96, 186, 207, 187, 214); $L_8^{(m=9)}$=(228, 112, 215, 189, 218, 160, 120, 230, 219); $L_9^{(m=5)}$=(231, 176, 124, 234, 221); $L_{10}^{(m=4)}$=(126, 235, 184, 242); $L_{11}^{(m=5)}$=(188, 208, 237, 127, 243); $L_{12}^{(m=3)}$=(216, 245, 190); $L_{13}^{(m=4)}$=(220, 249, 191, 232); $L_{14}^{(m=5)}$=(238, 244, 239, 246, 128); $L_{15}^{(m=4)}$=(247, 250, 251, 192); and $L_{16}^{(m=2)}$=(253, 224).

In this example, the Q sequence is specifically: [1, 2, (5, 9, 3), 17, (33, 7, 65, 4, 13, 6, 19, 129, 10, 34, 18, 11), 21, 35, 25, (66, 8, 37, 67, 130, 12, 41, 20, 133, 14, 69, 49, 15, 73, 22, 131, 27, 36, 81, 137, 39, 23, 38, 26, 97, 68, 42, 145, 29), (70, 50, 75, 161, 43, 193, 71, 45, 132, 82, 16, 51, 135, 74, 24, 53, 134, 77, 83, 138, 57, 28, 98, 40, 139, 85, 30, 146), (44, 99, 141, 31, 89, 147, 72, 162, 46, 101, 149, 52), (47, 76, 105, 165, 194, 54, 163, 78, 153, 55, 84, 58, 113, 86, 136, 195, 79, 59, 169, 100, 140, 197, 87, 177, 61, 90, 102, 148, 142, 143, 91, 201, 32, 103, 106, 150, 48, 93, 209, 164, 154, 151, 107, 56, 166, 114, 155, 80, 225, 167, 109, 60, 115, 196, 170, 157, 88, 62, 117, 171, 198, 178), (92, 202, 199, 63, 144, 173, 121, 104, 179, 203, 94, 152, 210, 181, 108, 95, 205, 156, 110, 211, 185, 116, 168, 158, 226, 111, 213, 118, 172, 227, 159, 217, 119, 174, 122, 200, 180, 229, 175, 123, 64, 233, 204, 182, 125, 206, 241, 183, 212, 96, 186, 207, 187, 214), (228, 112, 215, 189, 218, 160, 120, 230, 219), (231, 176, 124, 234, 221), (126, 235, 184, 242), (188, 208, 237, 127, 243), (216, 245, 190), (220, 249, 191, 232), 222, 236, 223, (238, 244, 239, 246, 128), (247, 250, 251, 192), (253, 224), 240, 248, 252, 254, 255, 256].

(16) When N=256, the sequence is a Z sequence, and the Z sequence may include one (n=1) subsequence whose element locations are changeable. The sequence may be: [1, 2, $L_1^{(m=251)}$, 254, 255, 256].

In a possible example, $L_n^{(m)}$ may be as follows: [$L_1^{(m=251)}$=(5, 10, 3, 12, 8, 23, 4, 15, 18, 27, 11, 31, 34, 61, 6, 17, 13, 29, 19, 36, 43, 65, 21, 45, 38, 72, 50, 77, 82, 123, 7, 16, 20, 39, 24, 44, 42, 74, 28, 48, 55, 79, 58, 87, 91, 127, 33, 52, 62, 90, 66, 96, 100, 134, 71, 102, 108, 142, 115, 148, 156, 193, 9, 22, 25, 47, 32, 51, 57, 85, 35, 64, 53, 92, 68, 98, 107, 138, 40, 60, 69, 101, 76, 104, 113, 147, 83, 116, 121, 153, 128, 163, 168, 202, 46, 73, 80, 110, 88, 117, 124, 160, 93, 125, 133, 167, 141, 171, 178, 208, 103, 136, 143, 174, 149, 180, 185, 213, 159, 187, 192, 218, 197, 221, 228, 244, 14, 26, 37, 59, 30, 67, 63, 105, 41, 70, 75, 111, 81, 119, 120, 157, 49, 78, 84, 118, 89, 126, 132, 164, 99, 131, 137, 170, 146, 176, 183, 212, 54, 86, 97, 130, 94, 135, 140, 175, 109, 145, 150, 181, 158, 186, 191, 217, 114, 152, 161, 189, 166, 196, 200, 223, 173, 203, 205, 225, 210, 232, 235, 248, 56, 95, 106, 144, 112, 151, 155, 188, 122, 154, 162, 195, 169, 198, 204, 226, 129, 165, 172, 201, 179, 206, 209, 230, 184, 211, 215, 233, 220, 237, 239, 250, 139, 177, 182, 207, 190, 214, 216, 236, 194, 219, 222, 238, 227, 240, 242, 251, 199, 224, 229, 241, 231, 243, 245, 252, 234, 246, 247, 253, 249)].

In this example, the Z sequence is specifically: [1, 2, (5, 10, 3, 12, 8, 23, 4, 15, 18, 27, 11, 31, 34, 61, 6, 17, 13, 29, 19, 36, 43, 65, 21, 45, 38, 72, 50, 77, 82, 123, 7, 16, 20, 39, 24, 44, 42, 74, 28, 48, 55, 79, 58, 87, 91, 127, 33, 52, 62, 90, 66, 96, 100, 134, 71, 102, 108, 142, 115, 148, 156, 193, 9, 22, 25, 47, 32, 51, 57, 85, 35, 64, 53, 92, 68, 98, 107, 138, 40, 60, 69, 101, 76, 104, 113, 147, 83, 116, 121, 153, 128, 163, 168, 202, 46, 73, 80, 110, 88, 117, 124, 160, 93, 125, 133, 167, 141, 171, 178, 208, 103, 136, 143, 174, 149, 180, 185, 213, 159, 187, 192, 218, 197, 221, 228, 244, 14, 26, 37, 59, 30, 67, 63, 105, 41, 70, 75, 111, 81, 119, 120, 157, 49, 78, 84, 118, 89, 126, 132, 164, 99, 131, 137, 170, 146, 176, 183, 212, 54, 86, 97, 130, 94, 135, 140, 175, 109, 145, 150, 181, 158, 186, 191, 217, 114, 152, 161, 189, 166, 196, 200, 223, 173, 203, 205, 225, 210, 232, 235, 248, 56, 95, 106, 144, 112, 151, 155, 188, 122, 154, 162, 195, 169, 198, 204, 226, 129, 165, 172, 201, 179, 206, 209, 230, 184, 211, 215, 233, 220, 237, 239, 250, 139, 177, 182, 207, 190, 214, 216, 236, 194, 219, 222, 238, 227, 240, 242, 251, 199, 224, 229, 241, 231, 243, 245, 252, 234, 246, 247, 253, 249), 254, 255, 256].

(17) When N=512, the sequence is a Q sequence, and the Q sequence may include six subsequences whose element locations are changeable. A value of n ranges from 1 to 6. The sequence may be: [1, 2, $L_1^{(m=3)}$, 17, $L_2^{(m=441)}$, $L_3^{(m=28)}$, $L_4^{(m=28)}$, 507, $L_5^{(m=2)}$, $L_6^{(m=2)}$, 508, 510, 511, 512].

In a possible example, $L_n^{(m)}$ may be as follows: $L_1^{(m=3)}$=(5, 9, 3); $L_2^{(m=441)}$=(33, 7, 65, 4, 13, 6, 19, 129, 10, 34, 18, 11, 257, 21, 35, 25, 66, 8, 37, 67, 130, 12, 41, 20, 133, 14, 69, 49, 15, 73, 258, 22, 131, 27, 36, 81, 259, 137, 39, 23, 261, 38, 26, 97, 68, 265, 42, 145, 29, 70, 50, 75, 161, 43, 273, 193, 71, 45, 132, 82, 16, 289, 51, 135, 74, 24, 53, 321, 134, 77, 83, 138, 57, 28, 260, 98, 40, 385, 139, 85, 30, 262, 146, 44, 99, 141, 31, 89, 263, 147, 72, 266, 162, 46, 101, 149, 52, 47, 76, 267, 105, 274, 165, 194, 54, 163, 269, 78, 153, 275, 55, 84, 58, 113, 86, 136, 290, 195, 79, 291, 59, 277, 169, 100, 140, 197, 87, 177, 61, 90, 281, 102, 148, 293, 142, 322, 143, 91, 201, 32, 103, 264, 106, 323, 150, 297, 48, 93, 209, 268, 386, 325, 305, 164, 154, 151, 107, 56, 166, 387, 329, 270, 114, 155, 80, 225, 167, 276, 109, 271, 60, 115, 196, 170, 157, 88, 62, 278, 292, 279, 117, 171, 198, 178, 282, 92, 202, 389, 294, 199, 63, 144, 337, 173, 283, 121, 104, 179, 295, 203, 94, 324, 393, 298, 152, 210, 285, 181, 108, 95, 205, 299, 353, 326, 156, 110, 401, 306, 301, 211, 185, 327, 116, 168, 158, 226, 307, 330, 111, 213, 118, 172, 331, 227, 388, 309, 159, 417, 338, 217, 272, 119, 280, 333, 390, 174, 122, 200, 180, 229, 339, 313, 391, 175, 394, 284, 123, 64, 341, 449, 354, 395, 233, 204, 296, 286, 182, 125, 206, 241, 287, 300, 355, 183, 402, 212, 397, 345, 96, 186, 207, 328, 403, 187, 357, 308, 419, 214, 302, 228, 303, 361, 112, 418, 215, 405, 310, 189, 450, 332, 218, 160, 120, 230, 334, 409, 311, 421, 219, 369, 231, 392, 176, 314, 340, 335, 124, 234, 315, 342, 451, 221, 425, 356, 126, 235, 184, 396, 242, 317, 343, 346, 404, 288, 398, 453, 433, 188, 358, 208, 237, 347, 362, 127, 243, 406, 216, 399, 304, 359, 420, 457, 349, 245, 190, 220, 312, 363, 465, 407, 422, 249, 191, 370, 410, 411, 481, 232, 316, 365, 423, 336, 371, 222, 452, 426, 413, 454, 318, 236, 344, 373, 223, 427, 434, 238, 348, 244, 455, 319, 377, 429, 239, 360, 459, 400, 435, 458, 246, 350, 128, 408, 437, 364, 466, 351, 247, 250, 461, 412, 366, 441, 375, 424, 467, 251, 372, 192, 482, 414, 367, 469, 374, 428, 415, 253, 483, 430, 224, 456, 473, 378, 436, 320, 485, 431, 489, 460, 240, 379, 438); $L_3^{(m=28)}$=(462, 381, 248, 442, 352, 470, 439, 463, 252, 497, 468, 368, 443, 475, 484, 380, 416, 254, 445, 486, 471, 376, 474, 432, 487, 490, 255, 477); $L_4^{(m=28)}$=(440, 493, 382, 499, 464, 491, 383, 472, 498, 444, 501, 446, 447, 476, 488, 478, 494, 505, 256, 492, 479, 384, 500, 503, 495, 502, 448, 506); $L_5^{(m=2)}$=(480, 509); and $L_6^{(m=2)}$=(504, 496).

In this example, the Q sequence is specifically: [1, 2, (5, 9, 3), 17, (33, 7, 65, 4, 13, 6, 19, 129, 10, 34, 18, 11, 257, 21, 35, 25, 66, 8, 37, 67, 130, 12, 41, 20, 133, 14, 69, 49, 15, 73, 258, 22, 131, 27, 36, 81, 259, 137, 39, 23, 261, 38, 26, 97, 68, 265, 42, 145, 29, 70, 50, 75, 161, 43, 273, 193, 71, 45, 132, 82, 16, 289, 51, 135, 74, 24, 53, 321, 134, 77, 83, 138, 57, 28, 260, 98, 40, 385, 139, 85, 30, 262, 146, 44, 99, 141, 31, 89, 263, 147, 72, 266, 162, 46, 101, 149, 52, 47, 76, 267, 105, 274, 165, 194, 54, 163, 269, 78, 153, 275, 55, 84, 58, 113, 86, 136, 290, 195, 79, 291, 59, 277, 169, 100, 140, 197, 87, 177, 61, 90, 281, 102, 148, 293, 142, 322, 143, 91, 201, 32, 103, 264, 106, 323, 150, 297, 48, 93, 209, 268, 386, 325, 305, 164, 154, 151, 107, 56, 166, 387, 329, 270, 114, 155, 80, 225, 167, 276, 109, 271, 60, 115, 196, 170, 157, 88, 62, 278, 292, 279, 117, 171, 198, 178, 282, 92, 202, 389, 294, 199, 63, 144, 337, 173, 283, 121, 104, 179, 295, 203, 94, 324, 393, 298, 152, 210, 285, 181, 108, 95, 205, 299, 353, 326, 156, 110, 401, 306, 301, 211, 185, 327, 116, 168, 158, 226, 307, 330, 111, 213, 118, 172, 331, 227, 388, 309, 159, 417, 338, 217, 272, 119, 280, 333, 390, 174, 122, 200, 180, 229, 339, 313, 391, 175, 394, 284, 123, 64, 341, 449, 354, 395, 233, 204, 296, 286, 182, 125, 206, 241, 287, 300, 355, 183, 402, 212, 397, 345, 96, 186, 207, 328, 403, 187, 357, 308, 419, 214, 302, 228, 303, 361, 112, 418, 215, 405, 310, 189, 450, 332, 218, 160, 120, 230, 334, 409, 311, 421, 219, 369, 231, 392, 176, 314, 340, 335, 124, 234, 315, 342, 451, 221, 425, 356, 126, 235, 184, 396, 242, 317, 343, 346, 404, 288, 398, 453, 433, 188, 358, 208, 237, 347, 362, 127, 243, 406, 216, 399, 304, 359, 420, 457, 349, 245, 190, 220, 312, 363, 465, 407, 422, 249, 191, 370, 410, 411, 481, 232, 316, 365, 423, 336, 371, 222, 452, 426, 413, 454, 318, 236, 344, 373, 223, 427, 434, 238, 348, 244, 455, 319, 377, 429, 239, 360, 459, 400, 435, 458, 246, 350, 128, 408, 437, 364, 466, 351, 247, 250, 461, 412, 366, 441, 375, 424, 467, 251, 372, 192, 482, 414, 367, 469, 374, 428, 415, 253, 483, 430, 224, 456, 473, 378, 436, 320, 485, 431, 489, 460, 240, 379, 438), (462, 381, 248, 442, 352, 470, 439, 463, 252, 497, 468, 368, 443, 475, 484, 380, 416, 254, 445, 486, 471, 376, 474, 432, 487, 490, 255, 477), (440, 493, 382, 499, 464, 491, 383, 472, 498, 444, 501, 446, 447, 476, 488, 478, 494, 505, 256, 492, 479, 384, 500, 503, 495, 502, 448, 506), 507, (480, 509), (504, 496), 508, 510, 511, 512].

(18) When N=512, the sequence is a Z sequence, and the Z sequence may include one (n=1) subsequence whose element locations are changeable. The sequence may be: [1, 2, $L_1^{(m=507)}$, 510, 511, 512].

In a possible example, $L_n^{(m)}$ may be as follows: $L_1^{(m=507)}$=(5, 10, 3, 12, 8, 24, 4, 15, 18, 28, 11, 32, 35, 67, 6, 17, 13, 30, 20, 38, 46, 72, 22, 49, 40, 80, 55, 87, 93, 146, 7, 16, 21, 41, 25, 48, 45, 83, 29, 53, 60, 90, 64, 100, 104, 153, 34, 57, 69, 103, 73, 111, 117, 164, 79, 119, 127, 177, 135, 183, 197, 264, 9, 23, 26, 51, 33, 56, 63, 97, 36, 71, 58, 105, 76, 114, 125, 171, 42, 66, 77, 118, 86, 121, 133, 182, 94, 136, 144, 192, 154, 207, 216, 285, 50, 82, 91, 130, 101, 138, 147, 203, 107, 149, 163, 215, 175, 222, 235, 299, 120, 169, 178, 229, 187, 237, 248, 309, 202, 253, 263, 323, 274, 331, 350, 407, 14, 27, 39, 65, 31, 75, 70, 122, 44, 78, 85, 131, 92, 141, 143, 198, 54, 89, 96, 139, 102, 151, 162, 211, 115, 161, 170, 221, 181, 231, 243, 308, 59, 99, 112, 160, 109, 165, 173, 230, 129, 180, 188, 238, 200, 252, 260, 319, 134, 190, 204, 255, 214, 273, 280, 333, 227, 286, 290, 344, 304, 361, 369, 424, 62, 110, 124, 179, 132, 189, 196, 254, 145, 193, 206, 270, 217, 275, 287, 346, 155, 212, 226, 282, 236, 294, 301, 353, 246, 307, 315, 362, 328, 380, 389, 435, 172, 232, 240, 296, 256, 310, 317, 374, 269, 324, 332, 386, 347, 392, 399, 445, 276, 335, 351, 394, 360, 405, 413, 450, 368, 414, 422, 456, 432, 465, 474, 494, 19, 37, 43, 81, 47, 88, 95, 148, 52, 98, 106, 156, 113, 168, 176, 247, 61, 108, 116, 174, 128, 184, 186, 249, 137, 191, 201, 262, 213, 272, 277, 340, 68, 123, 126, 185, 140, 195, 205, 271, 152, 210, 218, 278, 225, 295, 297, 355, 159, 224, 233, 292, 242, 303, 313, 363, 258, 320, 325, 375, 336, 385, 396, 440, 74, 142, 150, 208, 158, 220, 228, 288, 167, 234, 239, 306, 250, 311, 322, 378, 199, 245, 257, 321, 265, 326, 337, 387, 284, 338, 348, 393, 359, 406, 412, 452, 219, 267, 279, 330, 291, 345, 356, 400, 298, 349, 364, 410, 376, 417, 427, 459, 316, 370, 379, 423, 388, 429, 419, 469, 397, 438, 446, 463, 449, 478, 482, 497, 84, 157, 166, 241, 194, 251, 259, 318, 209, 261, 268, 334, 283, 341, 354, 402, 223, 281, 289, 339, 302, 352, 366, 408, 312, 371, 372, 416, 383, 426, 431, 464, 244, 300, 293, 357, 314, 367, 377, 420, 329, 382, 390, 430, 398, 434, 442, 471, 343, 391, 403, 439, 409, 447, 454, 476, 418, 451, 460, 485, 466, 487, 488, 502, 266, 305, 327, 381, 342, 384, 395, 436, 358, 404, 401, 444, 415, 448, 455, 480, 365, 411, 421, 458, 428, 453, 468, 483, 437, 470, 461, 489, 475, 491, 496, 505, 373, 425, 433, 462, 441, 467, 472, 490, 443, 473, 481, 495, 477, 492, 500, 508, 457, 484, 479, 498, 486, 501, 499, 507, 493, 503, 504, 509, 506).

In this example, the Z sequence is specifically: [1, 2, (5, 10, 3, 12, 8, 24, 4, 15, 18, 28, 11, 32, 35, 67, 6, 17, 13, 30, 20, 38, 46, 72, 22, 49, 40, 80, 55, 87, 93, 146, 7, 16, 21, 41, 25, 48, 45, 83, 29, 53, 60, 90, 64, 100, 104, 153, 34, 57, 69, 103, 73, 111, 117, 164, 79, 119, 127, 177, 135, 183, 197, 264, 9, 23, 26, 51, 33, 56, 63, 97, 36, 71, 58, 105, 76, 114, 125, 171, 42, 66, 77, 118, 86, 121, 133, 182, 94, 136, 144, 192, 154, 207, 216, 285, 50, 82, 91, 130, 101, 138, 147, 203, 107, 149, 163, 215, 175, 222, 235, 299, 120, 169, 178, 229, 187, 237, 248, 309, 202, 253, 263, 323, 274, 331, 350, 407, 14, 27, 39, 65, 31, 75, 70, 122, 44, 78, 85, 131, 92, 141, 143, 198, 54, 89, 96, 139, 102, 151, 162, 211, 115, 161, 170, 221, 181, 231, 243, 308, 59, 99, 112, 160, 109, 165, 173, 230, 129, 180, 188, 238, 200, 252, 260, 319, 134, 190, 204, 255, 214, 273, 280, 333, 227, 286, 290, 344, 304, 361, 369, 424, 62, 110, 124, 179, 132, 189, 196, 254, 145, 193, 206, 270, 217, 275, 287, 346, 155, 212, 226, 282, 236, 294, 301, 353, 246, 307, 315, 362, 328, 380, 389, 435, 172, 232, 240, 296, 256, 310, 317, 374, 269, 324, 332, 386, 347, 392, 399, 445, 276, 335, 351, 394, 360, 405, 413, 450, 368, 414, 422, 456, 432, 465, 474, 494, 19, 37, 43, 81, 47, 88, 95, 148, 52, 98, 106, 156, 113, 168, 176, 247, 61, 108, 116, 174, 128, 184, 186, 249, 137, 191, 201, 262, 213, 272, 277, 340, 68, 123, 126, 185, 140, 195, 205, 271, 152, 210, 218, 278, 225, 295, 297, 355, 159, 224, 233, 292, 242, 303, 313, 363, 258, 320, 325, 375, 336, 385, 396, 440, 74, 142, 150, 208, 158, 220, 228, 288, 167, 234, 239, 306, 250, 311, 322, 378, 199, 245, 257, 321, 265, 326, 337, 387, 284, 338, 348, 393, 359, 406, 412, 452, 219, 267, 279, 330, 291, 345, 356, 400, 298, 349, 364, 410, 376, 417, 427, 459, 316, 370, 379, 423, 388, 429, 419, 469, 397, 438, 446, 463, 449, 478, 482, 497, 84, 157, 166, 241, 194, 251, 259, 318, 209, 261, 268, 334, 283, 341, 354, 402, 223, 281, 289, 339, 302, 352, 366, 408, 312, 371, 372, 416, 383, 426, 431, 464, 244, 300, 293, 357, 314, 367, 377, 420, 329, 382, 390, 430, 398, 434, 442, 471, 343, 391, 403, 439, 409, 447, 454, 476, 418, 451, 460, 485, 466, 487, 488, 502, 266, 305, 327, 381, 342, 384, 395, 436, 358, 404, 401, 444, 415, 448, 455, 480, 365, 411, 421, 458, 428, 453, 468, 483, 437, 470, 461, 489, 475, 491, 496, 505, 373, 425, 433, 462, 441, 467, 472, 490, 443, 473, 481, 495, 477, 492, 500, 508, 457, 484, 479, 498, 486, 501, 499, 507, 493, 503, 504, 509, 506), 510, 511, 512].

(19) When N=1024, the sequence is a Q sequence, and the Q sequence may include three subsequences whose element locations are changeable. A value of n ranges from 1 to 3. The sequence may be: [1, 2, $L_1^{(m=3)}$, 17, $L_2^{(m=1012)}$, $L_3^{(m=3)}$, 1020, 1022, 1023, 1024].

In a possible example, $L_n^{(m)}$ may be as follows: $L_1^{(m=3)}$=(5, 9, 3); $L_2^{m=1012}$=(33, 7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021); and $L_3^{(m=2)}$=(1016, 1008).

In this example, the Q sequence is specifically: [1, 2, (5, 9, 3), 17, (33, 7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 779, 564, 404, 288, 398, 453, 675, 559, 786, 433, 188, 358, 208, 665, 588, 781, 706, 677, 237, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 680, 381, 813, 628, 248, 900, 842, 442, 623, 929, 352, 725, 784, 470, 630, 819, 439, 670, 463, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021), (1016, 1008), 1020, 1022, 1023, 1024].

(20) When N=1024, the sequence is a Z sequence, and the Z sequence may include one (n=1) subsequence whose element locations are changeable. The sequence may be: [1, 2, $L_1^{(m=1019)}$, 1022, 1023, 1024].

In a possible example, $L_n^{(m)}$ may be as follows: $L_1^{(m=1019)}$=(5, 11, 3, 13, 8, 25, 4, 16, 19, 29, 12, 34, 37, 71, 6, 18, 14, 31, 21, 40, 48, 77, 23, 52, 42, 85, 58, 93, 100, 162, 7, 17, 22, 43, 26, 51, 47, 89, 30, 56, 63, 97, 68, 108, 112, 170, 36, 60, 73, 111, 78, 120, 127, 185, 84, 130, 139, 201, 149, 208, 226, 323, 9, 24, 27, 54, 35, 59, 67, 104, 38, 75, 61, 114, 81, 124, 137, 194, 44, 70, 82, 129, 92, 132, 146, 206, 101, 150, 159, 219, 172, 239, 251, 356, 53, 88, 98, 143, 109, 152, 163, 234, 116, 165, 184, 250, 198, 259, 277, 378, 131, 192, 202, 269, 213, 280, 296, 395, 232, 303, 319, 416, 339, 431, 464, 574, 15, 28, 41, 69, 32, 80, 74, 133, 46, 83, 91, 144, 99, 156, 158, 227, 57, 95, 103, 153, 110, 168, 183, 244, 125, 182, 193, 258, 205, 272, 288, 390, 62, 107, 122, 181, 118, 186, 196, 270, 141, 204, 214, 281, 230, 301, 314, 411, 147, 217, 235, 306, 248, 338, 348, 433, 266, 357, 364, 452, 386, 482, 498, 613, 66, 119, 136, 203, 145, 215, 224, 304, 160, 221, 238, 332, 252, 340, 358, 454, 173, 246, 265, 350, 279, 371, 383, 468, 293, 389, 406, 484, 426, 518, 536, 641, 195, 273, 284, 373, 307, 396, 408, 508, 331, 419, 432, 530, 460, 542, 557, 667, 341, 435, 465, 547, 480, 570, 588, 681, 496, 590, 609, 698, 633, 727, 757, 844, 20, 39, 45, 86, 49, 94, 102, 164, 55, 106, 115, 174, 123, 191, 200, 294, 65, 117, 126, 197, 140, 209, 212, 297, 151, 218, 231, 317, 247, 337, 345, 445, 72, 134, 138, 210, 154, 223, 236, 336, 169, 243, 254, 346, 263, 372, 374, 471, 177, 262, 274, 368, 287, 385, 403, 486, 311, 412, 420, 510, 439, 528, 551, 654, 79, 157, 167, 240, 176, 256, 267, 359, 189, 276, 283, 388, 299, 397, 415, 514, 228, 291, 309, 413, 324, 423, 440, 532, 352, 441, 461, 545, 479, 572, 585, 687, 255, 328, 347, 428, 365, 453, 473, 559, 377, 463, 488, 581, 512, 597, 621, 708, 407, 500, 516, 611, 534, 625, 601, 740, 553, 648, 670, 720, 678, 772, 791, 849, 90, 175, 187, 286, 222, 300, 313, 410, 242, 316, 330, 434, 351, 446, 469, 563, 261, 349, 362, 444, 384, 467, 492, 577, 398, 502, 504, 595, 524, 618, 630, 723, 290, 381, 370, 475, 404, 494, 513, 604, 427, 522, 538, 628, 555, 638, 659, 747, 451, 540, 566, 651, 579, 673, 693, 765, 599, 684, 711, 802, 730, 807, 814, 878, 326, 387, 425, 520, 447, 526, 549, 643, 477, 568, 561, 664, 592, 675, 695, 783, 490, 583, 606, 705, 623, 690, 737, 795, 646, 743, 714, 817, 761, 831, 848, 899, 506, 616, 635, 717, 656, 733, 750, 822, 662, 754, 787, 847, 769, 836, 871, 938, 701, 799, 776, 858, 806, 875, 866, 929, 837, 884, 894, 949, 920, 961, 975, 993, 10, 33, 76, 121, 50, 135, 105, 211, 64, 155, 171, 225, 128, 249, 257, 333, 87, 166, 142, 237, 180, 260, 292, 361, 178, 298, 268, 382, 312, 399, 414, 533, 96, 161, 207, 275, 190, 295, 282, 393, 220, 308, 321, 417, 335, 436, 449, 541, 241, 327, 344, 443, 355, 462, 470, 567, 367, 481, 499, 587, 509, 614, 626, 738, 113, 188, 199, 302, 245, 315, 334, 430, 229, 343, 353, 456, 366, 466, 483, 580, 271, 363, 376, 489, 392, 472, 497, 600, 405, 521, 531, 619, 552, 649, 660, 759, 289, 391, 401, 519, 422, 507, 537, 634, 438, 544, 571, 650, 582, 669, 685, 774, 476, 562, 591, 680, 603, 691, 713, 788, 636, 706, 729, 810, 745, 820, 842, 915, 148, 216, 264, 342, 233, 360, 369, 485, 285, 379, 394, 501, 409, 525, 535, 627, 310, 402, 421, 511, 437, 554, 564, 652, 455, 550, 578, 666, 602, 694, 709, 780, 320, 429, 448, 558, 459, 565, 586, 677, 493, 589, 617, 697, 631, 715, 735, 804, 515, 615, 642, 718, 657, 731, 748, 823, 674, 762, 771, 835, 790, 855, 872, 931, 325, 458, 487, 593, 505, 612, 624, 719, 529, 622, 644, 739, 661, 758, 770, 833, 548, 653, 672, 752, 688, 763, 784, 853, 704, 789, 798, 860, 813, 879, 889, 942, 584, 676, 696, 778, 726, 792, 801, 868, 732, 811, 824, 886, 838, 895, 904, 951, 751, 826, 843, 898, 859, 908, 916, 956, 869, 919, 928, 966, 937, 976, 985, 1008, 179, 253, 278, 380, 318, 400, 418, 539, 305, 424, 442, 556, 457, 575, 596, 689, 322, 450, 478, 573, 495, 598, 610, 710, 517, 620, 639, 722, 655, 746, 753, 834, 329, 474, 491, 608, 523, 637, 629, 734, 546, 647, 663, 749, 679, 773, 775, 851, 569, 668, 692, 703, 782, 796, 861, 724, 805, 812, 880, 825, 890, 901, 948, 354, 527, 503, 645, 560, 671, 665, 594, 683, 699, 786, 712, 793, 809, 876, 607, 700, 716, 797, 744, 818, 827, 887, 755, 828, 840, 897, 857, 911, 918, 962, 640, 721, 741, 819, 768, 846, 854, 905, 777, 841, 863, 913, 874, 923, 934, 969, 800, 870, 881, 930, 893, 940, 925, 980, 902, 946, 954, 973, 957, 989, 995, 1013, 375, 576, 543, 682, 605, 702, 707, 803, 632, 728, 736, 821, 756, 832, 850, 907, 658, 742, 764, 829, 781, 852, 865, 914, 794, 873, 862, 922, 888, 933, 939, 974, 686, 779, 760, 856, 808, 867, 882, 926, 816, 885, 892, 943, 903, 936, 950, 982, 839, 896, 909, 947, 917, 955, 964, 987, 924, 960, 970, 998, 977, 991, 1001, 1017, 725, 785, 815, 883, 830, 891, 900, 945, 845, 910, 906, 958, 921, 952, 965, 992, 864, 912, 927, 968, 935, 963, 979, 996, 944, 981, 971, 999, 986, 1004, 1006, 1015, 877, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018).

In this example, the Z sequence is specifically: [1, 2, (5, 11, 3, 13, 8, 25, 4, 16, 19, 29, 12, 34, 37, 71, 6, 18, 14, 31, 21, 40, 48, 77, 23, 52, 42, 85, 58, 93, 100, 162, 7, 17, 22, 43, 26, 51, 47, 89, 30, 56, 63, 97, 68, 108, 112, 170, 36, 60, 73, 111, 78, 120, 127, 185, 84, 130, 139, 201, 149, 208, 226, 323, 9, 24, 27, 54, 35, 59, 67, 104, 38, 75, 61, 114, 81, 124, 137, 194, 44, 70, 82, 129, 92, 132, 146, 206, 101, 150, 159, 219, 172, 239, 251, 356, 53, 88, 98, 143, 109, 152, 163, 234, 116, 165, 184, 250, 198, 259, 277, 378, 131, 192, 202, 269, 213, 280, 296, 395, 232, 303, 319, 416, 339, 431, 464, 574, 15, 28, 41, 69, 32, 80, 74, 133, 46, 83, 91, 144, 99, 156, 158, 227, 57, 95, 103, 153, 110, 168, 183, 244, 125, 182, 193, 258, 205, 272, 288, 390, 62, 107, 122, 181, 118, 186, 196, 270, 141, 204, 214, 281, 230, 301, 314, 411, 147, 217, 235, 306, 248, 338, 348, 433, 266, 357, 364, 452, 386, 482, 498, 613, 66, 119, 136, 203, 145, 215, 224, 304, 160, 221, 238, 332, 252, 340, 358, 454, 173, 246, 265, 350, 279, 371, 383, 468, 293, 389, 406, 484, 426, 518, 536, 641, 195, 273, 284, 373, 307, 396, 408, 508, 331, 419, 432, 530, 460, 542, 557, 667, 341, 435, 465, 547, 480, 570, 588, 681, 496, 590, 609, 698, 633, 727, 757, 844, 20, 39, 45, 86, 49, 94, 102, 164, 55, 106, 115, 174, 123, 191, 200, 294, 65, 117, 126, 197, 140, 209, 212, 297, 151, 218, 231, 317, 247, 337, 345, 445, 72, 134, 138, 210, 154, 223, 236, 336, 169, 243, 254, 346, 263, 372, 374, 471, 177, 262, 274, 368, 287, 385, 403, 486, 311, 412, 420, 510, 439, 528, 551, 654, 79, 157, 167, 240, 176, 256, 267, 359, 189, 276, 283, 388, 299, 397, 415, 514, 228, 291, 309, 413, 324, 423, 440, 532, 352, 441, 461, 545, 479, 572, 585, 687, 255, 328, 347, 428, 365, 453, 473, 559, 377, 463, 488, 581, 512, 597, 621, 708, 407, 500, 516, 611, 534, 625, 601, 740, 553, 648, 670, 720, 678, 772, 791, 849, 90, 175, 187, 286, 222, 300, 313, 410, 242, 316, 330, 434, 351, 446, 469, 563, 261, 349, 362, 444, 384, 467, 492, 577, 398, 502, 504, 595, 524, 618, 630, 723, 290, 381, 370, 475, 404, 494, 513, 604, 427, 522, 538, 628, 555, 638, 659, 747, 451, 540, 566, 651, 579, 673, 693, 765, 599, 684, 711, 802, 730, 807, 814, 878, 326, 387, 425, 520, 447, 526, 549, 643, 477, 568, 561, 664, 592, 675, 695, 783, 490, 583, 606, 705, 623, 690, 737, 795, 646, 743, 714, 817, 761, 831, 848, 899, 506, 616, 635, 717, 656, 733, 750, 822, 662, 754, 787, 847, 769, 836, 871, 938, 701, 799, 776, 858, 806, 875, 866, 929, 837, 884, 894, 949, 920, 961, 975, 993, 10, 33, 76, 121, 50, 135, 105, 211, 64, 155, 171, 225, 128, 249, 257, 333, 87, 166, 142, 237, 180, 260, 292, 361, 178, 298, 268, 382, 312, 399, 414, 533, 96, 161, 207, 275, 190, 295, 282, 393, 220, 308, 321, 417, 335, 436, 449, 541, 241, 327, 344, 443, 355, 462, 470, 567, 367, 481, 499, 587, 509, 614, 626, 738, 113, 188, 199, 302, 245, 315, 334, 430, 229, 343, 353, 456, 366, 466, 483, 580, 271, 363, 376, 489, 392, 472, 497, 600, 405, 521, 531, 619, 552, 649, 660, 759, 289, 391, 401, 519, 422, 507, 537, 634, 438, 544, 571, 650, 582, 669, 685, 774, 476, 562, 591, 680, 603, 691, 713, 788, 636, 706, 729, 810, 745, 820, 842, 915, 148, 216, 264, 342, 233, 360, 369, 485, 285, 379, 394, 501, 409, 525, 535, 627, 310, 402, 421, 511, 437, 554, 564, 652, 455, 550, 578, 666, 602, 694, 709, 780, 320, 429, 448, 558, 459, 565, 586, 677, 493, 589, 617, 697, 631, 715, 735, 804, 515, 615, 642, 718, 657, 731, 748, 823, 674, 762, 771, 835, 790, 855, 872, 931, 325, 458, 487, 593, 505, 612, 624, 719, 529, 622, 644, 739, 661, 758, 770, 833, 548, 653, 672, 752, 688, 763, 784, 853, 704, 789, 798, 860, 813, 879, 889, 942, 584, 676, 696, 778, 726, 792, 868, 732, 811, 824, 886, 838, 895, 904, 951, 751, 826, 843, 898, 859, 908, 916, 956, 869, 919, 928, 966, 937, 976, 985, 1008, 179, 253, 278, 380, 318, 400, 418, 539, 305, 424, 442, 556, 457, 575, 596, 689, 322, 450, 478, 573, 495, 598, 610, 710, 517, 620, 639, 722, 655, 746, 753, 834, 329, 474, 491, 608, 523, 637, 629, 734, 546, 647, 663, 749, 679, 773, 775, 851, 569, 668, 692, 703, 782, 796, 861, 724, 805, 812, 880, 825, 890, 901, 948, 354, 527, 503, 645, 560, 671, 665, 594, 683, 699, 786, 712, 793, 809, 876, 607, 700, 716, 797, 744, 818, 827, 887, 755, 828, 840, 897, 857, 911, 918, 962, 640, 721, 741, 819, 768, 846, 854, 905, 777, 841, 863, 913, 874, 923, 934, 969, 870, 881, 930, 893, 940, 925, 980, 902, 946, 954, 973, 957, 989, 995, 1013, 375, 576, 543, 682, 605, 702, 707, 803, 632, 728, 736, 821, 756, 832, 850, 907, 658, 742, 764, 829, 781, 852, 865, 914, 794, 873, 862, 922, 888, 933, 939, 974, 686, 779, 760, 856, 808, 867, 882, 926, 816, 885, 892, 943, 903, 936, 950, 982, 839, 896, 909, 947, 917, 955, 964, 987, 924, 960, 970, 998, 977, 991, 1001, 1017, 725, 785, 815, 883, 830, 891, 900, 945, 845, 910, 906, 958, 921, 952, 965, 992, 864, 912, 927, 968, 935, 963, 979, 996, 944, 981, 971, 999, 986, 1004, 1006, 1015, 877, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018), 1022, 1023, 1024].

Example 3

(21) When N=64, the sequence is a Q sequence, and the Q sequence may include 11 subsequences whose element locations are changeable. A value of n ranges from 1 to 11. The sequence may be:

[1, 2, $L_1^{(m=3)}$, 17, $L_2^{(m=15)}$, $L_3^{(m=2)}$, $L_4^{(m=3)}$, 15, 22, $L_5^{(m=6)}$, $L_6^{(m=2)}$, $L_7^{(m=5)}$, $L_8^{(m=2)}$, $L_9^{(m=3)}$, 30, $L_{10}^{(m=2)}$, 46, 52, 47, 54, 55, 58, 59, $L_{11}^{(m=2)}$, 48, 56, 60, 62, 63, 64].

In a possible example, $L_n^{(m)}$ may be as follows: $L_1^{(m=3)}$=(5, 9, 3); $L_2^{(m=15)}$=(33, 7, 4, 13, 6, 19, 10, 34, 18, 11, 21, 35, 25, 8, 37); $L_3^{(m=2)}$=(12, 41); $L_4^{(m=3)}$=(20, 14, 49); $L_5^{(m=6)}$=(27, 36, 39, 23, 38, 26); $L_6^{(m=2)}$=(42, 29); $L_7^{(m=5)}$=(50, 43, 45, 16, 51); $L_8^{(m=2)}$=(24, 53); $L_9^{(m=3)}$=(57, 28, 40); $L_{10}^{(m=2)}$=(44, 31); and $L_{11}^{(m=2)}$=(61, 32).

N=64, and locations of elements in the subsequence $L_1^{(m=3)}$ in the Q sequence may be exchanged in the subsequence $L_1^{(m=3)}$, for example, may be (5, 9, 3), and may be exchanged to (3, 9, 5) or (5, 3, 9).

In this example, the Q sequence is specifically: [1, 2, (5, 9, 3), 17, (33, 7, 4, 13, 6, 19, 10, 34, 18, 11, 21, 35, 25, 8, 37), (12, 41), (20, 14, 49), 15, 22, (27, 36, 39, 23, 38, 26), (42, 29), (50, 43, 45, 16, 51), (24, 53), (57, 28, 40), 30, (44, 31), 46, 52, 47, 54, 55, 58, 59, (61, 32), 48, 56, 60, 62, 63, 64]. A set in parentheses is the subsequence $L_n^{(m)}$.

(22) When N=64, the sequence is a Z sequence, and the Z sequence may include one (n=1) subsequence whose element locations are changeable. The sequence may be:

[1, 2, $L_1^{(m=59)}$, 62, 63, 64].

In a possible example, $L_n^{(m)}$ may be as follows: $L_1^{(m=59)}$=(5, 9, 3, 11, 8, 20, 4, 13, 16, 22, 10, 25, 27, 40, 6, 15, 12, 24, 17, 28, 32, 42, 19, 34, 29, 45, 36, 47, 49, 58, 7, 14, 18, 30, 21, 33, 31, 46, 23, 35, 38, 48, 39, 50, 52, 59, 26, 37, 41, 51, 43, 53, 54, 60, 44, 55, 56, 61, 57). Locations of elements in $L_1^{(m=59)}$ may be exchanged in the subsequence.

In this example, the Z sequence is specifically: [1, 2, (5, 9, 3, 11, 8, 20, 4, 13, 16, 22, 10, 25, 27, 40, 6, 15, 12, 24, 17, 28, 32, 42, 19, 34, 29, 45, 36, 47, 49, 58, 7, 14, 18, 30, 21, 33, 31, 46, 23, 35, 38, 48, 39, 50, 52, 59, 26, 37, 41, 51, 43, 53, 54, 60, 44, 55, 56, 61, 57), 62, 63, 64].

(23) When N=128, the sequence is a Q sequence, and the Q sequence may include 17 subsequences whose element locations are changeable. A value of n ranges from 1 to 17. The sequence may be:

[1, 2 $L_1^{(m=3)}$, 17, $L_2^{(m=20)}$, $L_3^{(m=6)}$, 22 $L_4^{(m=11)}$, $L_5^{(m=12)}$, 77, $L_6^{(m=7)}$, $L_7^{(m=7)}$, 52 $L_8^{(m=4)}$, $L_9^{(m=15)}$, $L_{10}^{(m=4)}$, $L_{11}^{(m=3)}$, $L_{12}^{(m=2)}$, $L_{13}^{(m=2)}$, $L_{14}^{(m=3)}$, $L_{15}^{(m=4)}$, $L_{16}^{(m=2)}$, 110, 116, 111, 118 $L_{17}^{(m=6)}$, 112, 120, 124, 126, 127, 128].

In a possible example $L_n^{(m)}$ may be as follows: $L_1^{(m=3)}$=(5, 9, 3); $L_2^{(m=20)}$=(33, 7, 65, 4, 13, 6, 19, 10, 34, 18, 11, 21, 35, 25, 66, 8, 37, 67, 12, 41); $L_3^{(m=6)}$=(20, 14, 69, 49, 15, 73); $L_4^{(m=11)}$=(27, 36, 81, 39, 23, 38, 26, 97, 68, 42, 29); $L_5^{(m=12)}$=(70, 50, 75, 43, 71, 45, 82, 16, 51, 74, 24, 53); $L_6^{(m=7)}$=(83, 57, 28, 98, 40, 85, 30); $L_7^{(m=7)}$=(44, 99, 31, 89, 72, 46, 101); $L_8^{(m=4)}$=(47, 76, 105, 54); $L_9^{(m=15)}$=(78, 55, 84, 58, 113, 86, 79, 59, 100, 87, 61, 90, 102, 91, 32); $L_{10}^{(m=4)}$=(103, 106, 48, 93); $L_{11}^{(m=3)}$=(107, 56, 114); $L_{12}^{(m=2)}$=(80, 109); $L_{13}^{(m=2)}$=(60, 115); $L_{14}^{(m=3)}$=(88, 62, 117); $L_{15}^{(m=4)}$=(92, 63, 121, 104); $L_{16}^{(m=2)}$=(108, 95); and $L_{17}^{(m=6)}$=(119, 122, 123, 64, 125, 96).

In this example, the Q sequence is specifically: [1, 2, (5, 9, 3), 17, (33, 7, 65, 4, 13, 6, 19, 10, 34, 18, 11, 21, 35, 25, 66, 8, 37, 67, 12, 41), (20, 14, 69, 49, 15, 73), 22, (27, 36, 81, 39, 23, 38, 26, 97, 68, 42, 29), (70, 50, 75, 43, 71, 45, 82, 16, 51, 74, 24, 53), 77, (83, 57, 28, 98, 40, 85, 30), (44, 99, 31, 89, 72, 46, 101), 52, (47, 76, 105, 54), (78, 55, 84, 58, 113, 86, 79, 59, 100, 87, 61, 90, 102, 91, 32), (103, 106, 48, 93), (107, 56, 114), (80, 109), (60, 115), (88, 62, 117), (92, 63, 121, 104), 94, (108, 95), 110, 116, 111, 118, (119, 122, 123, 64, 125, 96), 112, 120, 124, 126, 127, 128].

(34) When N=128, the sequence is a Z sequence, and the Z sequence may include one (n=1) subsequence whose element locations are changeable. The sequence may be:

[1, 2, $L_1^{(m=123)}$, 126, 127, 128].

In a possible example, $L_n^{(m)}$ may be as follows: $L_1^{(m=123)}$=(5, 10, 3, 12, 8, 22, 4, 14, 25, 11, 28, 31, 52, 6, 16, 13, 27, 18, 33, 38, 55, 20, 40, 34, 60, 44, 64, 67, 91, 7, 15, 19, 35, 23, 39, 37, 62, 26, 43, 48, 65, 50, 70, 73, 94, 30, 46, 53, 72, 56, 76, 78, 97, 59, 80, 84, 101, 87, 104, 107, 120, 9, 21, 24, 42, 29, 45, 49, 69, 32, 54, 47, 74, 57, 77, 83, 99, 36, 51, 58, 79, 63, 82, 86, 103, 68, 88, 90, 106, 95, 110, 112, 122, 41, 61, 66, 85, 71, 89, 92, 109, 75, 93, 96, 111, 100, 113, 115, 123, 81, 98, 102, 114, 105, 116, 117, 124, 108, 118, 119, 125, 121).

In this example, the Z sequence is specifically: [1, 2, (5, 10, 3, 12, 8, 22, 4, 14, 17, 25, 11, 28, 31, 52, 6, 16, 13, 27, 18, 33, 38, 55, 20, 40, 34, 60, 44, 64, 67, 91, 7, 15, 19, 35, 23, 39, 37, 62, 26, 43, 48, 65, 50, 70, 73, 94, 30, 46, 53, 72, 56, 76, 78, 97, 59, 80, 84, 101, 87, 104, 107, 120, 9, 21, 24, 42, 29, 45, 49, 69, 32, 54, 47, 74, 57, 77, 83, 99, 36, 51, 58, 79, 63, 82, 86, 103, 68, 88, 90, 106, 95, 110, 112, 122, 41, 61, 66, 85, 71, 89, 92, 109, 75, 93, 96, 111, 100, 113, 115, 123, 81, 98, 102, 114, 105, 116, 117, 124, 108, 118, 119, 125, 121), 126, 127, 128].

(25) When N=256, the sequence is a Q sequence, and the Q sequence may include nine subsequences whose element locations are changeable. A value of n ranges from 1 to 9. The sequence may be:

[1, 2, $L_1^{(m=3)}$, 17, $L_2^{(m=209)}$, $L_3^{(m=14)}$, $L_4^{(m=3)}$, $L_5^{(m=4)}$, 222, $L_6^{(m=2)}$, $L_7^{(m=5)}$, $L_8^{(m=4)}$, $L_9^{(m=2)}$, 240, 248, 252, 254, 255, 256].

In a possible example, may be as follows: $L_1^{(m=3)}$=(5, 9, 3); $L_2^{(m=209)}$=(33, 7, 65, 4, 13, 6, 19, 129, 10, 34, 18, 11, 21, 35, 25, 66, 8, 37, 67, 130, 12, 41, 20, 133, 14, 69, 49, 15, 73, 22, 131, 27, 36, 81, 137, 39, 23, 38, 26, 97, 68, 42, 145, 29, 70, 50, 75, 161, 43, 193, 71, 45, 132, 82, 16, 51, 135, 74, 24, 53, 134, 77, 83, 138, 57, 28, 98, 40, 139, 85, 30, 146, 44, 99, 141, 31, 89, 147, 72, 162, 46, 101, 149, 52, 47, 76, 105, 165, 194, 54, 163, 78, 153, 55, 84, 58, 113, 86, 136, 195, 79, 59, 169, 100, 140, 197, 87, 177, 61, 90, 102, 148, 142, 143, 91, 201, 32, 103, 106, 150, 48, 93, 209, 164, 154, 151, 107, 56, 166, 114, 155, 80, 225, 167, 109, 60, 115, 196, 170, 157, 88, 62, 117, 171, 198, 178, 92, 202, 199, 63, 144, 173, 121, 104, 179, 203, 94, 152, 210, 181, 108, 95, 205, 156, 110, 211, 185, 116, 168, 158, 226, 111, 213, 118, 172, 227, 159, 217, 119, 174, 122, 200, 180, 229, 175, 123, 64, 233, 204, 182, 125, 206, 241, 183, 212, 96, 186, 207, 187, 214, 228, 112, 215, 189, 218, 160, 120, 230, 219); $L_3^{(m=14)}$=(231, 176, 124, 234, 221, 126, 235, 184, 242, 188, 208, 237, 127, 243); $L_4^{(m=3)}$=(216, 245, 190); $L_5^{(m=4)}$=(220, 249, 191, 232); $L_6^{(m=2)}$=(236, 223); $L_7^{(m=5)}$=(238, 244, 239, 246, 128); $L_8^{(m=4)}$=(247, 250, 251, 192); and $L_9^{(m=2)}$=(253, 224).

In this example, the Q sequence is specifically: [1, 2, (5, 9, 3), 17, (33, 7, 65, 4, 13, 6, 19, 129, 10, 34, 18, 11, 21, 35, 25, 66, 8, 37, 67, 130, 12, 41, 20, 133, 14, 69, 49, 15, 73, 22, 131, 27, 36, 81, 137, 39, 23, 38, 26, 97, 68, 42, 145, 29, 70, 50, 75, 161, 43, 193, 71, 45, 132, 82, 16, 51, 135, 74, 24, 53, 134, 77, 83, 138, 57, 28, 98, 40, 139, 85, 30, 146, 44, 99, 141, 31, 89, 147, 72, 162, 46, 101, 149, 52, 47, 76, 105, 165, 194, 54, 163, 78, 153, 55, 84, 58, 113, 86, 136, 195, 79, 59, 169, 100, 140, 197, 87, 177, 61, 90, 102, 148, 142, 143, 91, 201, 32, 103, 106, 150, 48, 93, 209, 164, 154, 151, 107, 56, 166, 114, 155, 80, 225, 167, 109, 60, 115, 196, 170, 157, 88, 62, 117, 171, 198, 178, 92, 202, 199, 63, 144, 173, 121, 104, 179, 203, 94, 152, 210, 181, 108, 95, 205, 156, 110, 211, 185, 116, 168, 158, 226, 111, 213, 118, 172, 227, 159, 217, 119, 174, 122, 200, 180, 229, 175, 123, 64, 233, 204, 182, 125, 206, 241, 183, 212, 96, 186, 207, 187, 214, 228, 112, 215, 189, 218, 160, 120, 230, 219), (231, 176, 124, 234, 221, 126, 235, 184, 242, 188, 208, 237, 127, 243), (216, 245, 190), (220, 249, 191, 232), 222, (236, 223), (238, 244, 239, 246, 128), (247, 250, 251, 192), (253, 224), 240, 248, 252, 254, 255, 256].

(26) When N=256, the sequence is a Z sequence, and the Z sequence may include one (n=1) subsequence whose element locations are changeable. The sequence may be:

[1, 2, $L_1^{(m=251)}$, 254, 255, 256].

In a possible example, $L_n^{(m)}$ may be as follows: $L_1^{(m=251)}$=(5, 10, 3, 12, 8, 23, 4, 15, 27, 11, 31, 34, 61, 6, 17, 13, 29, 19, 36, 43, 65, 21, 45, 38, 72, 50, 77, 82, 123, 7, 16, 20, 39, 24, 44, 42, 74, 28, 48, 55, 79, 58, 87, 91, 127, 33, 52, 62, 90, 66, 96, 100, 134, 71, 102, 108, 142, 115, 148, 156, 193, 9, 22, 25, 47, 32, 51, 57, 85, 35, 64, 53, 92, 68, 98, 107, 138, 40, 60, 69, 101, 76, 104, 113, 147, 83, 116, 121, 153, 128, 163, 168, 202, 46, 73, 80, 110, 88, 117, 124, 160, 93, 125, 133, 167, 141, 171, 178, 208, 103, 136, 143, 174, 149, 180, 185, 213, 159, 187, 192, 218, 197, 221, 228, 244, 14, 26, 37, 59, 30, 67, 63, 105, 41, 70, 75, 111, 81, 119, 120, 157, 49, 78, 84, 118, 89, 126, 132, 164, 99, 131, 137, 170, 146, 176, 183, 212, 54, 86, 97, 130, 94, 135, 140, 175, 109, 145, 150, 181, 158, 186, 191, 217, 114, 152, 161, 189, 166, 196, 200, 223, 173, 203, 205, 225, 210, 232, 235, 248, 56, 95, 106, 144, 112, 151, 155, 188, 122, 154, 162, 195, 169, 198, 204, 226, 129, 165, 172, 201, 179, 206, 209, 230, 184, 211, 215, 233, 220, 237, 239, 250, 139, 177, 182, 207, 190, 214, 216, 236, 194, 219, 222, 238, 227, 240, 242, 251, 199, 224, 229, 241, 231, 243, 245, 252, 234, 246, 247, 253, 249).

In this example, the Z sequence is specifically: [1, 2, (5, 10, 3, 12, 8, 23, 4, 15, 18, 27, 11, 31, 34, 61, 6, 17, 13, 29, 19, 36, 43, 65, 21, 45, 38, 72, 50, 77, 82, 123, 7, 16, 20, 39, 24, 44, 42, 74, 28, 48, 55, 79, 58, 87, 91, 127, 33, 52, 62, 90, 66, 96, 100, 134, 71, 102, 108, 142, 115, 148, 156, 193, 9, 22, 25, 47, 32, 51, 57, 85, 35, 64, 53, 92, 68, 98, 107, 138, 40, 60, 69, 101, 76, 104, 113, 147, 83, 116, 121, 153, 128, 163, 168, 202, 46, 73, 80, 110, 88, 117, 124, 160, 93, 125, 133, 167, 141, 171, 178, 208, 103, 136, 143, 174, 149, 180, 185, 213, 159, 187, 192, 218, 197, 221, 228, 244, 14, 26, 37, 59, 30, 67, 63, 105, 41, 70, 75, 111, 81, 119, 120, 157, 49, 78, 84, 118, 89, 126, 132, 164, 99, 131, 137, 170, 146, 176, 183, 212, 54, 86, 97, 130, 94, 135, 140, 175, 109, 145, 150, 181, 158, 186, 191, 217, 114, 152, 161, 189, 166, 196, 200, 223, 173, 203, 205, 225, 210, 232, 235, 248, 56, 95, 106, 144, 112, 151, 155, 188, 122, 154, 162, 195, 169, 198, 204, 226, 129, 165, 172, 201, 179, 206, 209, 230, 184, 211, 215, 233, 220, 237, 239, 250, 139, 177, 182, 207, 190, 214, 216, 236, 194, 219, 222, 238, 227, 240, 242, 251, 199, 224, 229, 241, 231, 243, 245, 252, 234, 246, 247, 253, 249), 254, 255, 256].

(27) When N=512, the sequence is a Q sequence, and the Q sequence may include four subsequences whose element locations are changeable. A value of n ranges from 1 to 4. The sequence may be:

[1, 2, $L_1^{(m=3)}$, 17, $L_2^{(m=469)}$, $L_3^{(m=31)}$, $L_4^{(m=2)}$, 508, 510, 511, 512].

In a possible example, $L_n^{(m)}$ may be as follows: $L_1^{(m=3)}$=(5, 9, 3); $L_2^{(m=469)}$=(33, 7, 65, 4, 13, 6, 19, 129, 10, 34, 18, 11, 257, 21, 35, 25, 66, 8, 37, 67, 130, 12, 41, 20, 133, 14, 69, 49, 15, 73, 258, 22, 131, 27, 36, 81, 259, 137, 39, 23, 261, 38, 26, 97, 68, 265, 42, 145, 29, 70, 50, 75, 161, 43, 273, 193, 71, 45, 132, 82, 16, 289, 51, 135, 74, 24, 53, 321, 134, 77, 83, 138, 57, 28, 260, 98, 40, 385, 139, 85, 30, 262, 146, 44, 99, 141, 31, 89, 263, 147, 72, 266, 162, 46, 101, 149, 52, 47, 76, 267, 105, 274, 165, 194, 54, 163, 269, 78, 153, 275, 55, 84, 58, 113, 86, 136, 290, 195, 79, 291, 59, 277, 169, 100, 140, 197, 87, 177, 61, 90, 281, 102, 148, 293, 142, 322, 143, 91, 201, 32, 103, 264, 106, 323, 150, 297, 48, 93, 209, 268, 386, 325, 305, 164, 154, 151, 107, 56, 166, 387, 329, 270, 114, 155, 80, 225, 167, 276, 109, 271, 60, 115, 196, 170, 157, 88, 62, 278, 292, 279, 117, 171, 198, 178, 282, 92, 202, 389, 294, 199, 63, 144, 337, 173, 283, 121, 104, 179, 295, 203, 94, 324, 393, 298, 152, 210, 285, 181, 108, 95, 205, 299, 353, 326, 156, 110, 401, 306, 301, 211, 185, 327, 116, 168, 158, 226, 307, 330, 111, 213, 118, 172, 331, 227, 388, 309, 159, 417, 338, 217, 272, 119, 280, 333, 390, 174, 122, 200, 180, 229, 339, 313, 391, 175, 394, 284, 123, 64, 341, 449, 354, 395, 233, 204, 296, 286, 182, 125, 206, 241, 287, 300, 355, 183, 402, 212, 397, 345, 96, 186, 207, 328, 403, 187, 357, 308, 419, 214, 302, 228, 303, 361, 112, 418, 215, 405, 310, 189, 450, 332, 218, 160, 120, 230, 334, 409, 311, 421, 219, 369, 231, 392, 176, 314, 340, 335, 124, 234, 315, 342, 451, 221, 425, 356, 126, 235, 184, 396, 242, 317, 343, 346, 404, 288, 398, 453, 433, 188, 358, 208, 237, 347, 362, 127, 243, 406, 216, 399, 304, 359, 420, 457, 349, 245, 190, 220, 312, 363, 465, 407, 422, 249, 191, 370, 410, 411, 481, 232, 316, 365, 423, 336, 371, 222, 452, 426, 413, 454, 318, 236, 344, 373, 223, 427, 434, 238, 348, 244, 455, 319, 377, 429, 239, 360, 459, 400, 435, 458, 246, 350, 128, 408, 437, 364, 466, 351, 247, 250, 461, 412, 366, 441, 375, 424, 467, 251, 372, 192, 482, 414, 367, 469, 374, 428, 415, 253, 483, 430, 224, 456, 473, 378, 436, 320, 485, 431, 489, 460, 240, 379, 438, 462, 381, 248, 442, 352, 470, 439, 463, 252, 497, 468, 368, 443, 475, 484, 380, 416, 254, 445, 486, 471, 376, 474, 432, 487, 490, 255, 477); $L_3^{(m=31)}$=(440, 493, 382, 499, 464, 491, 383, 472, 498, 444, 501, 446, 447, 476, 488, 478, 494, 505, 256, 492, 479, 384, 500, 503, 495, 502, 448, 506, 507, 480, 509); and $L_4^{(m=2)}$=(504, 496).

In this example, the Q sequence is specifically: [1, 43, 273, 193, 71, 45, 132, 82, 16, 289, 51, 135, 74, 24, 53, 321, 134, 77, 83, 138, 57, 28, 260, 98, 40, 385, 139, 85, 30, 262, 146, 44, 99, 141, 31, 89, 263, 147, 72, 266, 162, 46, 101, 149, 52, 47, 76, 267, 105, 274, 165, 194, 54, 163, 269, 78, 153, 275, 55, 84, 58, 113, 86, 136, 290, 195, 79, 291, 59, 277, 169, 100, 140, 197, 87, 177, 61, 90, 281, 102, 148, 293, 142, 322, 143, 91, 201, 32, 103, 264, 106, 323, 150, 297, 48, 93, 209, 268, 386, 325, 305, 164, 154, 151, 107, 56, 166, 387, 329, 270, 114, 155, 80, 225, 167, 276, 109, 271, 60, 115, 196, 170, 157, 88, 62, 278, 292, 279, 117, 171, 198, 178, 282, 92, 202, 389, 294, 199, 63, 144, 337, 173, 121, 104, 179, 295, 203, 94, 324, 393, 298, 152, 210, 285, 181, 108, 95, 205, 299, 353, 326, 156, 110, 401, 306, 301, 211, 185, 327, 116, 168, 158, 226, 307, 330, 111, 213, 118, 172, 331, 227, 388, 309, 159, 417, 338, 217, 272, 119, 280, 333, 390, 174, 122, 200, 180, 229, 339, 313, 391, 175, 394, 123, 64, 341, 449, 354, 395, 233, 204, 296, 286, 182, 125, 206, 241, 287, 300, 355, 183, 402, 212, 397, 345, 96, 186, 207, 328, 403, 187, 357, 308, 419, 214, 302, 228, 303, 361, 112, 418, 215, 405, 310, 189, 450, 332, 218, 160, 120, 230, 334, 409, 311, 421, 219, 369, 231, 392, 176, 314, 340, 335, 124, 234, 315, 342, 451, 221, 425, 356, 126, 235, 184, 396, 242, 317, 343, 346, 404, 288, 398, 453, 433, 188, 358, 208, 237, 347, 362, 127, 243, 406, 216, 399, 304, 359, 420, 457, 349, 245, 190, 220, 312, 363, 465, 407, 422, 249, 191, 370, 410, 411, 481, 232, 316, 365, 423, 336, 371, 222, 452, 426, 413, 454, 318, 236, 344, 373, 223, 427, 434, 238, 348, 244, 455, 319, 377, 429, 239, 360, 459, 400, 435, 458, 246, 350, 128, 408, 437, 364, 466, 351, 247, 250, 461, 412, 366, 441, 375, 424, 467, 251, 372, 192, 482, 414, 367, 469, 374, 428, 415, 253, 483, 430, 224, 456, 473, 378, 436, 320, 485, 431, 489, 460, 240, 379, 438, 462, 381, 248, 442, 352, 470, 439, 463, 252, 497, 468, 368, 443, 475, 484, 380, 416, 254, 445, 486, 471, 376, 474, 432, 487, 490, 255, 477), (440, 493, 382, 499, 464, 491, 383, 472, 498, 444, 501, 446, 447, 476, 488, 478, 494, 505, 256, 492, 479, 384, 500, 503, 495, 502, 448, 506, 507, 480, 509), (504, 496), 508, 510, 511, 512].

(28) When N=512, the sequence is a Z sequence, and the Z sequence may include one (n=1) subsequence whose element locations are changeable. The sequence may be: [1, 2, $L_1^{(m=507)}$, 510, 511, 512].

In a possible example, $L_n^{(m)}$ may be as follows: $L_1^{(m=507)}$=(5, 10, 3, 12, 8, 24, 4, 15, 18, 28, 11, 32, 35, 67, 6, 17, 13, 30, 20, 38, 46, 72, 22, 49, 40, 80, 55, 87, 93, 146, 7, 16, 21, 41, 25, 48, 45, 83, 29, 53, 60, 90, 64, 100, 104, 153, 34, 57, 69, 103, 73, 111, 117, 164, 79, 119, 127, 177, 135, 183, 197, 264, 9, 23, 26, 51, 33, 56, 63, 97, 36, 71, 58, 105, 76, 114, 125, 171, 42, 66, 77, 118, 86, 121, 133, 182, 94, 136, 144, 192, 154, 207, 216, 285, 50, 82, 91, 130, 101, 138, 147, 203, 107, 149, 163, 215, 175, 222, 235, 299, 120, 169, 178, 229, 187, 237, 248, 309, 202, 253, 263, 323, 274, 331, 350, 407, 14, 27, 39, 65, 31, 75, 70, 122, 44, 78, 85, 131, 92, 141, 143, 198, 54, 89, 96, 139, 102, 151, 162, 211, 115, 161, 170, 221, 181, 231, 243, 308, 59, 99, 112, 160, 109, 165, 173, 230, 129, 180, 188, 238, 200, 252, 260, 319, 134, 190, 204, 255, 214, 273, 280, 333, 227, 286, 290, 344, 304, 361, 369, 424, 62, 110, 124, 179, 132, 189, 196, 254, 145, 193, 206, 270, 217, 275, 287, 346, 155, 212, 226, 282, 236, 294, 301, 353, 246, 307, 315, 362, 328, 380, 389, 435, 172, 232, 240, 296, 256, 310, 317, 374, 269, 324, 332, 386, 347, 392, 399, 445, 276, 335, 351, 394, 360, 405, 413, 450, 368, 414, 422, 456, 432, 465, 474, 494, 19, 37, 43, 81, 47, 88, 95, 148, 52, 98, 106, 156, 113, 168, 176, 247, 61, 108, 116, 174, 128, 184, 186, 249, 137, 191, 201, 262, 213, 272, 277, 340, 68, 123, 126, 185, 140, 195, 205, 271, 152, 210, 218, 278, 225, 295, 297, 355, 159, 224, 233, 292, 242, 303, 313, 363, 258, 320, 325, 336, 385, 396, 440, 74, 142, 150, 208, 158, 220, 228, 288, 167, 234, 239, 306, 250, 311, 322, 378, 199, 245, 257, 321, 265, 326, 337, 387, 284, 338, 348, 393, 359, 406, 412, 452, 219, 267, 279, 330, 291, 345, 400, 298, 349, 364, 410, 376, 417, 427, 459, 316, 370, 379, 423, 388, 429, 419, 469, 397, 438, 446, 463, 449, 478, 482, 497, 84, 157, 166, 241, 194, 251, 259, 318, 209, 261, 268, 334, 283, 341, 354, 402, 223, 281, 289, 339, 302, 352, 366, 408, 312, 371, 372, 416, 383, 426, 431, 464, 244, 300, 293, 314, 367, 377, 420, 329, 382, 390, 430, 398, 434, 442, 471, 343, 391, 403, 439, 409, 447, 454, 476, 418, 451, 460, 485, 466, 487, 488, 502, 266, 305, 327, 381, 342, 384, 395, 436, 404, 401, 444, 415, 448, 455, 480, 365, 411, 421, 458, 428, 453, 468, 483, 437, 470, 461, 489, 475, 491, 496, 505, 373, 425, 433, 462, 441, 467, 472, 490, 443, 473, 481, 495, 477, 492, 500, 508, 457, 484, 479, 498, 486, 501, 499, 507, 493, 503, 504, 509, 506).

In this example, the Z sequence is specifically: [1, 2, (5, 10, 3, 12, 8, 24, 4, 15, 18, 28, 11, 32, 35, 67, 6, 17, 13, 30, 20, 38, 46, 72, 22, 49, 40, 80, 55, 87, 93, 146, 7, 16, 21, 41, 25, 48, 45, 83, 29, 53, 60, 90, 64, 100, 104, 153, 34, 57, 69, 103, 73, 111, 117, 164, 79, 119, 127, 177, 135, 183, 197, 264, 9, 23, 26, 51, 33, 56, 63, 97, 36, 71, 58, 105, 76, 114, 125, 171, 42, 66, 77, 118, 86, 121, 133, 182, 94, 136, 144, 192, 154, 207, 216, 285, 50, 82, 91, 130, 101, 138, 147, 203, 107, 149, 163, 215, 175, 222, 235, 299, 120, 169, 178, 229, 187, 237, 248, 309, 202, 253, 263, 323, 274, 331, 350, 407, 14, 27, 39, 65, 31, 75, 70, 122, 44, 78, 85, 131, 92, 141, 143, 198, 54, 89, 96, 139, 102, 151, 162, 211, 115, 161, 170, 221, 181, 231, 243, 308, 59, 99, 112, 160, 109, 165, 173, 230, 129, 180, 188, 238, 200, 252, 260, 319, 134, 190, 204, 255, 214, 273, 280, 333, 227, 286, 290, 344, 304, 361, 369, 424, 62, 110, 124, 179, 132, 189, 196, 254, 145, 193, 206, 270, 217, 275, 287, 346, 155, 212, 226, 282, 236, 294, 301, 353, 246, 307, 315, 362, 328, 380, 389, 435, 172, 232, 240, 296, 256, 310, 317, 374, 269, 324, 332, 386, 347, 392, 399, 445, 276, 335, 351, 394, 360, 405, 413, 450, 368, 414, 422, 456, 432, 465, 474, 494, 19, 37, 43, 81, 47, 88, 95, 148, 52, 98, 106, 156, 113, 168, 176, 247, 61, 108, 116, 174, 128, 184, 186, 249, 137, 191, 201, 262, 213, 272, 277, 340, 68, 123, 126, 185, 140, 195, 205, 271, 152, 210, 218, 278, 225, 295, 297, 355, 159, 224, 233, 292, 242, 303, 313, 363, 258, 320, 325, 375, 336, 385, 396, 440, 74, 142, 150, 208, 158, 220, 228, 288, 167, 234, 239, 306, 250, 311, 322, 378, 199, 245, 257, 321, 265, 326, 337, 387, 284, 338, 348, 393, 359, 406, 412, 452, 219, 267, 279, 330, 291, 345, 356, 400, 298, 349, 364, 410, 376, 417, 427, 459, 316, 370, 379, 423, 388, 429, 419, 469, 397, 438, 446, 463, 449, 478, 482, 497, 84, 157, 166, 241, 194, 251, 259, 318, 209, 261, 268, 334, 283, 341, 354, 402, 223, 281, 289, 339, 302, 352, 366, 408, 312, 371, 372, 416, 383, 426, 431, 464, 244, 300, 293, 314, 367, 377, 420, 329, 382, 390, 430, 398, 434, 442, 471, 343, 391, 403, 439, 409, 447, 454, 476, 418, 451, 460, 485, 466, 487, 488, 502, 266, 305, 327, 381, 342, 384, 395, 436, 358, 404, 401, 444, 415, 448, 455, 480, 365, 411, 421, 458, 428, 453, 468, 483, 437, 470, 461, 489, 475, 491, 496, 505, 373, 425, 433, 462, 441, 467, 472, 490, 443, 473, 481, 495, 477, 492, 500, 508, 457, 484, 479, 498, 486, 501, 499, 507, 493, 503, 504, 509, 506), 510, 511, 512].

(29) When N=1024, the sequence is a Q sequence, and the Q sequence may include three (n=3) subsequences whose element locations are changeable. The sequence may be:

[1, 2, $L_1^{(m=3)}$, 17 $L_2^{(m=1012)}$, $L_3^{(m=2)}$, 1020, 1022, 1023, 1024].

In a possible example, $L_n^{(m)}$ may be as follows: $L_1^{(m=3)}$=(5, 9, 3); $L_2^{(m=1012)}$=(33, 7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 846, 921, 472, 823, 852, 731, 498, 881, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 984, 1010, 956, 988, 1013, 959, 1000, 1006, 990, 1017, 991, 1012, 768, 1004, 1015, 1007, 1018, 1014, 992, 1019, 960, 1021); and $L_3^{(m=2)}=(1016, 1008)$.

In this example, the Q sequence is specifically: [1, 2, (5, 9, 3), 17, (33, 7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 779, 564, 404, 288, 398, 453, 675, 559, 786, 433, 188, 358, 208, 665, 588, 781, 706, 677, 237, 566, 362, 127, 243, 590, 406, 216, 399, 567, 304, 598, 359, 802, 420, 625, 457, 787, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021), (1016, 1008), 1020, 1022, 1023, 1024].

(30) When N=1024, the sequence is a Z sequence, and the Z sequence may include one (n=1) subsequence whose element locations are changeable. The sequence may be: [1, 2, $L_1^{(m=1019)}$, 1022, 1023, 1024].

In a possible example, $L_n^{(m)}$ may be as follows: $L_1^{(m=1019)}$=(5, 11, 3, 13, 8, 25, 4, 16, 19, 29, 12, 34, 37, 71, 6, 18, 14, 31, 21, 40, 48, 77, 23, 52, 42, 85, 58, 93, 100, 162, 7, 17, 22, 43, 26, 51, 47, 89, 30, 56, 63, 97, 68, 108, 112, 170, 36, 60, 73, 111, 78, 120, 127, 185, 84, 130, 139, 201, 149, 208, 226, 323, 9, 24, 27, 54, 35, 59, 67, 104, 38, 75, 61, 114, 81, 124, 137, 194, 44, 70, 82, 129, 92, 132, 146, 206, 101, 150, 159, 219, 172, 239, 251, 356, 53, 88, 98, 143, 109, 152, 163, 234, 116, 165, 184, 250, 198, 259, 277, 378, 131, 192, 202, 269, 213, 280, 296, 395, 232, 303, 319, 416, 339, 431, 464, 574, 15, 28, 41, 69, 32, 80, 74, 133, 46, 83, 91, 144, 99, 156, 158, 227, 57, 95, 103, 153, 110, 168, 183, 244, 125, 182, 193, 258, 205, 272, 288, 390, 62, 107, 122, 181, 118, 186, 196, 270, 141, 204, 214, 281, 230, 301, 314, 411, 147, 217, 235, 306, 248, 338, 348, 433, 266, 357, 364, 452, 386, 482, 498, 613, 66, 119, 136, 203, 145, 215, 224, 304, 160, 221, 238, 332, 252, 340, 358, 454, 173, 246, 265, 350, 279, 371, 383, 468, 293, 389, 406, 484, 426, 518, 536, 641, 195, 273, 284, 373, 307, 396, 408, 508, 331, 419, 432, 530, 460, 542, 557, 667, 341, 435, 465, 547, 480, 570, 588, 681, 496, 590, 609, 698, 633, 727, 757, 844, 20, 39, 45, 86, 49, 94, 102, 164, 55, 106, 115, 174, 123, 191, 200, 294, 65, 117, 126, 197, 140, 209, 212, 297, 151, 218, 231, 317, 247, 337, 345, 445, 72, 134, 138, 210, 154, 223, 236, 336, 169, 243, 254, 346, 263, 372, 374, 471, 177, 262, 274, 368, 287, 385, 403, 486, 311, 412, 420, 510, 439, 528, 551, 654, 79, 157, 167, 240, 176, 256, 267, 359, 189, 276, 283, 388, 299, 397, 415, 514, 228, 291, 309, 413, 324, 423, 440, 532, 352, 441, 461, 545, 479, 572, 585, 687, 255, 328, 347, 428, 365, 453, 473, 559, 377, 463, 488, 581, 512, 597, 621, 708, 407, 500, 516, 611, 534, 625, 601, 740, 553, 648, 670, 720, 678, 772, 791, 849, 90, 175, 187, 286, 222, 300, 313, 410, 242, 316, 330, 434, 351, 446, 469, 563, 261, 349, 362, 444, 384, 467, 492, 577, 398, 502, 504, 595, 524, 618, 630, 723, 290, 381, 370, 475, 404, 494, 513, 604, 427, 522, 538, 628, 555, 638, 659, 747, 451, 540, 566, 651, 579, 673, 693, 765, 599, 684, 711, 802, 730, 807, 814, 878, 326, 387, 425, 520, 447, 526, 549, 643, 477, 568, 561, 664, 592, 675, 695, 783, 490, 583, 606, 705, 623, 690, 737, 795, 646, 743, 714, 817, 761, 831, 848, 899, 506, 616, 635, 717, 656, 733, 750, 822, 662, 754, 787, 847, 769, 836, 871, 938, 701, 799, 776, 858, 806, 875, 866, 929, 837, 884, 894, 949, 920, 961, 975, 993, 10, 33, 76, 121, 50, 135, 105, 211, 64, 155, 171, 225, 128, 249, 257, 333, 87, 166, 142, 237, 180, 260, 292, 361, 178, 298, 268, 382, 312, 399, 414, 533, 96, 161, 207, 275, 190, 295, 282, 393, 220, 308, 321, 417, 335, 436, 449, 541, 241, 327, 344, 443, 355, 462, 470, 567, 367, 481, 499, 587, 509, 614, 626, 738, 113, 188, 199, 302, 245, 315, 334, 430, 229, 343, 353, 456, 366, 466, 483, 580, 271, 363, 376, 489, 392, 472, 497, 600, 405, 521, 531, 619, 552, 649, 660, 759, 289, 391, 401, 519, 422, 507, 537, 634, 438, 544, 571, 650, 582, 669, 685, 774, 476, 562, 591, 680, 603, 691, 713, 788, 636, 706, 729, 810, 745, 820, 842, 915, 148, 216, 264, 342, 233, 360, 369, 485, 285, 379, 394, 501, 409, 525, 535, 627, 310, 402, 421, 511, 437, 554, 564, 652, 455, 550, 578, 666, 602, 694, 709, 780, 320, 429, 448, 558, 459, 565, 586, 677, 493, 589, 617, 697, 631, 715, 735, 804, 515, 615, 642, 718, 657, 731, 748, 823, 674, 762, 771, 835, 790, 855, 872, 931, 325, 458, 487, 593, 505, 612, 624, 719, 529, 622, 644, 739, 661, 758, 770, 833, 548, 653, 672, 752, 688, 763, 784, 853, 704, 789, 798, 860, 813, 879, 889, 942, 584, 676, 696, 778, 726, 792, 801, 868, 732, 811, 824, 886, 838, 895, 904, 951, 751, 826, 843, 898, 859, 908, 916, 956, 869, 919, 928, 966, 937, 976, 985, 1008, 179, 253, 278, 380, 318, 400, 418, 539, 305, 424, 442, 556, 457, 575, 596, 689, 322, 450, 478, 573, 495, 598, 610, 710, 517, 620, 639, 722, 655, 746, 753, 834, 329, 474, 491, 608, 523, 637, 629, 734, 546, 647, 663, 749, 679, 773, 775, 851, 569, 668, 692, 703, 782, 796, 861, 724, 805, 812, 880, 825, 890, 901, 948, 354, 527, 503, 645, 560, 671, 665, 594, 683, 699, 786, 712, 793, 809, 876, 607, 700, 716, 797, 744, 818, 827, 887, 755, 828, 840, 897, 857, 911, 918, 962, 640, 721, 741, 819, 768, 846, 854, 905, 777, 841, 863, 913, 874, 923, 934, 969, 800, 870, 881, 930, 893, 940, 925, 980, 902, 946, 954, 973, 957, 989, 995, 1013, 375, 576, 543, 682, 605, 702, 707, 803, 632, 728, 736, 821, 756, 832, 850, 907, 658, 742, 764, 829, 781, 852, 865, 914, 794, 873, 862, 922, 888, 933, 939, 974, 686, 779, 760, 856, 808, 867, 882, 926, 816, 885, 892, 943, 903, 936, 950, 982, 839, 896, 909, 947, 917, 955, 964, 987, 924, 960, 970, 998, 977, 991, 1001, 1017, 725, 785, 815, 883, 830, 891, 900, 945, 845, 910, 906, 958, 921, 952, 965, 992, 864, 912, 927, 968, 935, 963, 979, 996, 944, 981, 971, 999, 986, 1004, 1006, 1015, 877, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018).

In this example, the Z sequence is specifically: [1, 2, (5, 11, 3, 13, 8, 25, 4, 16, 19, 29, 12, 34, 37, 71, 6, 18, 14, 31, 21, 40, 48, 77, 23, 52, 42, 85, 58, 93, 100, 162, 7, 17, 22, 43, 26, 51, 47, 89, 30, 56, 63, 97, 68, 108, 112, 170, 36, 60, 73, 111, 78, 120, 127, 185, 84, 130, 139, 201, 149, 208, 226, 323, 9, 24, 27, 54, 35, 59, 67, 104, 38, 75, 61, 114, 81, 124, 137, 194, 44, 70, 82, 129, 92, 132, 146, 206, 101, 150, 159, 219, 172, 239, 251, 356, 53, 88, 98, 143, 109, 152, 163, 234, 116, 165, 184, 250, 198, 259, 277, 378, 131, 192, 202, 269, 213, 280, 296, 395, 232, 303, 319, 416, 339, 431, 464, 574, 15, 28, 41, 69, 32, 80, 74, 133, 46, 83, 91, 144, 99, 156, 158, 227, 57, 95, 103, 153, 110, 168, 183, 244, 125, 182, 193, 258, 205, 272, 288, 390, 62, 107, 122, 181, 118, 186, 196, 270, 141, 204, 214, 281, 230, 301, 314, 411, 147, 217, 235, 306, 248, 338, 348, 433, 266, 357, 364, 452, 386, 482, 498, 613, 66, 119, 136, 203, 145, 215, 224, 304, 160, 221, 238, 332, 252, 340, 358, 454, 173, 246, 265, 350, 279, 371, 383, 468, 293, 389, 406, 484, 426, 518, 536, 641, 195, 273, 284, 373, 307, 396, 408, 508, 331, 419, 432, 530, 460, 542, 557, 667, 341, 435, 465, 547, 480, 570, 588, 681, 496, 590, 609, 698, 633, 727, 757, 844, 20, 39, 45, 86, 49, 94, 102, 164, 55, 106, 115, 174, 123, 191, 200, 294, 65, 117, 126, 197, 140, 209, 212, 297, 151, 218, 231, 317, 247, 337, 345, 445, 72, 134, 138, 210, 154, 223, 236, 336, 169, 243, 254, 346, 263, 372, 374, 471, 177, 262, 274, 368, 287, 385, 403, 486, 311, 412, 420, 510, 439, 528, 551, 654, 79, 157, 167, 240, 176, 256, 267, 359, 189, 276, 283, 388, 299, 397, 415, 514, 228, 291, 309, 413, 324, 423, 440, 532, 352, 441, 461, 545, 479, 572, 585, 687, 255, 328, 347, 428, 365, 453, 473, 559, 377, 463, 488, 581, 512, 597, 621, 708, 407, 500, 516, 611, 534, 625, 601, 740, 553, 648, 670, 720, 678, 772, 791, 849, 90, 175, 187, 286, 222, 300, 313, 410, 242, 316, 330, 434, 351, 446, 469, 563, 261, 349, 362, 444, 384, 467, 492, 577, 398, 502, 504, 595, 524, 618, 630, 723, 290, 381, 370, 475, 404, 494, 513, 604, 427, 522, 538, 628, 555, 638, 659, 747, 451, 540, 566, 651, 579, 673, 693, 765, 599, 684, 711, 802, 730, 807, 814, 878, 326, 387, 425, 520, 447, 526, 549, 643, 477, 568, 561, 664, 592, 675, 695, 783, 490, 583, 606, 705, 623, 690, 737, 795, 646, 743, 714, 817, 761, 831, 848, 899, 506, 616, 635, 717, 656, 733, 750, 822, 662, 754, 787, 847, 769, 836, 871, 938, 701, 799, 776, 858, 806, 875, 866, 929, 837, 884, 894, 949, 920, 961, 975, 993, 10, 33, 76, 121, 50, 135, 105, 211, 64, 155, 171, 225, 128, 249, 257, 333, 87, 166, 142, 237, 180, 260, 292, 361, 178, 298, 268, 382, 312, 399, 414, 533, 96, 161, 207, 275, 190, 295, 282, 393, 220, 308, 321, 417, 335, 436, 449, 541, 241, 327, 344, 443, 355, 462, 470, 567, 367, 481, 499, 587, 509, 614, 626, 738, 113, 188, 199, 302, 245, 315, 334, 430, 229, 343, 353, 456, 366, 466, 483, 580, 271, 363, 376, 489, 392, 472, 497, 600, 405, 521, 531, 619, 552, 649, 660, 759, 289, 391, 401, 519, 422, 507, 537, 634, 438, 544, 571, 650, 582, 669, 685, 774, 476, 562, 591, 680, 603, 691, 713, 788, 636, 706, 729, 810, 745, 820, 842, 915, 148, 216, 264, 342, 233, 360, 369, 485, 285, 379, 394, 501, 409, 525, 535, 627, 310, 402, 421, 511, 437, 554, 564, 652, 455, 550, 578, 666, 602, 694, 709, 780, 320, 429, 448, 558, 459, 565, 586, 677, 493, 589, 617, 697, 631, 715, 735, 804, 515, 615, 642, 718, 657, 731, 748, 823, 674, 762, 771, 835, 790, 855, 872, 931, 325, 458, 487, 593, 505, 612, 624, 719, 529, 622, 644, 739, 661, 758, 770, 833, 548, 653, 672, 752, 688, 763, 784, 853, 704, 789, 798, 860, 813, 879, 889, 942, 584, 676, 696, 778, 726, 792, 801, 868, 732, 811, 824, 886, 838, 895, 904, 951, 751, 826, 843, 898, 859, 908, 916, 956, 869, 919, 928, 966, 937, 976, 985, 1008, 179, 253, 278, 380, 318, 400, 418, 539, 305, 424, 442, 556, 457, 575, 596, 689, 322, 450, 478, 573, 495, 598, 610, 710, 517, 620, 639, 722, 655, 746, 753, 834, 329, 474, 491, 608, 523, 637, 629, 734, 546, 647, 663, 749, 679, 773, 775, 851, 569, 668, 692, 766, 703, 782, 796, 861, 724, 805, 812, 880, 825, 890, 901, 948, 354, 527, 503, 645, 560, 671, 665, 767, 594, 683, 699, 786, 712, 793, 809, 876, 607, 700, 716, 797, 744, 818, 827, 887, 755, 828, 840, 897, 857, 911, 918, 962, 640, 721, 741, 819, 768, 846, 854, 905, 777, 841, 863, 913, 874, 923, 934, 969, 800, 870, 881, 930, 893, 940, 925, 980, 902, 946, 954, 973, 957, 989, 995, 1013, 375, 576, 543, 682, 605, 702, 707, 803, 632, 728, 736, 821, 756, 832, 850, 907, 658, 742, 764, 829, 781, 852, 865, 914, 794, 873, 862, 922, 888, 933, 939, 974, 686, 779, 760, 856, 808, 867, 882, 926, 816, 885, 892, 943, 903, 936, 950, 982, 839, 896, 909, 947, 917, 955, 964, 987, 924, 960, 970, 998, 977, 991, 1001, 1017, 725, 785, 815, 883, 830, 891, 900, 945, 845, 910, 906, 958, 921, 952, 965, 992, 864, 912, 927, 968, 935, 963, 979, 996, 944, 981, 971, 999, 986, 1004, 1006, 1015, 877, 932, 941, 972, 953, 978, 983, 1002, 959, 984, 994, 1009, 988, 1003, 1011, 1020, 967, 997, 990, 1007, 1000, 1014, 1010, 1019, 1005, 1012, 1016, 1021, 1018), 1022, 1023, 1024].

In the foregoing example sequences, locations of elements in the subsequence $L_n^{(m)}$ may be adjusted in the subsequence. For example, in an example (1) in Example 1, $L_1^{(m=3)}=(5, 9, 3)$, and then locations of elements in a first subsequence $L_1^{(m=3)}$ in the sequence may be adjusted to (5, 3, 9), (3, 5, 9), (3, 9, 5), (5, 9, 3), (9, 3, 5), (9, 5, 3), or the like. A new sequence is obtained after the adjustment. In the foregoing specific sequences, an element set in parentheses represents the foregoing subsequence $L_n^{(m)}$, and locations of elements in the parentheses may be exchanged with each other, but the locations of the elements in the parentheses cannot be exchanged with locations of elements outside the parentheses.

A process of performing polar coding based on a sequence in this embodiment of this application is described below by using an example.

The sequence in this embodiment of this application meets a simple nesting characteristic, that is, another sequence with a relatively short mother code length may be obtained based on a sequence with a relatively long mother code length. Specifically, for example, a sequence with a relatively short mother code length of $N_2$ is obtained based on a sequence with a relatively long mother code length of $N_1$. Elements whose sequence numbers are less than or equal to $N_2$ are extracted from the sequence with the relatively long mother code length of $N_1$, and an obtained subsequence is the sequence with the relatively short mother code length of $N_2$. An order of the elements in the obtained sequence with the relatively short mother code length of $N_2$ is the same as an order of these elements in the sequence with the relatively long mother code length of $N_1$. It is assumed that the to-be-coded bits with a length of K includes information bits with a length of $K_{info}$ and a check bit with a length of $K_{CRC}$, a code length is M, and a mother code length is N, where K=27, $K_{info}$=8, $K_{CRC}$=19, M=60, and N=64. When a parameter is constructed for a polar code, a sequence of N=64 needs to be obtained. It is assumed that the obtained sequence is a Q sequence. The Q sequence in the foregoing example sequences of N=64 may be directly used in this embodiment of this application, or the Q sequence of N=64 may be obtained based on the nesting characteristic from Q sequences of N>64. For example, the Q sequence of N=128 in Example 1 is used. All sequence numbers whose sub-channel sequence numbers are less than or equal to 64 are extracted, and an order of the obtained sequence numbers remains unchanged to form a new sequence of N=64: [1, 2, (5, 9, 3), 17, 33, (7, 4, 13, 6, 19, 10, 34, 18, 11), 21, 35, 25, (8, 37), (12, 41), (20, 14, 49), 15, 22, (27, 36, 39, 23, 38, 26), 42, 29, (50, 43, 45, 16, 51, 24, 53), (57, 28, 40), 30, (44, 31, 46), 52, 47, 54, (55, 58), 59, 61, 32, 48, 56, 62, 63, 64]. Locations of elements in some subsequences in the sequence may be exchanged. Therefore, the new sequence of N=64 obtained based on the nesting characteristic from the sequence of N=128 is slightly different from the sequence of N=64 in the example (1) in Example 1: A range of parentheses is larger, and more sequences can be formed.

For example, the Q sequence of N=64 in the example (1) in Example 1 is directly obtained. Locations of K polarized channels are selected in descending order of reliability based on the obtained Q sequence, to place the to-be-coded bits, where K=27. To be specific, the to-be-coded bits are placed at locations of polarized channels whose sequence numbers are (43, 45, 16, 51, 24, 53, 57, 28, 40, 30, 44, 31, 46, 52, 47, 54, 55, 58, 59, 61, 32, 48, 56, 60, 62, 63, 64) or at locations of polarized channels whose sequence numbers are (50, 45, 16, 51, 24, 53, 57, 28, 40, 30, 44, 31, 46, 52, 47, 54, 55, 58, 59, 0, 32, 48, 56, 60, 62, 63, 64). In the directly obtained Q sequence of N=64, locations of two elements (50, 43) in the subsequence $L_1^{(m=3)}=(50, 43)$ may be mutually exchanged. Therefore, there may be two possible combinations. The to-be-coded bits are placed, with equal positions, in polarized channels corresponding to the subsequences $L_1^{(m=3)}=$ (16.5); $L_2^{(m=2)}=(24.53)$; $L_{10}^{(m=2)}=(57.28)$; $L_{15}^{(m=2)}=$ (44.31). Therefore, whether to exchange elements does not need to be considered.

A prerequisite for the foregoing example of placing the information bits is that sending priorities of the 27 to-be-coded bits are the same. If the priorities of the to-be-coded bits are different, for example, 18 check bits need to be placed at locations of 18 polarized channels with highest reliability in the selected 27 polarized channels, and one check bit needs to be placed at a location whose reliability is lower than that of some information bits. In this case, when the check bit is placed, orders of the check bit in the four subsequences $L_1^{(m=2)}$ to $L_{10}^{(m=2)}$ may be considered. For example, the check bit needs to be placed at a first location in $L_1^{(m=2)}$. When $L_2^{(m=2)}=(16.51)$, the first location is 16, and after orders of 16 and 51 are exchanged, the first location is 51. Therefore, whether a location of 16 or a location of 51 is selected for the check bit may affect final performance.

Locations other than locations at which the to-be-coded bits are placed are locations of frozen bits. Polar coding and rate matching are performed based on the locations of the to-be-coded bits and the locations of the frozen bits.

In addition, a new sequence of N=64 may be obtained based on the nesting characteristic by using the following sequences: a sequence of N=256, a sequence of N=512, or a sequence of N=1024.

An example of N=64 is used for description above, and a coding method of another code length is similar to this. Details are not described herein again.

The sequences (1) to (30) in the foregoing examples in this embodiment of this application may be obtained by taking an intersection set of several groups of sequences. For example, the sequence (1) in the foregoing example is obtained by taking an intersection set of several groups of sequences whose mother code lengths are 64. Certainly, the sequence may be obtained in another manner.

In a possible example, the following sequences S1 to S20 are obtained through simulation. The sequences S1 to S20 are sequences whose mother code lengths are 1024. Based on the nesting characteristic, sequences whose mother code lengths are 64, 128, 256, and 512 may be separately obtained based on the sequences S1 to S20, to obtain 20 groups of sequences whose mother code lengths are separately 64, 128, 256, 512, and 1024. Sequences in examples (1) to (10) in Example 1 may be obtained based on a first group of sequences to a fifth group of sequences. Sequences in examples (11) to (20) in Example 2 may be obtained based on the first group of sequences to a tenth group of sequences. Sequences in examples (21) to (30) in Example 3 may be obtained based on the first group of sequences to a twentieth group of sequences. It may be understood that a larger quantity of combined sequences indicates a smaller quantity of elements whose locations remain unchanged in an obtained sequence, a larger quantity of elements whose locations are changeable, and a larger range of the obtained sequence.

In this embodiment of this application, the polar coding method shown in FIG. 2 may further be performed by using any one of the sequences S1 to S20.

Specifically, the sequences S1 to S20 may be as follows:
sequence S1: [1, 2, 3, 5, 9, 17, 33, 4, 6, 65, 7, 10, 11, 18, 129, 13, 19, 34, 21, 35, 25, 257, 37, 66, 8, 67, 41, 12, 69, 130, 14, 49, 20, 131, 513, 73, 15, 22, 36, 133, 81, 23, 26, 258, 38, 137, 97, 27, 259, 39, 68, 42, 145, 29, 261, 70, 43, 50, 71, 161, 132, 265, 514, 45, 74, 16, 51, 134, 515, 75, 273, 53, 82, 24, 193, 135, 517, 77, 83, 138, 57, 289, 98, 28, 260, 40, 85, 139, 521, 146, 30, 99, 262, 44, 141, 147, 529, 89, 321, 101, 31, 263, 72, 162, 266, 46, 52, 149, 163, 545, 105, 267, 516, 47, 76, 274, 54, 153, 385, 165, 194, 136, 269, 518, 78, 113, 275, 55, 84, 58, 290, 195, 577, 519, 79, 169, 277, 86, 140, 522, 59, 291, 100, 197, 87, 142, 523, 177, 148, 281, 530, 61, 90, 293, 322, 102, 32, 264, 641, 201, 143, 525, 150, 531, 91, 323, 103, 164, 297, 546, 106, 268, 48, 209, 151, 533, 93, 325, 154, 386, 166, 547, 107, 270, 305, 114, 276, 56, 225, 155, 537, 387, 769, 167, 549, 196, 329, 578, 109, 271, 520, 80, 115, 170, 278, 60, 292, 157, 389, 198, 579, 337, 117, 171, 279, 553, 88, 524, 178, 282, 62, 294, 199, 581, 393, 642, 173, 202, 144, 526, 179, 561, 121, 353, 283, 532, 63, 92, 295, 324, 104, 298, 643, 203, 585, 401, 527, 181, 210, 152, 285, 534, 94, 326, 299, 548, 108, 645, 306, 205, 211, 593, 535, 95, 327, 185, 417, 226, 156, 538, 388, 770, 168, 301, 550, 330, 110, 272, 307, 116, 213, 649, 158, 227, 609, 539, 390, 771, 551, 331, 580, 111, 309, 338, 118, 172, 280, 554, 657, 217, 449, 229, 159, 541, 391, 773, 200, 333, 582, 339, 119, 394, 174, 555, 180, 313, 562, 122, 354, 284, 64, 296, 583, 673, 233, 341, 395, 644, 777, 175, 557, 204, 586, 402, 528, 182, 563, 123, 286, 355, 300, 397, 646, 206, 587, 241, 403, 785, 183, 565, 212, 345, 594, 125, 357, 287, 536, 96, 328, 186, 418, 302, 705, 647, 308, 207, 589, 405, 214, 595, 650, 187, 569, 419, 801, 228, 361, 610, 540, 772, 303, 552, 332, 112, 310, 215, 597, 651, 409, 658, 189, 218, 421, 450, 230, 160, 542, 611, 392, 774, 334, 369, 311, 340, 120, 556, 653, 659, 219, 601, 451, 833, 231, 613, 543, 775, 335, 584, 425, 674, 234, 342, 396, 778, 176, 558, 564, 124, 661, 356, 221, 453, 675, 235, 343, 617, 398, 779, 433, 559, 588, 242, 404, 786, 184, 317, 566, 346, 126, 358, 288, 665, 897, 677, 457, 706, 237, 399, 648, 781, 208, 590, 243, 625, 406, 787, 567, 347, 596, 127, 359, 188, 570, 420, 802, 362, 304, 707, 465, 591, 245, 407, 681, 789, 216, 349, 598, 652, 410, 190, 571, 422, 803, 363, 612, 709, 370, 312, 599, 654, 689, 249, 481, 411, 660, 793, 191, 573, 220, 423, 602, 805, 452, 834, 232, 365, 614, 544, 776, 336, 371, 426, 713, 655, 316, 413, 662, 222, 603, 454, 835, 615, 373, 427, 676, 809, 236, 344, 618, 780, 434, 560, 318, 721, 663, 223, 605, 455, 837, 666, 898, 429, 678, 458, 238, 619, 400, 782, 435, 817, 244, 377, 626, 788, 319, 568, 348, 128, 360, 737, 667, 899, 679, 459, 708, 841, 239, 621, 783, 437, 466, 592, 246, 627, 408, 682, 790, 350, 572, 804, 669, 364, 901, 461, 710, 467, 849, 247, 629, 683, 791, 351, 600, 441, 690, 250, 482, 412, 794, 192, 574, 424, 806, 366, 711, 372, 469, 905, 685, 714, 656, 691, 251, 633, 414, 483, 865, 795, 575, 604, 807, 836, 367, 616, 374, 428, 810, 715, 913, 693, 473, 722, 253, 485, 415, 664, 797, 224, 606, 456, 838, 375, 430, 811, 620, 436, 818, 717, 378, 320, 723, 607, 839, 697, 929, 489, 738, 668, 900, 431, 680, 813, 460, 842, 240, 622, 784, 438, 819, 379, 628, 725, 670, 739, 902, 462, 843, 497, 623, 439, 821, 468, 850, 248, 381, 630, 684, 792, 352, 442, 729, 961, 741, 671, 903, 463, 712, 845, 470, 851, 631, 906, 686, 443, 692, 825, 252, 634, 484, 866, 796, 576, 808, 368, 471, 745, 853, 907, 687, 716, 914, 445, 694, 474, 254, 635, 486, 416, 798, 867, 376, 812, 909, 718, 753, 915, 695, 475, 724, 857, 255, 637, 487, 869, 799, 608, 840, 698, 930, 490, 432, 814, 820, 719, 380, 917, 477, 726, 699, 931, 491, 740, 873, 815, 844, 498, 624, 440, 822, 382, 727, 921, 701, 730, 933, 962, 493, 742, 672, 904, 464, 846, 499, 881, 823, 852, 383, 632, 444, 826, 731, 963, 743, 847, 501, 937, 472, 746, 854, 908, 688, 446, 827, 636, 868, 733, 965, 747, 855, 910, 945, 505, 754, 916, 447, 696, 829, 476, 858, 256, 638, 488, 870, 800, 969, 749, 911, 720, 755, 918, 478, 859, 639, 871, 700, 932, 492, 874, 816, 977, 757, 919, 479, 728, 861, 922, 702, 934, 494, 875, 500, 882, 824, 384, 761, 993, 923, 703, 732, 935, 964, 495, 744, 877, 848, 502, 883, 938, 828, 925, 734, 966, 503, 885, 939, 748, 856, 946, 506, 448, 830, 735, 967, 941, 970, 750, 912, 947, 507, 756, 889, 831, 860, 640, 872, 971, 751, 949, 978, 509, 758, 920, 480, 862, 876, 973, 979, 759, 863, 953, 762, 994, 924, 704, 936, 496, 878, 884, 981, 763, 926, 995, 879, 504, 886, 940, 985, 765, 997, 927, 736, 968, 887, 942, 948, 508, 890, 832, 1001, 943, 972, 752, 950, 510, 891, 974, 1009, 951, 980, 511, 760, 893, 864, 954, 975, 982, 955, 764, 996, 880, 983, 957, 986, 766, 998, 928, 888, 987, 767, 999, 1002, 944, 892, 989, 1003, 1010, 952, 512, 894, 1005, 976, 1011, 895, 956, 1013, 984, 958, 1017, 959, 988, 768, 1000, 990, 1004, 991, 1006, 1012, 896, 1007, 1014, 1015, 1018, 960, 1019, 1021, 992, 1008, 1016, 1020, 1022, 1023, 1024];

sequence S2: [1, 2, 3, 5, 9, 17, 33, 4, 6, 65, 7, 10, 11, 129, 18, 13, 19, 34, 257, 21, 35, 25, 66, 37, 67, 513, 8, 12, 130, 41, 69, 14, 20, 131, 49, 15, 73, 258, 22, 133, 36, 81, 23, 259, 26, 137, 38, 261, 97, 145, 27, 514, 39, 515, 265, 68, 42, 29, 161, 70, 43, 517, 50, 75, 273, 193, 521, 529, 71, 45, 132, 16, 74, 289, 545, 51, 24, 53, 134, 82, 321, 77, 135, 28, 57, 83, 138, 260, 40, 98, 385, 30, 85, 139, 262, 146, 31, 99, 516, 44, 89, 141, 263, 147, 72, 266, 46, 101, 162, 518, 577, 519, 52, 149, 522, 47, 76, 267, 163, 274, 523, 641, 105, 54, 153, 78, 269, 194, 165, 275, 55, 84, 530, 525, 531, 136, 58, 113, 195, 290, 79, 169, 277, 59, 86, 61, 87, 140, 100, 197, 90, 291, 281, 546, 769, 142, 177, 91, 102, 148, 143, 533, 547, 537, 32, 103, 264, 106, 322, 293, 201, 323, 578, 150, 297, 48, 93, 209, 549, 579, 268, 386, 325, 305, 164, 151, 107, 56, 154, 225, 387, 329, 270, 114, 520, 553, 642, 80, 166, 109, 155, 276, 60, 271, 115, 167, 524, 581, 561, 157, 196, 170, 198, 171, 278, 292, 279, 117, 88, 62, 178, 282, 526, 643, 532, 527, 63, 92, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 123, 394, 284, 64, 175, 341, 449, 354, 395, 233, 204, 673, 555, 557, 562, 582, 296, 286, 182, 206, 125, 785, 705, 183, 287, 528, 583, 644, 586, 563, 300, 355, 212, 402, 186, 397, 345, 207, 302, 801, 96, 187, 241, 536, 587, 565, 646, 594, 328, 403, 357, 308, 303, 833, 589, 647, 112, 540, 569, 595, 650, 772, 228, 418, 332, 215, 405, 310, 189, 552, 610, 897, 160, 218, 361, 419, 409, 369, 230, 450, 421, 542, 597, 651, 774, 658, 311, 120, 334, 219, 543, 611, 176, 392, 231, 314, 124, 340, 335, 221, 451, 425, 315, 556, 601, 653, 234, 775, 659, 613, 235, 288, 453, 126, 342, 396, 778, 584, 558, 674, 356, 343, 564, 661, 559, 617, 779, 675, 184, 398, 433, 317, 346, 242, 208, 404, 358, 786, 188, 588, 566, 665, 625, 781, 237, 127, 243, 347, 399, 706, 216, 677, 787, 590, 567, 648, 406, 359, 304, 570, 596, 362, 707, 190, 457, 349, 465, 802, 420, 407, 245, 410, 591, 681, 789, 571, 598, 363, 573, 220, 422, 599, 652, 612, 709, 602, 803, 370, 793, 312, 191, 654, 689, 603, 411, 232, 249, 365, 336, 423, 614, 660, 655, 316, 222, 371, 426, 452, 413, 481, 236, 223, 344, 318, 544, 373, 615, 427, 776, 128, 454, 238, 560, 834, 805, 713, 835, 662, 809, 605, 618, 721, 780, 434, 898, 319, 455, 837, 817, 676, 663, 348, 429, 400, 377, 244, 239, 458, 435, 360, 568, 619, 666, 737, 899, 841, 782, 626, 350, 246, 459, 592, 678, 621, 667, 788, 572, 783, 627, 679, 408, 364, 351, 437, 192, 247, 466, 412, 461, 250, 366, 600, 708, 574, 669, 682, 790, 804, 791, 683, 629, 441, 690, 794, 604, 575, 467, 424, 372, 251, 414, 367, 469, 482, 374, 656, 901, 806, 428, 415, 253, 616, 849, 685, 795, 714, 633, 691, 807, 606, 483, 473, 224, 664, 836, 905, 810, 715, 620, 797, 693, 375, 485, 430, 456, 722, 607, 717, 811, 865, 838, 697, 723, 913, 818, 378, 436, 813, 320, 622, 240, 431, 460, 379, 668, 839, 489, 438, 628, 623, 462, 381, 439, 352, 497, 680, 725, 819, 842, 670, 738, 630, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 827, 746, 501, 488, 638, 505, 800, 696, 854, 908, 868, 855, 747, 910, 829, 965, 858, 754, 720, 916, 870, 478, 700, 749, 639, 816, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024];

sequence S3: [1, 2, 3, 5, 9, 17, 33, 4, 6, 65, 7, 10, 11, 129, 18, 13, 19, 34, 257, 21, 35, 25, 66, 37, 8, 130, 67, 513, 12, 41, 69, 20, 14, 131, 49, 15, 73, 258, 22, 133, 36, 23, 259, 81, 26, 137, 38, 27, 514, 97, 261, 39, 515, 265, 68, 42, 145, 29, 70, 43, 517, 50, 161, 273, 71, 289, 545, 45, 193, 521, 529, 132, 74, 51, 134, 82, 75, 16, 24, 53, 321, 135, 77, 57, 83, 28, 138, 98, 40, 385, 260, 85, 139, 262, 30, 146, 44, 99, 516, 89, 141, 31, 147, 46, 263, 72, 266, 101, 162, 518, 577, 519, 52, 149, 522, 47, 76, 267, 105, 274, 523, 641, 163, 54, 153, 78, 269, 194, 165, 275, 55, 84, 530, 525, 531, 136, 58, 113, 79, 277, 195, 290, 59, 169, 86, 140, 100, 87, 197, 142, 291, 61, 281, 546, 769, 90, 102, 148, 177, 91, 143, 533, 547, 537, 293, 201, 264, 32, 150, 322, 323, 578, 103, 106, 93, 48, 297, 164, 151, 209, 549, 579, 386, 268, 305, 325, 107, 154, 387, 166, 56, 329, 114, 520, 553, 642, 155, 80, 109, 225, 270, 167, 524, 581, 561, 60, 276, 271, 115, 196, 170, 292, 278, 157, 88, 171, 117, 279, 198, 62, 282, 526, 643, 532, 527, 178, 294, 389, 92, 585, 770, 199, 144, 63, 121, 202, 283, 173, 104, 337, 179, 295, 94, 534, 645, 535, 593, 548, 771, 298, 393, 324, 285, 203, 181, 108, 152, 210, 538, 95, 205, 299, 401, 326, 353, 649, 609, 306, 301, 156, 211, 110, 168, 185, 116, 226, 327, 158, 111, 773, 550, 657, 539, 551, 307, 213, 330, 118, 172, 331, 227, 388, 309, 272, 580, 417, 217, 338, 159, 777, 119, 541, 554, 280, 333, 390, 174, 122, 200, 180, 229, 394, 284, 391, 175, 313, 123, 673, 555, 557, 562, 582, 354, 204, 64, 182, 339, 296, 449, 341, 286, 395, 233, 125, 785, 705, 206, 183, 287, 528, 583, 644, 586, 563, 300, 355, 212, 402, 186, 397, 241, 536, 587, 565, 646, 594, 207, 302, 801, 345, 403, 328, 357, 308, 96, 418, 214, 187, 405, 112, 540, 569, 595, 650, 772, 303, 833, 589, 647, 228, 361, 215, 189, 552, 610, 897, 332, 310, 419, 409, 218, 450, 230, 160, 421, 542, 597, 651, 774, 658, 392, 334, 311, 369, 340, 120, 314, 219, 543, 611, 335, 231, 234, 775, 659, 613, 176, 124, 315, 556, 601, 653, 342, 221, 425, 451, 396, 778, 584, 558, 674, 356, 288, 184, 235, 126, 343, 564, 661, 559, 617, 779, 675, 317, 242, 346, 453, 398, 404, 208, 433, 358, 786, 188, 588, 566, 665, 625, 781, 237, 127, 243, 399, 706, 347, 457, 359, 406, 304, 570, 596, 190, 216, 677, 787, 590, 567, 648, 362, 707, 245, 349, 420, 407, 465, 802, 410, 591, 681, 789, 571, 598, 312, 363, 573, 220, 422, 599, 652, 612, 709, 602, 803, 370, 793, 191, 654, 689, 603, 249, 232, 411, 336, 365, 423, 614, 660, 655, 316, 222, 371, 426, 236, 452, 481, 413, 344, 223, 318, 544, 373, 615, 427, 776, 454, 238, 560, 834, 805, 713, 835, 662, 809, 605, 618, 721, 780, 348, 319, 244, 434, 898, 455, 837, 817, 676, 663, 360, 568, 619, 666, 737, 899, 841, 782, 626, 429, 377, 400, 239, 458, 435, 128, 350, 246, 459, 592, 678, 621, 667, 788, 572, 783, 627, 679, 437, 408, 466, 364, 247, 351, 412, 461, 250, 366, 600, 708, 574, 669, 682, 790, 804, 791, 710, 683, 629, 467, 192, 441, 690, 794, 604, 575, 372, 424, 251, 482, 469, 367, 414, 374, 656, 901, 806, 711, 428, 415, 253, 616, 849, 685, 795, 714, 633, 691, 807, 606, 483, 473, 224, 664, 836, 905, 810, 715, 620, 797, 693, 375, 430, 456, 722, 607, 717, 811, 865, 838, 697, 723, 913, 818, 378, 436, 813, 485, 320, 622, 431, 240, 379, 668, 839, 460, 438, 628, 623, 489, 381, 462, 497, 680, 725, 819, 842, 670, 738, 630, 352, 439, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 827, 746, 501, 488, 638, 505, 800, 696, 854, 908, 868, 855, 747, 910, 829, 858, 754, 720, 916, 870, 478, 700, 749, 639, 816, 965, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024];

sequence S4: [1, 2, 3, 5, 9, 17, 33, 4, 6, 513, 65, 7, 10, 11, 129, 18, 13, 19, 34, 257, 21, 35, 25, 66, 37, 8, 130, 67, 12, 41, 69, 20, 514, 14, 131, 49, 15, 73, 258, 22, 133, 36, 23, 259, 81, 26, 137, 38, 27, 515, 97, 261, 39, 265, 68, 42, 145, 29, 70, 43, 50, 161, 273, 517, 71, 289, 45, 193, 132, 74, 51, 134, 82, 75, 16, 521, 24, 53, 321, 135, 77, 57, 83, 28, 138, 98, 529, 40, 385, 260, 85, 139, 262, 30, 146, 545, 44, 99, 89, 141, 31, 147, 46, 263, 516, 72, 266, 101, 162, 52, 149, 47, 518, 76, 267, 105, 274, 163, 54, 153, 577, 78, 269, 194, 165, 275, 55, 519, 84, 136, 58, 113, 79, 277, 522, 195, 290, 59, 169, 86, 140, 523, 100, 87, 197, 142, 291, 641, 61, 281, 90, 102, 148, 177, 530, 91, 143, 293, 201, 264, 525, 32, 150, 322, 323, 531, 103, 106, 93, 48, 297, 546, 164, 151, 209, 386, 769, 268, 305, 325, 107, 533, 154, 387, 166, 56, 329, 547, 114, 155, 80, 537, 109, 225, 270, 167, 578, 60, 276, 271, 115, 549, 196, 170, 292, 278, 520, 157, 88, 171, 642, 117, 279, 198, 62, 579, 282, 178, 294, 524, 389, 92, 199, 144, 553, 63, 121, 202, 581, 283, 173, 104, 532, 337, 179, 295, 526, 94, 298, 393, 643, 324, 285, 203, 561, 181, 108, 152, 527, 210, 95, 205, 585, 299, 401, 326, 770, 353, 306, 534, 301, 156, 211, 645, 110, 168, 185, 548, 116, 226, 535, 327, 158, 111, 771, 307, 213, 593, 330, 118, 172, 538, 331, 227, 649, 388, 309, 272, 550, 417, 217, 539, 338, 159, 609, 119, 280, 773, 333, 390, 174, 551, 122, 200, 777, 180, 229, 580, 394, 284, 554, 391, 175, 657, 313, 123, 541, 354, 204, 64, 582, 182, 339, 555, 296, 449, 562, 341, 286, 673, 395, 785, 233, 125, 583, 206, 183, 801, 287, 300, 557, 355, 212, 705, 402, 644, 397, 241, 586, 207, 302, 563, 345, 646, 403, 328, 594, 357, 308, 587, 96, 528, 418, 214, 536, 405, 565, 112, 833, 303, 228, 647, 361, 215, 589, 189, 569, 332, 310, 595, 419, 409, 540, 218, 650, 450, 230, 610, 160, 552, 421, 392, 897, 334, 772, 311, 369, 597, 340, 651, 120, 774, 314, 219, 542, 335, 658, 231, 234, 556, 176, 611, 124, 315, 601, 342, 653, 221, 543, 425, 451, 659, 396, 558, 356, 775, 288, 584, 184, 235, 778, 126, 613, 343, 674, 317, 242, 564, 346, 661, 453, 559, 398, 588, 404, 208, 779, 433, 617, 358, 786, 188, 675, 237, 566, 127, 665, 243, 399, 590, 347, 781, 457, 706, 359, 677, 406, 787, 304, 567, 190, 596, 216, 648, 362, 570, 245, 349, 625, 420, 591, 407, 789, 465, 707, 410, 802, 312, 571, 363, 681, 220, 598, 422, 652, 370, 612, 191, 599, 249, 709, 232, 654, 411, 803, 336, 573, 365, 793, 423, 316, 222, 602, 371, 614, 426, 660, 236, 689, 452, 603, 481, 655, 413, 805, 344, 713, 223, 776, 318, 544, 373, 662, 427, 834, 454, 835, 238, 615, 348, 618, 605, 319, 560, 244, 809, 434, 676, 455, 663, 360, 721, 429, 898, 377, 780, 400, 817, 239, 837, 458, 619, 666, 435, 899, 128, 678, 350, 568, 246, 841, 459, 626, 667, 437, 592, 408, 621, 466, 737, 364, 782, 247, 679, 572, 351, 788, 412, 783, 461, 627, 708, 250, 682, 366, 804, 467, 790, 192, 669, 600, 441, 683, 372, 629, 791, 424, 710, 251, 574, 482, 794, 690, 469, 806, 367, 901, 604, 414, 711, 374, 656, 428, 575, 633, 415, 253, 795, 685, 483, 616, 473, 849, 691, 224, 807, 606, 375, 810, 430, 905, 836, 456, 797, 378, 693, 436, 620, 664, 485, 722, 320, 607, 717, 431, 811, 913, 240, 838, 379, 865, 818, 460, 813, 668, 438, 723, 622, 489, 680, 381, 697, 628, 462, 738, 839, 497, 670, 623, 352, 819, 725, 439, 842, 630, 468, 684, 843, 248, 739, 442, 900, 821, 463, 784, 929, 470, 729, 850, 671, 443, 631, 792, 252, 845, 902, 368, 686, 634, 254, 712, 692, 471, 741, 906, 416, 796, 903, 484, 687, 825, 635, 445, 866, 376, 576, 694, 474, 851, 808, 961, 486, 853, 798, 475, 907, 745, 255, 637, 718, 695, 432, 799, 812, 380, 867, 724, 914, 487, 698, 909, 477, 753, 719, 814, 490, 857, 915, 840, 440, 869, 820, 608, 491, 930, 726, 382, 699, 917, 624, 498, 815, 740, 873, 493, 727, 701, 844, 464, 822, 931, 921, 383, 730, 962, 742, 499, 672, 933, 904, 444, 846, 823, 881, 852, 446, 632, 826, 731, 472, 847, 743, 746, 447, 688, 636, 827, 854, 256, 733, 937, 963, 476, 908, 868, 800, 696, 501, 747, 638, 855, 829, 488, 754, 858, 965, 910, 505, 916, 720, 945, 478, 870, 700, 749, 639, 755, 492, 911, 859, 969, 871, 479, 918, 816, 702, 728, 384, 874, 757, 861, 932, 919, 494, 977, 922, 824, 875, 732, 500, 934, 882, 703, 761, 495, 744, 923, 848, 877, 935, 828, 502, 734, 883, 938, 748, 964, 448, 993, 925, 856, 735, 830, 885, 503, 939, 966, 750, 860, 831, 756, 506, 946, 967, 872, 941, 889, 912, 507, 751, 970, 947, 640, 862, 758, 971, 480, 949, 920, 978, 876, 759, 863, 924, 509, 973, 762, 878, 979, 704, 953, 884, 936, 496, 763, 994, 981, 879, 926, 886, 940, 927, 504, 765, 995, 985, 736, 887, 942, 968, 890, 948, 997, 508, 832, 943, 752, 891, 972, 950, 1001, 893, 974, 1009, 864, 510, 951, 980, 760, 954, 975, 982, 955, 764, 880, 766, 983, 928, 996, 511, 957, 888, 986, 998, 987, 767, 944, 892, 999, 989, 1002, 952, 1003, 894, 1010, 1005, 976, 512, 895, 1011, 956, 958, 984, 959, 768, 988, 1013, 1000, 1017, 990, 1004, 991, 896, 1006, 1012, 1007, 1014, 960, 1015, 1018, 1019, 992, 1021, 1008, 1016, 1020, 1022, 1023, 1024];

sequence S5: [1, 2, 5, 9, 3, 17, 33, 7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 606, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 628, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024];

sequence S6: [1, 2, 3, 5, 9, 17, 33, 4, 257, 513, 6, 65, 7, 10, 11, 129, 18, 13, 19, 34, 21, 35, 25, 66, 37, 258, 67, 8, 12, 130, 41, 69, 514, 14, 20, 131, 49, 15, 73, 259, 22, 133, 36, 81, 23, 26, 137, 38, 97, 515, 261, 145, 27, 39, 68, 42, 29, 161, 70, 265, 43, 50, 75, 517, 193, 71, 45, 273, 132, 16, 74, 51, 24, 53, 289, 521, 134, 82, 77, 135, 28, 57, 260, 83, 138, 40, 529, 98, 262, 30, 85, 139, 146, 31, 321, 545, 99, 44, 89, 141, 263, 147, 72, 46, 516, 101, 266, 162, 52, 149, 47, 267, 769, 76, 163, 105, 385, 54, 153, 78, 518, 194, 274, 165, 55, 84, 269, 577, 136, 58, 113, 275, 195, 79, 519, 169, 290, 59, 86, 61, 277, 522, 87, 140, 291, 100, 197, 523, 90, 281, 142, 177, 322, 91, 641, 102, 148, 293, 143, 32, 530, 323, 103, 106, 264, 525, 201, 150, 48, 268, 93, 531, 209, 386, 164, 151, 546, 297, 107, 56, 325, 533, 154, 225, 270, 114, 80, 547, 276, 166, 109, 537, 387, 155, 60, 305, 578, 115, 167, 271, 157, 549, 329, 196, 170, 278, 770, 198, 171, 389, 579, 117, 292, 88, 62, 520, 337, 178, 63, 524, 279, 92, 282, 144, 642, 199, 393, 104, 553, 294, 173, 353, 581, 202, 121, 401, 526, 179, 283, 94, 532, 152, 295, 203, 643, 324, 108, 298, 561, 181, 210, 285, 527, 95, 417, 205, 585, 326, 185, 771, 299, 211, 110, 534, 306, 156, 331, 645, 116, 449, 548, 111, 327, 168, 593, 301, 213, 535, 388, 158, 272, 538, 226, 118, 649, 330, 172, 307, 550, 227, 280, 609, 217, 309, 773, 159, 390, 657, 119, 338, 174, 539, 333, 122, 551, 391, 200, 580, 180, 229, 554, 284, 123, 541, 313, 64, 673, 339, 175, 394, 582, 233, 296, 777, 204, 354, 555, 182, 286, 562, 341, 587, 206, 395, 705, 125, 402, 583, 183, 287, 557, 212, 355, 785, 186, 300, 644, 207, 345, 528, 96, 397, 586, 187, 563, 403, 328, 536, 241, 302, 565, 214, 801, 357, 112, 646, 418, 228, 594, 308, 589, 405, 215, 647, 303, 189, 540, 332, 569, 160, 419, 772, 361, 218, 595, 310, 650, 230, 409, 552, 334, 610, 120, 450, 774, 219, 542, 421, 176, 597, 311, 651, 340, 658, 231, 392, 543, 314, 833, 124, 369, 611, 221, 556, 451, 335, 601, 234, 653, 425, 775, 235, 315, 659, 342, 584, 126, 558, 317, 613, 343, 184, 778, 396, 674, 356, 564, 242, 453, 661, 208, 559, 346, 779, 398, 588, 188, 433, 675, 347, 617, 237, 897, 358, 566, 404, 665, 127, 590, 399, 288, 706, 243, 786, 359, 677, 362, 567, 216, 596, 457, 781, 406, 648, 190, 570, 304, 625, 349, 245, 787, 465, 707, 420, 591, 407, 681, 220, 802, 363, 571, 312, 598, 191, 573, 410, 789, 481, 599, 232, 652, 370, 803, 336, 612, 422, 709, 249, 602, 365, 793, 411, 222, 316, 654, 371, 689, 423, 834, 236, 603, 413, 614, 452, 660, 426, 805, 223, 655, 454, 544, 427, 835, 128, 615, 373, 618, 344, 776, 318, 713, 238, 662, 560, 434, 780, 319, 605, 348, 721, 244, 898, 400, 676, 455, 663, 360, 809, 429, 619, 239, 568, 458, 837, 666, 377, 737, 435, 782, 246, 626, 350, 592, 408, 788, 678, 459, 621, 192, 899, 364, 667, 437, 572, 466, 817, 627, 351, 679, 247, 783, 461, 669, 841, 441, 708, 467, 682, 366, 790, 250, 710, 683, 412, 901, 372, 629, 804, 367, 600, 424, 574, 251, 849, 690, 469, 575, 414, 791, 604, 482, 794, 374, 656, 428, 711, 905, 253, 616, 483, 806, 685, 473, 865, 415, 714, 633, 375, 913, 691, 224, 795, 430, 606, 664, 378, 807, 456, 715, 836, 436, 620, 810, 485, 693, 379, 722, 797, 240, 607, 929, 320, 717, 431, 838, 697, 489, 811, 723, 460, 622, 818, 438, 668, 462, 843, 628, 248, 961, 623, 381, 839, 680, 439, 813, 725, 468, 900, 670, 442, 784, 738, 463, 630, 352, 842, 684, 252, 819, 739, 443, 792, 729, 821, 497, 671, 902, 470, 631, 850, 368, 686, 845, 484, 634, 903, 471, 712, 692, 445, 741, 796, 416, 635, 825, 576, 254, 851, 687, 474, 906, 745, 486, 808, 716, 866, 376, 694, 798, 475, 853, 718, 432, 907, 637, 914, 487, 695, 799, 380, 724, 867, 698, 477, 812, 719, 490, 857, 608, 909, 255, 699, 915, 840, 491, 753, 814, 726, 382, 869, 624, 440, 930, 740, 820, 498, 917, 727, 815, 464, 701, 844, 672, 444, 931, 873, 730, 493, 822, 742, 921, 383, 846, 632, 962, 499, 731, 933, 688, 823, 472, 852, 743, 904, 446, 826, 636, 881, 501, 733, 963, 847, 746, 256, 937, 747, 827, 476, 854, 638, 829, 855, 447, 696, 908, 868, 754, 488, 965, 720, 858, 910, 505, 700, 945, 859, 478, 749, 870, 916, 639, 911, 492, 800, 755, 871, 874, 479, 728, 969, 918, 702, 384, 816, 861, 757, 977, 932, 494, 919, 732, 875, 824, 703, 500, 922, 993, 744, 882, 495, 848, 934, 761, 877, 923, 734, 502, 828, 883, 935, 748, 925, 448, 964, 938, 735, 966, 939, 640, 503, 885, 856, 830, 750, 946, 831, 506, 860, 756, 912, 967, 872, 941, 507, 751, 970, 889, 947, 758, 862, 920, 509, 971, 704, 876, 949, 978, 863, 759, 480, 973, 953, 979, 878, 762, 924, 884, 879, 496, 936, 763, 981, 926, 994, 886, 940, 765, 504, 995, 985, 927, 887, 736, 942, 890, 968, 948, 997, 508, 891, 752, 832, 943, 1001, 972, 950, 974, 760, 893, 951, 510, 980, 954, 975, 864, 764, 955, 1009, 982, 880, 996, 983, 957, 928, 511, 766, 986, 998, 888, 987, 944, 999, 892, 989, 1002, 767, 1003, 894, 952, 1010, 976, 956, 512, 1005, 895, 1011, 984, 958, 1013, 768, 988, 959, 1000, 1017, 990, 1004, 991, 896, 1006, 1012, 1007, 1014, 960, 1015, 1018, 1019, 1021, 992, 1008, 1016, 1020, 1022, 1023, 1024];

sequence S7: [1, 2, 3, 5, 9, 17, 4, 33, 6, 7, 65, 10, 11, 18, 13, 19, 129, 34, 21, 35, 25, 8, 37, 66, 257, 67, 12, 41, 69, 14, 20, 49, 130, 15, 73, 22, 131, 513, 36, 23, 133, 81, 26, 38, 27, 258, 137, 39, 68, 97, 42, 259, 29, 145, 43, 70, 261, 50, 71, 16, 45, 74, 51, 265, 132, 161, 514, 75, 24, 53, 134, 82, 515, 273, 77, 135, 83, 28, 57, 193, 138, 517, 40, 98, 85, 260, 30, 139, 289, 521, 146, 99, 44, 31, 262, 141, 89, 147, 72, 101, 46, 263, 529, 321, 52, 266, 162, 149, 47, 76, 105, 267, 54, 163, 516, 274, 153, 545, 78, 55, 269, 136, 165, 84, 113, 58, 194, 275, 518, 385, 79, 59, 86, 195, 140, 290, 169, 519, 277, 577, 522, 100, 87, 32, 291, 61, 197, 142, 90, 523, 281, 148, 177, 102, 264, 143, 293, 530, 91, 322, 201, 525, 150, 103, 48, 531, 106, 641, 323, 93, 268, 297, 164, 151, 209, 154, 546, 107, 533, 325, 56, 270, 166, 114, 276, 155, 547, 305, 386, 80, 109, 271, 537, 167, 115, 329, 60, 196, 225, 170, 520, 278, 387, 157, 549, 578, 769, 88, 117, 292, 62, 171, 198, 279, 389, 579, 337, 524, 282, 553, 178, 63, 199, 144, 294, 173, 92, 121, 202, 283, 581, 526, 179, 393, 104, 295, 532, 561, 642, 324, 94, 203, 353, 298, 527, 285, 152, 181, 585, 210, 108, 534, 643, 401, 95, 299, 326, 205, 211, 156, 548, 306, 185, 535, 110, 645, 327, 272, 593, 301, 538, 168, 116, 330, 226, 307, 213, 388, 158, 550, 417, 111, 539, 770, 649, 331, 118, 227, 172, 280, 159, 551, 309, 390, 580, 338, 217, 609, 554, 771, 541, 119, 333, 64, 200, 229, 174, 391, 122, 657, 339, 284, 555, 313, 582, 449, 180, 394, 773, 296, 175, 562, 123, 204, 354, 233, 583, 341, 528, 286, 395, 557, 182, 586, 563, 777, 644, 402, 96, 673, 355, 125, 300, 206, 287, 183, 397, 587, 345, 212, 241, 186, 536, 403, 565, 646, 328, 207, 357, 594, 302, 785, 589, 308, 187, 214, 418, 112, 647, 405, 595, 303, 540, 569, 705, 650, 332, 361, 228, 215, 160, 552, 310, 419, 189, 218, 610, 597, 772, 542, 651, 409, 801, 120, 334, 230, 311, 392, 421, 658, 340, 219, 611, 369, 556, 314, 450, 543, 774, 653, 335, 601, 231, 176, 124, 659, 234, 315, 584, 342, 451, 221, 613, 396, 558, 425, 775, 833, 564, 778, 674, 356, 126, 235, 661, 343, 288, 559, 317, 453, 184, 398, 588, 346, 617, 242, 779, 404, 566, 675, 433, 127, 208, 358, 237, 399, 786, 665, 347, 590, 243, 457, 188, 567, 781, 648, 406, 677, 359, 596, 304, 625, 570, 706, 787, 362, 897, 591, 349, 216, 245, 420, 190, 407, 571, 598, 707, 465, 652, 410, 802, 681, 363, 789, 312, 191, 422, 220, 612, 370, 249, 599, 544, 411, 803, 573, 709, 654, 336, 365, 602, 232, 793, 423, 660, 689, 371, 316, 452, 222, 614, 481, 426, 776, 655, 413, 805, 603, 834, 713, 236, 662, 344, 223, 615, 373, 560, 318, 427, 454, 618, 835, 605, 780, 809, 676, 434, 128, 663, 238, 319, 455, 400, 721, 429, 666, 348, 619, 377, 244, 458, 837, 568, 782, 435, 678, 360, 239, 626, 788, 667, 817, 898, 592, 350, 459, 621, 246, 783, 408, 679, 437, 627, 841, 572, 708, 466, 737, 682, 364, 790, 899, 669, 351, 247, 461, 192, 250, 600, 467, 629, 412, 804, 574, 683, 441, 710, 791, 366, 901, 849, 794, 424, 690, 372, 251, 482, 575, 711, 469, 656, 414, 806, 685, 367, 604, 633, 714, 795, 691, 905, 224, 616, 374, 483, 253, 428, 415, 807, 836, 606, 715, 473, 865, 810, 797, 664, 693, 375, 320, 456, 485, 722, 430, 620, 378, 913, 607, 811, 838, 717, 436, 240, 723, 431, 668, 818, 697, 379, 460, 622, 489, 839, 784, 813, 680, 438, 628, 842, 738, 819, 725, 900, 670, 352, 929, 623, 381, 248, 462, 439, 843, 468, 630, 739, 497, 684, 442, 792, 671, 821, 902, 463, 850, 729, 252, 631, 845, 576, 443, 712, 470, 741, 686, 368, 903, 634, 851, 796, 825, 961, 692, 906, 484, 254, 471, 416, 808, 687, 445, 635, 716, 474, 866, 745, 853, 798, 907, 694, 376, 255, 486, 914, 608, 475, 867, 637, 812, 718, 799, 695, 909, 857, 487, 724, 432, 753, 698, 380, 915, 490, 840, 719, 477, 869, 814, 820, 699, 726, 930, 624, 382, 491, 917, 815, 440, 844, 873, 740, 498, 727, 672, 822, 931, 701, 383, 464, 493, 730, 921, 632, 846, 499, 444, 742, 823, 904, 933, 852, 731, 881, 826, 962, 847, 472, 743, 501, 688, 446, 636, 746, 827, 854, 963, 733, 908, 937, 256, 447, 476, 868, 638, 747, 505, 855, 800, 829, 965, 696, 910, 858, 488, 754, 916, 945, 639, 720, 478, 870, 749, 911, 859, 755, 969, 700, 492, 918, 479, 871, 816, 874, 861, 728, 757, 932, 702, 384, 919, 494, 977, 922, 875, 500, 824, 703, 934, 495, 732, 882, 761, 923, 848, 877, 744, 502, 935, 883, 828, 964, 734, 993, 938, 925, 503, 448, 748, 506, 856, 735, 885, 830, 939, 966, 946, 640, 507, 750, 831, 967, 912, 941, 860, 889, 756, 970, 947, 480, 872, 751, 509, 862, 971, 758, 920, 949, 978, 876, 863, 759, 973, 704, 496, 762, 979, 924, 953, 878, 936, 884, 763, 994, 981, 926, 879, 504, 736, 886, 995, 765, 940, 927, 985, 508, 887, 832, 968, 997, 942, 890, 948, 752, 510, 943, 891, 972, 1001, 950, 511, 864, 893, 760, 974, 951, 980, 1009, 954, 975, 764, 955, 982, 880, 996, 766, 983, 928, 957, 986, 888, 767, 998, 987, 999, 944, 892, 1002, 989, 512, 894, 1003, 952, 1010, 895, 976, 1005, 1011, 956, 984, 1013, 958, 768, 959, 988, 1017, 1000, 990, 1004, 991, 896, 1006, 1012, 1007, 1014, 1015, 960, 1018, 1019, 992, 1021, 1008, 1016, 1020, 1022, 1023, 1024];

sequence S8: [1, 2, 3, 5, 9, 17, 33, 4, 6, 7, 65, 10, 11, 18, 13, 129, 19, 34, 21, 35, 25, 257, 37, 8, 66, 67, 41, 12, 69, 14, 130, 49, 20, 15, 73, 513, 131, 22, 133, 36, 23, 81, 26, 258, 38, 137, 27, 259, 39, 97, 68, 42, 29, 145, 261, 70, 43, 50, 71, 265, 45, 16, 74, 514, 161, 132, 51, 75, 515, 134, 273, 53, 24, 82, 77, 517, 135, 193, 83, 138, 57, 28, 289, 260, 40, 98, 521, 139, 85, 30, 146, 262, 99, 141, 44, 31, 89, 529, 147, 263, 321, 101, 72, 266, 46, 162, 149, 52, 267, 47, 105, 545, 76, 516, 163, 274, 54, 153, 269, 385, 78, 518, 165, 136, 275, 194, 55, 113, 84, 58, 79, 519, 577, 290, 195, 277, 522, 169, 140, 86, 59, 291, 197, 100, 523, 87, 142, 281, 61, 32, 90, 530, 177, 148, 293, 264, 322, 102, 525, 143, 201, 641, 91, 531, 150, 323, 103, 297, 268, 48, 106, 546, 164, 93, 533, 151, 209, 325, 154, 270, 107, 547, 386, 166, 305, 276, 56, 114, 537, 155, 271, 329, 769, 109, 549, 387, 80, 520, 167, 578, 225, 196, 278, 115, 170, 157, 60, 579, 389, 292, 553, 279, 198, 524, 337, 171, 117, 88, 282, 62, 178, 581, 294, 199, 393, 526, 173, 144, 283, 202, 642, 63, 121, 561, 92, 532, 179, 295, 353, 324, 104, 527, 585, 298, 203, 643, 285, 401, 94, 534, 181, 152, 210, 326, 299, 205, 108, 645, 548, 95, 535, 593, 306, 211, 538, 327, 185, 156, 301, 272, 330, 770, 417, 110, 550, 388, 168, 307, 226, 649, 213, 116, 539, 158, 331, 771, 111, 551, 609, 580, 390, 227, 309, 554, 280, 338, 172, 118, 541, 159, 217, 657, 333, 773, 391, 449, 582, 229, 555, 200, 339, 394, 119, 174, 313, 284, 64, 122, 562, 180, 583, 296, 354, 777, 557, 395, 528, 341, 175, 586, 233, 673, 204, 644, 286, 123, 563, 402, 182, 355, 587, 397, 300, 287, 206, 646, 345, 785, 125, 565, 403, 96, 536, 183, 594, 241, 212, 357, 328, 186, 589, 302, 207, 647, 705, 418, 595, 405, 308, 650, 569, 214, 540, 187, 303, 361, 801, 332, 772, 419, 112, 552, 610, 228, 651, 597, 310, 215, 409, 542, 189, 160, 218, 658, 334, 774, 611, 421, 392, 450, 311, 230, 653, 556, 369, 340, 120, 543, 601, 314, 219, 659, 335, 775, 833, 613, 451, 584, 231, 778, 425, 558, 396, 342, 176, 315, 234, 674, 221, 124, 661, 564, 453, 356, 779, 559, 617, 343, 588, 398, 235, 675, 317, 288, 346, 786, 433, 126, 566, 404, 184, 242, 665, 358, 781, 399, 457, 897, 590, 237, 677, 208, 648, 347, 787, 706, 127, 567, 625, 596, 406, 243, 570, 359, 188, 591, 304, 362, 802, 707, 420, 349, 789, 681, 407, 652, 465, 598, 245, 571, 216, 410, 190, 363, 803, 709, 612, 422, 599, 312, 654, 370, 793, 573, 411, 544, 191, 602, 249, 689, 220, 660, 365, 805, 336, 776, 423, 834, 481, 614, 452, 232, 655, 371, 713, 426, 603, 413, 316, 222, 662, 835, 615, 809, 454, 780, 427, 560, 373, 618, 344, 236, 676, 605, 318, 223, 663, 721, 434, 837, 666, 455, 782, 619, 429, 400, 458, 898, 319, 238, 678, 377, 817, 348, 788, 435, 128, 568, 626, 244, 667, 360, 783, 841, 621, 459, 899, 592, 239, 679, 737, 708, 350, 790, 627, 437, 682, 408, 466, 246, 669, 572, 461, 364, 901, 804, 351, 791, 710, 849, 683, 629, 467, 600, 247, 794, 441, 574, 412, 192, 250, 690, 366, 806, 711, 424, 482, 905, 685, 656, 469, 372, 795, 714, 575, 633, 604, 414, 251, 691, 367, 807, 865, 836, 483, 616, 810, 715, 428, 374, 797, 415, 473, 913, 606, 253, 693, 224, 664, 722, 838, 485, 811, 456, 375, 717, 620, 430, 607, 320, 378, 818, 723, 436, 839, 697, 668, 813, 784, 431, 842, 489, 929, 622, 460, 900, 240, 680, 379, 819, 738, 725, 628, 438, 670, 843, 623, 462, 902, 739, 381, 821, 352, 792, 439, 850, 684, 497, 630, 468, 248, 671, 729, 442, 845, 463, 903, 961, 741, 712, 851, 906, 631, 686, 825, 470, 796, 443, 576, 634, 252, 692, 368, 808, 866, 484, 907, 853, 687, 745, 471, 716, 798, 635, 445, 416, 474, 914, 254, 694, 867, 486, 909, 812, 376, 799, 718, 857, 637, 475, 915, 608, 255, 695, 753, 724, 869, 840, 698, 487, 814, 719, 432, 490, 930, 477, 380, 917, 820, 726, 699, 815, 873, 844, 491, 931, 624, 740, 382, 822, 727, 440, 498, 921, 701, 672, 730, 846, 493, 933, 464, 904, 962, 383, 823, 742, 881, 852, 499, 632, 826, 731, 444, 847, 963, 743, 937, 908, 854, 688, 501, 827, 746, 472, 733, 636, 446, 965, 868, 855, 910, 747, 829, 800, 447, 858, 505, 945, 638, 476, 916, 256, 696, 754, 870, 488, 911, 969, 749, 720, 859, 639, 478, 918, 755, 871, 700, 816, 874, 492, 932, 861, 479, 919, 977, 757, 728, 922, 702, 875, 494, 934, 384, 824, 882, 500, 923, 703, 761, 732, 877, 848, 495, 935, 993, 964, 744, 883, 938, 502, 925, 828, 734, 966, 939, 885, 856, 503, 748, 830, 735, 448, 506, 946, 967, 941, 912, 970, 831, 750, 889, 860, 507, 947, 640, 756, 872, 971, 751, 862, 509, 949, 480, 920, 978, 758, 973, 876, 863, 979, 759, 953, 924, 704, 762, 878, 496, 936, 994, 981, 884, 926, 763, 879, 995, 940, 886, 504, 927, 985, 765, 736, 997, 968, 887, 942, 832, 890, 508, 948, 943, 1001, 972, 752, 891, 510, 950, 974, 893, 864, 511, 951, 1009, 980, 760, 954, 975, 982, 955, 764, 880, 996, 983, 957, 928, 986, 766, 998, 888, 987, 767, 999, 944, 1002, 989, 892, 1003, 894, 512, 952, 1010, 1005, 976, 895, 1011, 956, 1013, 984, 958, 959, 1017, 988, 768, 1000, 990, 1004, 991, 1006, 896, 1012, 1007, 1014, 1015, 960, 1018, 1019, 1021, 992, 1008, 1016, 1020, 1022, 1023, 1024];

sequence S9: [1, 2, 3, 5, 9, 17, 33, 4, 6, 65, 7, 10, 11, 129, 18, 13, 19, 34, 257, 21, 35, 25, 66, 37, 67, 513, 8, 41, 130, 12, 69, 49, 14, 131, 20, 15, 73, 258, 22, 133, 23, 81, 36, 259, 26, 137, 97, 261, 38, 145, 27, 514, 39, 515, 265, 68, 29, 42, 161, 43, 45, 517, 50, 70, 273, 193, 521, 529, 16, 71, 132, 74, 51, 289, 545, 24, 75, 53, 134, 82, 321, 77, 135, 28, 57, 83, 138, 260, 40, 98, 385, 30, 85, 139, 262, 146, 31, 99, 516, 44, 89, 141, 263, 147, 101, 266, 72, 46, 162, 518, 577, 519, 52, 149, 522, 47, 105, 267, 163, 274, 523, 641, 76, 54, 153, 113, 269, 194, 165, 275, 78, 55, 530, 525, 531, 136, 58, 84, 195, 290, 79, 169, 277, 59, 86, 61, 87, 140, 100, 197, 90, 291, 281, 546, 769, 142, 177, 91, 102, 148, 143, 533, 547, 537, 32, 103, 264, 48, 322, 293, 201, 323, 578, 150, 297, 93, 106, 209, 549, 579, 268, 386, 325, 305, 164, 151, 56, 107, 154, 225, 387, 329, 270, 114, 520, 553, 642, 80, 166, 109, 155, 276, 60, 271, 115, 167, 524, 581, 561, 88, 196, 62, 157, 170, 278, 292, 279, 198, 171, 117, 178, 282, 526, 643, 532, 527, 92, 63, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 213, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 175, 394, 284, 123, 233, 341, 449, 354, 395, 204, 182, 673, 555, 557, 562, 582, 296, 286, 125, 183, 206, 785, 705, 64, 287, 528, 583, 644, 586, 563, 300, 355, 186, 402, 212, 397, 345, 207, 302, 801, 96, 187, 241, 536, 587, 565, 646, 594, 328, 403, 214, 357, 308, 303, 833, 589, 647, 112, 540, 569, 595, 650, 772, 160, 418, 332, 228, 405, 310, 215, 552, 610, 897, 120, 189, 361, 419, 409, 369, 218, 450, 421, 542, 597, 651, 774, 658, 311, 230, 334, 219, 543, 611, 176, 392, 124, 314, 231, 340, 335, 221, 451, 425, 315, 556, 601, 653, 234, 775, 659, 613, 126, 288, 184, 342, 396, 356, 778, 584, 558, 674, 343, 235, 564, 661, 559, 617, 779, 675, 398, 317, 346, 242, 208, 404, 358, 188, 237, 786, 127, 588, 566, 665, 625, 781, 304, 453, 433, 243, 347, 706, 399, 677, 787, 590, 567, 648, 216, 406, 359, 570, 596, 362, 707, 190, 457, 349, 420, 802, 407, 245, 410, 363, 591, 681, 789, 571, 598, 220, 573, 422, 370, 599, 652, 612, 709, 602, 803, 312, 793, 191, 411, 654, 689, 603, 232, 249, 365, 465, 336, 423, 614, 660, 655, 316, 222, 371, 426, 452, 413, 236, 223, 344, 373, 427, 544, 481, 615, 454, 776, 318, 238, 434, 560, 834, 805, 713, 835, 662, 809, 605, 618, 721, 780, 348, 898, 319, 455, 837, 817, 676, 663, 244, 429, 400, 360, 239, 377, 458, 435, 350, 568, 619, 666, 737, 899, 841, 782, 626, 246, 459, 408, 592, 678, 621, 667, 788, 572, 783, 627, 679, 128, 364, 351, 247, 437, 466, 412, 461, 250, 366, 467, 600, 708, 574, 669, 682, 790, 804, 791, 710, 683, 629, 424, 690, 794, 604, 575, 192, 372, 441, 251, 414, 367, 469, 482, 374, 656, 901, 806, 711, 428, 415, 253, 616, 849, 685, 795, 714, 633, 691, 807, 606, 224, 375, 483, 664, 836, 905, 810, 715, 620, 797, 693, 430, 456, 473, 378, 722, 607, 717, 811, 865, 838, 697, 723, 913, 818, 436, 320, 813, 240, 622, 431, 485, 460, 379, 668, 839, 438, 489, 628, 623, 462, 381, 439, 352, 248, 680, 725, 819, 842, 670, 738, 630, 468, 442, 252, 463, 497, 443, 368, 684, 843, 739, 900, 821, 729, 929, 850, 671, 784, 631, 792, 845, 902, 686, 470, 634, 712, 471, 692, 741, 851, 825, 903, 687, 416, 484, 254, 445, 376, 474, 906, 796, 486, 635, 745, 853, 961, 866, 907, 716, 694, 808, 475, 798, 637, 695, 432, 718, 576, 799, 812, 867, 380, 487, 698, 914, 255, 724, 909, 857, 719, 477, 814, 608, 490, 699, 753, 840, 915, 726, 869, 820, 815, 440, 491, 624, 382, 464, 383, 498, 672, 930, 844, 740, 917, 822, 727, 632, 701, 873, 931, 921, 881, 730, 444, 493, 499, 446, 472, 962, 933, 823, 742, 846, 731, 447, 688, 904, 636, 826, 743, 852, 847, 733, 963, 937, 827, 746, 476, 501, 638, 488, 505, 800, 696, 854, 908, 868, 855, 747, 910, 829, 858, 754, 720, 916, 870, 700, 749, 639, 816, 965, 945, 755, 859, 911, 256, 478, 492, 479, 728, 918, 871, 494, 874, 702, 969, 500, 861, 495, 932, 919, 757, 922, 875, 732, 934, 882, 824, 703, 502, 923, 384, 744, 761, 877, 977, 848, 935, 828, 734, 883, 938, 964, 925, 748, 735, 856, 885, 939, 993, 448, 503, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 950, 1001, 974, 893, 510, 951, 864, 760, 511, 980, 954, 764, 975, 1009, 955, 880, 982, 983, 928, 996, 766, 957, 888, 986, 998, 987, 944, 892, 999, 767, 989, 1002, 952, 1003, 894, 976, 895, 1010, 956, 1005, 1011, 958, 984, 959, 988, 1013, 1000, 1017, 512, 768, 990, 1004, 991, 1006, 1012, 1007, 1014, 896, 960, 1015, 1018, 1019, 992, 1021, 1008, 1016, 1020, 1022, 1023, 1024];

sequence S10: [1, 2, 3, 5, 9, 17, 33, 4, 257, 513, 6, 65, 7, 10, 11, 18, 129, 13, 19, 34, 21, 35, 25, 37, 66, 258, 8, 67, 41, 12, 69, 130, 514, 14, 49, 20, 73, 131, 15, 259, 22, 133, 36, 81, 23, 26, 137, 38, 27, 515, 261, 97, 39, 68, 42, 145, 29, 70, 43, 265, 50, 71, 161, 517, 45, 74, 132, 273, 16, 51, 75, 134, 53, 82, 289, 521, 24, 193, 77, 135, 83, 138, 260, 57, 28, 98, 529, 139, 262, 40, 85, 146, 30, 99, 321, 545, 141, 44, 89, 147, 263, 31, 101, 72, 516, 162, 266, 46, 149, 52, 105, 267, 769, 163, 47, 76, 274, 153, 54, 165, 518, 194, 385, 78, 113, 136, 269, 577, 55, 84, 58, 275, 195, 79, 519, 169, 290, 140, 86, 59, 277, 522, 197, 100, 291, 87, 142, 523, 177, 281, 61, 90, 293, 148, 530, 32, 201, 322, 102, 143, 641, 264, 91, 150, 323, 525, 103, 106, 164, 297, 209, 531, 48, 268, 93, 151, 546, 325, 154, 107, 386, 533, 166, 114, 270, 155, 56, 547, 305, 225, 109, 537, 276, 167, 196, 329, 549, 80, 115, 387, 170, 578, 271, 157, 60, 278, 770, 198, 171, 389, 520, 117, 292, 88, 178, 579, 337, 62, 199, 553, 279, 173, 282, 202, 524, 121, 393, 144, 581, 294, 179, 283, 642, 63, 92, 353, 526, 203, 295, 104, 561, 181, 324, 210, 532, 298, 94, 401, 585, 152, 205, 285, 643, 108, 326, 211, 527, 299, 95, 771, 306, 185, 156, 534, 327, 226, 417, 645, 110, 301, 548, 168, 330, 213, 593, 388, 116, 535, 272, 158, 307, 538, 111, 649, 331, 172, 390, 550, 217, 309, 539, 118, 338, 773, 159, 280, 609, 229, 449, 200, 551, 333, 119, 580, 391, 174, 554, 122, 180, 657, 339, 64, 541, 394, 233, 582, 313, 175, 284, 555, 204, 354, 777, 123, 395, 562, 182, 296, 583, 341, 673, 206, 402, 557, 241, 286, 586, 125, 355, 644, 183, 397, 785, 212, 300, 528, 96, 345, 563, 186, 403, 587, 207, 646, 287, 357, 565, 214, 328, 594, 187, 801, 418, 536, 302, 112, 705, 405, 589, 308, 215, 647, 361, 189, 595, 419, 650, 218, 303, 772, 332, 160, 569, 409, 540, 230, 310, 610, 421, 651, 219, 450, 774, 120, 552, 334, 231, 597, 369, 658, 392, 542, 234, 311, 611, 340, 833, 176, 314, 653, 221, 556, 451, 335, 601, 124, 659, 425, 775, 235, 396, 543, 342, 613, 242, 584, 315, 674, 453, 126, 778, 356, 558, 343, 661, 184, 398, 564, 237, 617, 433, 779, 675, 208, 346, 559, 404, 588, 243, 786, 288, 665, 457, 566, 127, 677, 358, 399, 706, 188, 897, 347, 590, 406, 625, 245, 648, 359, 781, 362, 567, 216, 596, 420, 570, 465, 190, 787, 304, 707, 349, 591, 407, 681, 249, 802, 410, 652, 363, 598, 191, 571, 422, 789, 370, 709, 220, 612, 411, 803, 312, 599, 481, 654, 232, 689, 365, 793, 423, 222, 452, 573, 336, 602, 371, 805, 236, 660, 426, 544, 413, 713, 316, 834, 223, 614, 454, 655, 427, 776, 238, 603, 373, 662, 344, 835, 434, 615, 244, 618, 676, 809, 455, 721, 429, 560, 128, 780, 458, 605, 377, 663, 400, 837, 435, 666, 239, 619, 319, 898, 678, 348, 626, 459, 782, 246, 667, 360, 568, 437, 817, 737, 466, 621, 247, 788, 350, 679, 408, 708, 461, 841, 592, 364, 627, 250, 899, 467, 682, 783, 351, 669, 441, 572, 412, 790, 192, 710, 683, 482, 901, 366, 629, 804, 424, 600, 469, 690, 251, 849, 574, 372, 711, 414, 791, 685, 483, 794, 367, 714, 428, 633, 905, 253, 656, 473, 806, 691, 374, 795, 415, 575, 604, 485, 865, 715, 224, 807, 456, 616, 693, 375, 836, 430, 722, 810, 378, 606, 913, 436, 664, 320, 717, 797, 240, 620, 838, 489, 723, 431, 811, 607, 460, 818, 697, 379, 668, 839, 438, 738, 462, 929, 622, 248, 813, 680, 497, 842, 725, 381, 900, 628, 439, 784, 670, 468, 819, 739, 352, 623, 442, 843, 684, 252, 902, 729, 463, 821, 630, 850, 470, 671, 792, 443, 741, 961, 484, 712, 845, 368, 631, 903, 471, 686, 634, 445, 692, 851, 474, 576, 906, 745, 254, 825, 687, 416, 796, 716, 486, 866, 635, 907, 475, 694, 808, 376, 853, 718, 487, 914, 753, 798, 490, 637, 867, 432, 695, 909, 724, 477, 812, 608, 380, 857, 698, 915, 255, 719, 799, 869, 491, 726, 840, 699, 498, 930, 740, 382, 814, 624, 917, 440, 820, 727, 873, 493, 701, 931, 730, 464, 815, 844, 672, 499, 921, 742, 822, 383, 933, 731, 962, 444, 632, 846, 743, 881, 501, 904, 746, 823, 472, 852, 688, 826, 446, 733, 963, 847, 636, 256, 937, 747, 908, 505, 854, 754, 827, 965, 447, 638, 868, 855, 696, 476, 910, 749, 945, 829, 488, 720, 858, 916, 478, 755, 800, 969, 639, 870, 492, 911, 700, 859, 918, 479, 757, 871, 874, 728, 494, 932, 977, 702, 816, 861, 500, 919, 761, 922, 875, 703, 384, 934, 882, 732, 923, 495, 824, 993, 744, 877, 935, 734, 502, 964, 848, 883, 748, 938, 503, 925, 828, 735, 966, 939, 750, 506, 885, 856, 946, 756, 830, 967, 448, 941, 640, 970, 889, 912, 947, 507, 751, 831, 860, 971, 758, 872, 949, 509, 978, 759, 862, 920, 973, 876, 762, 480, 979, 863, 953, 924, 704, 994, 878, 936, 496, 981, 763, 884, 926, 995, 879, 940, 765, 504, 985, 886, 927, 997, 736, 968, 887, 942, 890, 948, 508, 832, 752, 1001, 943, 972, 891, 950, 974, 760, 1009, 893, 510, 951, 980, 864, 954, 764, 975, 982, 955, 996, 880, 983, 957, 986, 511, 766, 928, 998, 987, 888, 999, 1002, 944, 989, 892, 767, 1003, 1010, 894, 952, 1005, 976, 512, 1011, 895, 956, 1013, 984, 958, 768, 1017, 959, 988, 1000, 990, 1004, 991, 1006, 1012, 896, 1007, 1014, 1015, 1018, 960, 1019, 1021, 992, 1008, 1016, 1020, 1022, 1023, 1024];

sequence S11: [1, 2, 3, 5, 9, 17, 4, 33, 6, 7, 65, 10, 11, 18, 13, 19, 129, 34, 21, 35, 25, 8, 37, 66, 257, 67, 12, 41, 69, 14, 20, 49, 130, 15, 73, 131, 22, 513, 36, 23, 133, 81, 26, 38, 27, 258, 137, 39, 68, 97, 42, 259, 29, 145, 43, 70, 261, 50, 71, 16, 45, 74, 51, 265, 132, 161, 514, 75, 24, 53, 134, 82, 515, 273, 77, 135, 83, 28, 57, 193, 138, 517, 40, 98, 85, 260, 139, 30, 289, 521, 146, 99, 44, 31, 262, 141, 89, 147, 72, 101, 46, 263, 529, 321, 52, 266, 162, 149, 47, 76, 105, 267, 163, 54, 516, 274, 153, 545, 78, 55, 269, 136, 165, 84, 113, 58, 194, 275, 518, 385, 79, 59, 195, 86, 140, 290, 169, 519, 277, 577, 522, 100, 87, 32, 291, 61, 197, 142, 90, 523, 281, 148, 177, 102, 264, 143, 293, 530, 91, 322, 201, 525, 150, 103, 48, 531, 106, 641, 323, 93, 268, 297, 164, 151, 209, 154, 546, 107, 533, 325, 56, 270, 166, 114, 276, 155, 547, 305, 386, 80, 109, 271, 537, 167, 115, 329, 60, 196, 225, 170, 520, 387, 278, 157, 549, 578, 769, 88, 117, 292, 171, 62, 198, 279, 389, 579, 337, 524, 282, 553, 178, 63, 199, 144, 294, 173, 92, 121, 202, 283, 581, 526, 179, 393, 104, 295, 532, 561, 642, 324, 203, 94, 353, 298, 527, 285, 152, 181, 585, 210, 108, 643, 534, 401, 95, 299, 326, 205, 211, 156, 548, 306, 185, 535, 110, 645, 327, 593, 301, 538, 168, 116, 330, 226, 307, 213, 388, 158, 550, 417, 111, 539, 770, 649, 331, 227, 118, 172, 280, 159, 551, 309, 390, 580, 338, 217, 609, 554, 771, 541, 119, 333, 64, 200, 229, 174, 391, 122, 657, 339, 284, 555, 313, 582, 449, 180, 394, 773, 296, 175, 562, 123, 204, 354, 233, 583, 341, 528, 395, 286, 557, 182, 586, 563, 777, 644, 402, 96, 673, 355, 125, 300, 206, 287, 183, 397, 587, 345, 212, 241, 186, 536, 403, 565, 646, 328, 207, 357, 594, 302, 785, 589, 308, 187, 214, 418, 112, 647, 405, 595, 303, 540, 569, 705, 650, 332, 361, 228, 215, 160, 552, 419, 310, 189, 218, 610, 597, 772, 651, 542, 409, 801, 120, 334, 230, 311, 392, 421, 658, 340, 219, 611, 369, 556, 314, 450, 543, 774, 653, 335, 601, 231, 176, 124, 659, 234, 315, 584, 451, 342, 221, 613, 396, 558, 425, 775, 833, 564, 778, 674, 356, 235, 126, 661, 343, 288, 559, 317, 453, 184, 398, 588, 346, 617, 242, 779, 404, 675, 566, 433, 127, 208, 358, 237, 399, 786, 665, 347, 590, 243, 457, 188, 567, 781, 648, 406, 677, 359, 596, 304, 625, 570, 706, 787, 362, 897, 591, 349, 216, 245, 420, 190, 407, 571, 707, 598, 465, 652, 410, 802, 681, 363, 789, 312, 191, 422, 220, 612, 370, 249, 599, 544, 411, 803, 573, 709, 654, 336, 365, 602, 232, 793, 423, 660, 689, 371, 316, 452, 222, 614, 481, 426, 776, 655, 413, 805, 603, 834, 713, 236, 662, 344, 223, 615, 373, 560, 427, 318, 454, 618, 835, 605, 780, 809, 676, 434, 128, 663, 238, 319, 455, 400, 721, 429, 666, 348, 619, 377, 244, 837, 568, 782, 435, 678, 360, 239, 626, 788, 667, 817, 898, 592, 350, 621, 246, 783, 408, 679, 437, 627, 841, 572, 708, 466, 737, 682, 364, 899, 790, 669, 351, 247, 461, 192, 250, 600, 467, 629, 412, 804, 683, 574, 441, 710, 791, 366, 901, 849, 794, 424, 690, 372, 251, 482, 575, 711, 469, 656, 414, 806, 685, 367, 604, 633, 714, 795, 691, 905, 224, 616, 483, 374, 253, 428, 415, 807, 836, 715, 606, 473, 865, 810, 797, 664, 693, 375, 320, 456, 485, 722, 430, 620, 378, 913, 607, 811, 838, 717, 436, 240, 723, 431, 668, 818, 697, 379, 460, 622, 489, 839, 784, 813, 680, 438, 628, 842, 738, 819, 725, 900, 670, 352, 929, 623, 381, 248, 462, 439, 843, 468, 739, 630, 497, 684, 442, 792, 671, 821, 902, 463, 850, 729, 252, 631, 845, 576, 443, 712, 470, 741, 686, 368, 903, 634, 851, 796, 825, 961, 692, 906, 484, 254, 471, 416, 808, 687, 445, 635, 716, 474, 866, 745, 853, 907, 798, 694, 376, 255, 486, 914, 608, 475, 867, 637, 812, 718, 799, 695, 909, 857, 487, 724, 432, 753, 698, 380, 915, 490, 840, 719, 477, 869, 814, 820, 699, 726, 930, 624, 491, 382, 917, 815, 440, 844, 873, 740, 498, 727, 672, 931, 822, 701, 383, 464, 493, 730, 921, 632, 846, 499, 444, 742, 823, 904, 933, 852, 731, 881, 826, 962, 847, 472, 743, 501, 688, 446, 636, 746, 827, 963, 854, 733, 908, 937, 256, 447, 476, 868, 747, 638, 505, 855, 800, 829, 965, 696, 910, 858, 488, 754, 916, 945, 639, 720, 478, 870, 749, 911, 859, 755, 969, 700, 492, 918, 479, 871, 816, 874, 861, 728, 757, 932, 702, 384, 919, 494, 977, 922, 875, 500, 824, 703, 934, 495, 732, 882, 761, 923, 848, 877, 744, 502, 935, 883, 828, 964, 734, 993, 938, 925, 503, 448, 748, 506, 856, 735, 885, 939, 830, 966, 946, 640, 507, 750, 831, 967, 912, 941, 860, 889, 756, 970, 947, 480, 872, 751, 509, 971, 862, 758, 920, 949, 978, 876, 863, 759, 973, 704, 496, 762, 979, 924, 953, 878, 936, 884, 763, 994, 981, 926, 879, 504, 736, 995, 886, 765, 940, 927, 985, 508, 887, 832, 968, 997, 942, 890, 948, 752, 510, 943, 891, 972, 1001, 950, 511, 864, 893, 760, 974, 951, 980, 1009, 954, 975, 764, 955, 982, 880, 996, 766, 983, 928, 957, 986, 888, 767, 998, 987, 999, 944, 892, 1002, 989, 512, 1003, 894, 952, 1010, 895, 976, 1005, 1011, 956, 984, 1013, 958, 768, 959, 988, 1017, 1000, 990, 1004, 991, 896, 1006, 1012, 1007, 1014, 1015, 960, 1018, 1019, 992, 1021, 1008, 1016, 1020, 1022, 1023, 1024];

sequence S12: [1, 2, 3, 5, 9, 17, 4, 33, 6, 7, 10, 65, 11, 18, 13, 19, 129, 21, 34, 35, 25, 8, 37, 66, 257, 12, 67, 41, 14, 69, 20, 49, 15, 130, 73, 22, 131, 23, 36, 513, 133, 26, 81, 38, 27, 137, 39, 258, 29, 68, 42, 97, 259, 43, 145, 70, 261, 50, 16, 71, 45, 74, 51, 265, 132, 161, 75, 24, 53, 514, 134, 82, 77, 515, 273, 135, 28, 83, 57, 138, 40, 193, 517, 30, 85, 98, 139, 260, 289, 31, 44, 521, 99, 146, 141, 89, 262, 147, 72, 46, 101, 263, 52, 529, 47, 266, 149, 321, 162, 76, 105, 54, 267, 163, 153, 78, 55, 516, 274, 545, 269, 136, 84, 165, 58, 113, 79, 275, 194, 518, 59, 385, 86, 140, 195, 169, 519, 277, 290, 32, 87, 61, 522, 100, 577, 142, 291, 197, 90, 523, 281, 148, 177, 102, 143, 91, 264, 293, 530, 48, 201, 525, 103, 150, 322, 93, 531, 106, 268, 151, 323, 297, 164, 641, 107, 154, 56, 209, 533, 546, 270, 325, 166, 114, 155, 80, 276, 109, 547, 305, 271, 167, 60, 386, 537, 115, 157, 329, 196, 170, 520, 278, 225, 549, 387, 88, 62, 117, 578, 171, 279, 292, 198, 769, 63, 524, 389, 282, 579, 337, 553, 178, 144, 199, 92, 173, 121, 294, 283, 202, 526, 179, 104, 581, 393, 295, 94, 532, 203, 561, 527, 285, 152, 324, 298, 181, 353, 642, 95, 108, 585, 210, 534, 299, 205, 643, 401, 326, 156, 211, 185, 535, 110, 548, 306, 272, 327, 301, 168, 645, 538, 116, 593, 111, 158, 330, 307, 213, 226, 550, 388, 539, 417, 118, 159, 331, 172, 280, 649, 227, 551, 309, 770, 64, 217, 390, 541, 119, 580, 338, 554, 609, 333, 200, 771, 174, 229, 122, 391, 284, 339, 555, 313, 180, 657, 582, 175, 394, 123, 296, 449, 773, 204, 562, 528, 286, 233, 583, 341, 557, 182, 354, 395, 96, 125, 586, 563, 287, 300, 206, 777, 183, 355, 644, 402, 673, 397, 587, 345, 212, 186, 536, 241, 207, 565, 403, 328, 302, 357, 646, 594, 187, 112, 589, 308, 214, 785, 303, 647, 540, 405, 418, 595, 569, 160, 332, 215, 189, 361, 650, 228, 552, 310, 705, 419, 218, 542, 120, 597, 610, 651, 409, 772, 801, 334, 311, 772, 230, 801, 219, 392, 543, 340, 556, 421, 314, 611, 369, 658, 335, 176, 653, 231, 124, 450, 601, 774, 315, 221, 659, 234, 584, 342, 558, 396, 613, 451, 425, 775, 126, 564, 288, 235, 343, 559, 317, 778, 184, 356, 661, 833, 674, 398, 127, 588, 453, 346, 617, 242, 208, 566, 779, 404, 237, 675, 433, 358, 399, 347, 188, 665, 590, 243, 567, 786, 304, 457, 781, 359, 648, 406, 596, 677, 570, 625, 591, 349, 216, 787, 190, 362, 245, 706, 407, 420, 571, 897, 598, 191, 363, 652, 410, 312, 707, 465, 681, 789, 802, 220, 544, 249, 422, 599, 573, 612, 370, 411, 336, 365, 654, 232, 803, 709, 602, 423, 316, 222, 793, 371, 660, 689, 614, 655, 413, 452, 426, 603, 776, 481, 805, 223, 236, 344, 560, 318, 713, 615, 373, 834, 427, 128, 454, 605, 618, 319, 780, 835, 238, 809, 676, 434, 400, 455, 348, 429, 619, 377, 666, 244, 568, 721, 239, 458, 782, 435, 360, 837, 678, 626, 667, 592, 350, 788, 621, 246, 459, 817, 783, 408, 679, 572, 437, 898, 627, 351, 192, 364, 669, 841, 247, 708, 466, 682, 790, 737, 461, 899, 250, 600, 574, 412, 629, 467, 683, 441, 791, 366, 804, 710, 251, 424, 575, 901, 794, 372, 849, 690, 367, 656, 414, 711, 604, 469, 685, 482, 575, 806, 224, 795, 253, 714, 691, 616, 374, 415, 428, 905, 483, 807, 606, 320, 715, 473, 797, 375, 664, 836, 810, 693, 865, 456, 430, 607, 620, 485, 378, 722, 240, 811, 717, 436, 913, 838, 431, 379, 668, 723, 697, 622, 460, 818, 784, 489, 839, 813, 680, 438, 628, 352, 623, 381, 670, 842, 248, 819, 725, 738, 462, 439, 900, 929, 630, 671, 843, 468, 684, 442, 792, 739, 497, 463, 821, 252, 576, 729, 902, 631, 850, 443, 368, 845, 712, 470, 686, 741, 634, 903, 796, 851, 254, 825, 692, 416, 471, 687, 445, 906, 484, 635, 808, 961, 255, 716, 474, 798, 376, 745, 853, 694, 866, 907, 608, 486, 637, 475, 799, 812, 718, 695, 867, 914, 432, 909, 487, 380, 857, 724, 698, 753, 719, 477, 915, 490, 840, 814, 869, 699, 624, 382, 820, 726, 491, 815, 440, 917, 930, 383, 672, 844, 727, 701, 873, 740, 498, 464, 822, 493, 931, 730, 632, 444, 921, 846, 499, 823, 742, 731, 904, 852, 933, 826, 881, 847, 472, 688, 446, 743, 636, 501, 962, 256, 827, 733, 746, 854, 447, 908, 963, 937, 638, 476, 800, 747, 505, 855, 829, 696, 868, 910, 488, 639, 965, 858, 754, 720, 478, 916, 749, 945, 870, 911, 859, 700, 755, 479, 492, 816, 969, 871, 918, 384, 861, 728, 702, 874, 757, 919, 494, 932, 703, 875, 922, 500, 824, 977, 495, 732, 761, 934, 882, 923, 848, 877, 744, 502, 935, 828, 734, 883, 448, 925, 503, 964, 938, 993, 735, 748, 506, 856, 830, 885, 939, 640, 966, 507, 831, 750, 946, 912, 967, 860, 941, 889, 756, 480, 751, 509, 970, 947, 872, 862, 758, 971, 920, 949, 863, 704, 876, 759, 978, 496, 973, 762, 924, 979, 953, 878, 763, 936, 884, 879, 926, 504, 981, 994, 736, 765, 886, 927, 940, 995, 508, 832, 985, 887, 968, 942, 997, 890, 752, 510, 948, 943, 891, 511, 972, 1001, 950, 864, 893, 760, 974, 951, 980, 954, 1009, 975, 764, 955, 880, 982, 766, 928, 983, 957, 996, 767, 986, 888, 998, 987, 944, 999, 892, 512, 989, 1002, 894, 1003, 952, 895, 1010, 976, 1005, 956, 1011, 984, 958, 1013, 768, 959, 988, 1017, 1000, 990, 991, 1004, 896, 1006, 1012, 1007, 1014, 960, 1015, 1018, 1019, 992, 1021, 1008, 1016, 1020, 1022, 1023, 1024];

sequence S13: [1, 2, 3, 5, 9, 17, 33, 4, 6, 513, 65, 7, 10, 11, 129, 18, 13, 19, 34, 257, 21, 35, 25, 66, 37, 67, 8, 41, 130, 12, 69, 49, 514, 14, 131, 20, 15, 73, 258, 22, 133, 23, 81, 36, 259, 26, 137, 97, 261, 515, 38, 145, 27, 39, 265, 68, 29, 42, 161, 43, 45, 50, 70, 517, 273, 193, 16, 71, 132, 74, 51, 289, 24, 75, 53, 521, 134, 82, 321, 77, 135, 28, 57, 83, 138, 260, 529, 40, 98, 385, 30, 85, 139, 262, 146, 545, 31, 99, 44, 89, 141, 263, 147, 101, 516, 266, 72, 46, 162, 52, 149, 47, 518, 105, 267, 163, 274, 76, 54, 153, 577, 113, 269, 194, 165, 275, 78, 519, 55, 136, 58, 84, 195, 290, 522, 79, 169, 277, 59, 86, 61, 523, 87, 140, 100, 197, 90, 641, 291, 281, 142, 177, 91, 102, 530, 148, 143, 32, 103, 264, 525, 48, 322, 293, 201, 531, 323, 150, 297, 93, 106, 546, 209, 268, 386, 325, 769, 305, 164, 151, 56, 533, 107, 154, 225, 387, 329, 547, 270, 114, 80, 537, 166, 109, 155, 276, 578, 60, 271, 115, 167, 549, 88, 196, 62, 157, 579, 170, 278, 292, 520, 279, 198, 171, 117, 553, 178, 282, 92, 642, 63, 144, 389, 294, 524, 199, 104, 337, 581, 173, 283, 202, 561, 121, 179, 295, 526, 94, 152, 324, 643, 393, 298, 203, 532, 108, 285, 181, 527, 210, 95, 205, 585, 299, 353, 326, 770, 185, 211, 534, 401, 306, 301, 645, 110, 156, 327, 535, 116, 111, 593, 168, 213, 307, 548, 330, 158, 771, 226, 118, 172, 538, 331, 227, 649, 388, 309, 217, 609, 417, 338, 773, 159, 272, 550, 119, 280, 657, 333, 390, 174, 539, 122, 200, 551, 180, 229, 777, 339, 313, 580, 391, 175, 541, 394, 284, 554, 123, 233, 341, 673, 449, 354, 555, 395, 204, 557, 182, 296, 562, 286, 582, 125, 183, 785, 206, 64, 705, 287, 300, 528, 355, 186, 583, 402, 212, 644, 397, 345, 586, 207, 302, 563, 96, 801, 187, 241, 536, 328, 403, 587, 214, 565, 357, 308, 646, 303, 112, 594, 160, 833, 418, 332, 589, 228, 405, 647, 310, 540, 215, 120, 569, 189, 361, 595, 419, 650, 409, 369, 772, 218, 552, 450, 421, 610, 311, 897, 230, 334, 542, 219, 597, 176, 651, 392, 124, 774, 314, 658, 231, 340, 543, 335, 611, 221, 451, 556, 425, 601, 315, 653, 234, 126, 775, 288, 659, 184, 613, 342, 778, 396, 356, 584, 343, 558, 235, 674, 398, 317, 564, 346, 661, 242, 559, 208, 617, 404, 358, 779, 188, 675, 237, 786, 127, 588, 304, 566, 453, 665, 433, 243, 625, 347, 781, 399, 706, 216, 677, 406, 787, 359, 590, 362, 567, 190, 648, 457, 570, 349, 420, 596, 407, 707, 245, 802, 410, 591, 363, 681, 220, 789, 422, 571, 370, 598, 312, 573, 191, 599, 411, 652, 232, 612, 249, 709, 365, 602, 465, 803, 336, 793, 423, 316, 222, 654, 371, 689, 426, 603, 452, 614, 413, 660, 236, 655, 223, 544, 344, 615, 373, 776, 427, 560, 481, 834, 454, 805, 318, 713, 238, 835, 434, 662, 809, 348, 605, 319, 618, 455, 721, 244, 780, 429, 898, 400, 837, 360, 817, 239, 676, 377, 663, 458, 568, 619, 435, 666, 350, 737, 246, 899, 459, 841, 408, 782, 626, 128, 592, 364, 678, 351, 621, 247, 667, 437, 788, 572, 466, 783, 412, 627, 461, 679, 600, 250, 708, 366, 574, 467, 669, 424, 682, 790, 192, 804, 372, 791, 710, 441, 683, 251, 629, 414, 690, 794, 367, 604, 469, 575, 656, 482, 901, 374, 806, 428, 711, 616, 415, 849, 253, 685, 795, 224, 714, 375, 633, 691, 483, 807, 606, 430, 664, 456, 836, 905, 473, 810, 378, 715, 620, 436, 797, 693, 320, 722, 240, 607, 717, 431, 811, 865, 485, 838, 460, 697, 723, 379, 913, 818, 438, 813, 622, 489, 668, 462, 839, 628, 381, 623, 680, 439, 725, 819, 352, 842, 670, 248, 738, 630, 468, 684, 843, 442, 739, 252, 900, 821, 463, 729, 929, 497, 850, 671, 784, 443, 631, 792, 368, 845, 902, 470, 686, 634, 471, 712, 692, 416, 741, 851, 484, 825, 903, 254, 687, 906, 796, 445, 635, 745, 376, 853, 961, 474, 866, 907, 716, 486, 694, 808, 475, 798, 637, 432, 695, 718, 576, 380, 799, 812, 487, 867, 698, 914, 255, 724, 909, 477, 857, 719, 814, 490, 608, 699, 753, 440, 840, 915, 726, 491, 869, 820, 382, 815, 624, 672, 464, 930, 844, 740, 383, 917, 822, 727, 498, 632, 701, 873, 444, 931, 921, 881, 493, 730, 962, 933, 499, 823, 742, 846, 731, 446, 688, 904, 636, 472, 826, 743, 852, 447, 847, 733, 963, 937, 476, 827, 746, 638, 501, 800, 696, 854, 908, 488, 868, 855, 747, 910, 505, 829, 858, 754, 720, 256, 916, 870, 700, 478, 749, 639, 816, 965, 945, 492, 755, 859, 911, 728, 479, 918, 871, 874, 702, 494, 969, 861, 932, 919, 757, 500, 922, 875, 732, 934, 882, 495, 824, 703, 923, 744, 502, 761, 877, 977, 848, 935, 828, 384, 734, 883, 938, 964, 925, 448, 748, 735, 856, 885, 939, 993, 503, 966, 830, 750, 946, 860, 831, 506, 967, 756, 941, 912, 872, 751, 507, 889, 970, 947, 862, 758, 971, 920, 480, 640, 876, 863, 759, 949, 978, 924, 509, 973, 762, 878, 979, 936, 704, 884, 953, 496, 763, 926, 879, 981, 994, 886, 940, 927, 504, 765, 736, 887, 995, 942, 968, 985, 890, 948, 832, 508, 752, 943, 997, 972, 891, 950, 1001, 974, 893, 951, 864, 510, 760, 980, 954, 764, 975, 1009, 955, 880, 982, 983, 928, 996, 766, 511, 957, 888, 986, 998, 987, 944, 892, 999, 767, 989, 1002, 952, 1003, 894, 976, 895, 1010, 512, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024];

sequence S14: [1, 2, 5, 9, 3, 17, 33, 7, 65, 513, 4, 13, 6, 19, 129, 10, 34, 18, 11, 37, 67, 25, 257, 21, 66, 35, 8, 130, 41, 12, 73, 133, 514, 20, 49, 69, 14, 258, 15, 22, 131, 27, 81, 36, 259, 39, 137, 97, 23, 517, 38, 26, 68, 265, 42, 145, 29, 70, 261, 50, 75, 161, 43, 521, 135, 71, 45, 82, 273, 16, 51, 132, 193, 74, 24, 515, 138, 53, 289, 77, 134, 83, 28, 98, 260, 40, 529, 57, 139, 85, 30, 146, 262, 44, 321, 545, 99, 141, 266, 31, 89, 147, 263, 101, 519, 162, 72, 46, 274, 52, 149, 267, 577, 47, 76, 105, 165, 194, 54, 163, 516, 385, 269, 78, 153, 55, 86, 525, 290, 113, 275, 58, 79, 136, 518, 195, 84, 291, 169, 277, 87, 531, 59, 140, 323, 197, 102, 641, 61, 148, 177, 281, 100, 90, 522, 293, 142, 322, 201, 91, 546, 32, 143, 103, 264, 530, 48, 387, 106, 297, 209, 523, 154, 93, 150, 268, 549, 164, 325, 114, 151, 579, 166, 56, 305, 107, 276, 537, 270, 386, 155, 769, 80, 109, 225, 167, 533, 60, 170, 115, 196, 578, 329, 271, 278, 88, 547, 157, 117, 389, 520, 337, 292, 279, 198, 642, 62, 178, 171, 553, 92, 282, 202, 199, 524, 63, 144, 295, 585, 173, 393, 104, 645, 121, 294, 283, 532, 353, 179, 203, 561, 324, 298, 94, 581, 108, 152, 210, 526, 285, 181, 401, 770, 95, 205, 299, 527, 327, 156, 534, 306, 110, 326, 643, 211, 185, 226, 539, 168, 301, 593, 116, 388, 330, 548, 111, 417, 771, 213, 272, 118, 551, 307, 158, 649, 227, 172, 331, 609, 338, 390, 535, 309, 217, 550, 122, 391, 538, 159, 280, 333, 580, 119, 174, 777, 339, 180, 554, 200, 354, 657, 284, 313, 541, 449, 229, 582, 394, 123, 182, 773, 233, 296, 562, 175, 395, 587, 64, 204, 673, 355, 555, 402, 341, 647, 125, 286, 583, 183, 300, 557, 241, 212, 594, 287, 345, 785, 397, 206, 528, 96, 419, 563, 186, 644, 214, 403, 705, 308, 328, 586, 357, 536, 207, 187, 650, 302, 112, 565, 303, 801, 361, 228, 589, 418, 160, 646, 405, 595, 310, 215, 540, 450, 332, 610, 120, 772, 218, 189, 552, 230, 569, 334, 409, 651, 311, 597, 340, 421, 542, 219, 658, 369, 774, 124, 231, 556, 176, 833, 392, 314, 611, 242, 653, 451, 335, 778, 221, 543, 342, 601, 425, 315, 659, 184, 775, 234, 613, 356, 674, 126, 288, 584, 396, 558, 235, 786, 317, 346, 564, 188, 661, 453, 779, 404, 559, 343, 398, 588, 208, 617, 237, 677, 433, 706, 347, 566, 362, 675, 127, 243, 897, 358, 781, 406, 590, 216, 665, 399, 567, 304, 598, 359, 802, 420, 625, 457, 787, 349, 190, 570, 245, 591, 411, 648, 220, 707, 312, 596, 363, 803, 465, 681, 407, 789, 422, 599, 232, 571, 249, 652, 370, 835, 191, 709, 410, 614, 316, 573, 365, 660, 423, 336, 222, 689, 452, 793, 371, 612, 426, 602, 236, 805, 344, 654, 413, 834, 481, 713, 223, 603, 318, 544, 454, 655, 427, 615, 373, 776, 434, 560, 238, 899, 618, 348, 809, 244, 721, 455, 666, 319, 605, 377, 662, 429, 780, 239, 676, 360, 837, 459, 626, 400, 663, 678, 246, 568, 435, 817, 458, 619, 350, 788, 466, 782, 898, 364, 667, 408, 592, 128, 621, 247, 737, 437, 679, 572, 351, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 430, 575, 656, 253, 807, 415, 685, 905, 374, 616, 483, 633, 806, 224, 795, 865, 428, 691, 473, 715, 836, 456, 810, 378, 606, 620, 436, 664, 722, 320, 797, 431, 693, 913, 240, 607, 717, 462, 811, 485, 839, 668, 379, 818, 622, 438, 838, 723, 248, 697, 381, 738, 680, 460, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 446, 672, 917, 822, 464, 727, 962, 844, 491, 632, 730, 701, 383, 742, 846, 921, 472, 823, 852, 933, 731, 498, 881, 636, 743, 444, 688, 904, 826, 476, 754, 963, 847, 733, 501, 854, 937, 827, 447, 696, 746, 868, 638, 488, 800, 908, 747, 829, 494, 858, 700, 965, 916, 478, 855, 910, 720, 505, 749, 945, 859, 874, 639, 479, 755, 870, 918, 728, 500, 911, 816, 871, 932, 256, 969, 861, 702, 757, 923, 492, 732, 824, 875, 977, 919, 503, 934, 744, 761, 882, 495, 703, 922, 828, 877, 935, 848, 506, 734, 964, 883, 938, 748, 384, 856, 925, 993, 735, 830, 966, 502, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024];

sequence S15: [1, 2, 3, 5, 9, 17, 33, 4, 6, 65, 7, 10, 11, 129, 18, 13, 19, 34, 257, 21, 35, 25, 66, 37, 67, 513, 8, 12, 130, 41, 69, 14, 20, 131, 49, 15, 73, 258, 22, 133, 36, 81, 23, 259, 26, 137, 38, 261, 97, 145, 27, 514, 39, 515, 265, 68, 42, 29, 161, 70, 43, 517, 50, 71, 273, 193, 521, 529, 45, 16, 132, 74, 51, 289, 545, 24, 75, 53, 134, 82, 321, 77, 135, 28, 57, 83, 138, 260, 40, 98, 385, 30, 85, 139, 262, 146, 31, 99, 516, 44, 89, 141, 263, 147, 101, 266, 72, 46, 162, 518, 577, 519, 52, 149, 522, 47, 76, 267, 163, 274, 523, 641, 105, 54, 153, 78, 269, 194, 165, 275, 55, 84, 530, 525, 531, 136, 58, 113, 195, 290, 79, 169, 277, 59, 86, 61, 87, 140, 100, 197, 90, 291, 281, 546, 769, 142, 177, 91, 102, 148, 143, 533, 547, 537, 32, 103, 264, 48, 322, 293, 201, 323, 578, 150, 297, 93, 106, 209, 549, 579, 268, 386, 325, 305, 164, 151, 107, 56, 154, 225, 387, 329, 270, 114, 520, 553, 642, 80, 166, 109, 155, 276, 60, 271, 115, 167, 524, 581, 561, 157, 196, 170, 198, 171, 278, 292, 279, 117, 88, 62, 178, 282, 526, 643, 532, 527, 63, 92, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 64, 394, 284, 175, 233, 341, 449, 354, 395, 204, 123, 673, 555, 557, 562, 582, 296, 286, 182, 206, 125, 785, 705, 183, 287, 528, 583, 644, 586, 563, 300, 355, 212, 402, 186, 397, 345, 207, 302, 801, 96, 187, 241, 536, 587, 565, 646, 594, 328, 403, 357, 308, 303, 833, 589, 647, 112, 540, 569, 595, 650, 772, 228, 418, 332, 215, 405, 310, 189, 552, 610, 897, 160, 218, 361, 419, 409, 369, 230, 450, 421, 542, 597, 651, 774, 658, 311, 120, 334, 219, 543, 611, 176, 392, 231, 314, 124, 340, 335, 221, 451, 425, 315, 556, 601, 653, 234, 775, 659, 613, 235, 288, 453, 126, 342, 396, 778, 584, 558, 674, 356, 343, 564, 661, 559, 617, 779, 675, 184, 398, 433, 317, 346, 242, 208, 404, 358, 786, 188, 588, 566, 665, 625, 781, 237, 127, 243, 347, 399, 706, 216, 677, 787, 590, 567, 648, 406, 359, 304, 570, 596, 362, 707, 190, 457, 349, 465, 802, 420, 407, 245, 410, 591, 681, 789, 571, 598, 363, 573, 220, 422, 599, 652, 612, 709, 602, 803, 370, 793, 312, 191, 654, 689, 603, 411, 232, 249, 365, 336, 423, 614, 660, 655, 316, 222, 371, 426, 452, 413, 481, 236, 223, 344, 318, 544, 373, 615, 427, 776, 128, 454, 238, 560, 834, 805, 713, 835, 662, 809, 605, 618, 721, 780, 434, 898, 319, 455, 837, 817, 676, 663, 348, 429, 400, 377, 244, 239, 458, 435, 360, 568, 619, 666, 737, 899, 841, 782, 626, 350, 246, 459, 592, 678, 621, 667, 788, 572, 783, 627, 679, 408, 364, 351, 192, 247, 437, 466, 412, 461, 250, 366, 600, 708, 574, 669, 682, 790, 804, 791, 710, 683, 629, 441, 690, 794, 604, 575, 467, 424, 372, 251, 414, 367, 469, 482, 374, 656, 901, 806, 711, 428, 415, 253, 616, 849, 685, 795, 714, 633, 691, 807, 606, 483, 473, 224, 664, 836, 905, 810, 715, 620, 797, 693, 375, 485, 430, 456, 722, 607, 717, 811, 865, 838, 697, 723, 913, 818, 378, 436, 813, 320, 622, 240, 431, 460, 379, 668, 839, 489, 438, 628, 623, 462, 381, 439, 352, 497, 680, 725, 819, 842, 670, 738, 630, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 827, 746, 501, 488, 638, 505, 800, 696, 854, 908, 868, 855, 747, 910, 829, 858, 754, 720, 916, 870, 478, 700, 749, 639, 816, 965, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024];

sequence S16: [1, 2, 5, 9, 3, 17, 33, 7, 65, 513, 4, 13, 6, 19, 129, 10, 34, 18, 11, 25, 21, 35, 257, 66, 37, 8, 67, 130, 12, 41, 20, 133, 514, 14, 69, 49, 73, 258, 15, 22, 131, 81, 27, 36, 259, 137, 39, 97, 23, 517, 38, 26, 68, 265, 42, 145, 29, 70, 261, 50, 43, 161, 71, 521, 45, 75, 82, 132, 273, 193, 16, 51, 74, 53, 24, 515, 135, 138, 289, 77, 134, 83, 28, 98, 260, 40, 529, 57, 139, 85, 30, 146, 262, 44, 321, 545, 99, 141, 266, 31, 89, 147, 263, 72, 519, 162, 46, 101, 385, 149, 52, 47, 577, 76, 267, 54, 274, 165, 194, 105, 516, 163, 269, 78, 153, 275, 55, 525, 58, 113, 136, 86, 79, 290, 518, 195, 84, 291, 59, 277, 169, 531, 100, 140, 323, 197, 87, 641, 177, 61, 90, 281, 102, 148, 522, 293, 142, 322, 91, 143, 546, 32, 201, 103, 264, 530, 106, 387, 48, 297, 523, 209, 154, 93, 150, 268, 164, 537, 769, 533, 325, 151, 56, 166, 107, 305, 114, 578, 276, 549, 270, 386, 155, 80, 109, 225, 167, 60, 579, 170, 115, 196, 329, 271, 278, 157, 547, 88, 117, 389, 520, 337, 292, 279, 198, 642, 62, 178, 171, 553, 92, 282, 199, 63, 524, 144, 173, 295, 585, 202, 393, 104, 645, 121, 294, 283, 532, 353, 179, 203, 561, 324, 298, 94, 581, 152, 210, 181, 526, 285, 108, 401, 770, 95, 205, 299, 527, 327, 156, 534, 306, 110, 326, 643, 211, 116, 185, 539, 168, 301, 593, 226, 388, 330, 548, 111, 417, 771, 158, 272, 213, 551, 307, 118, 649, 172, 227, 331, 609, 338, 390, 535, 309, 217, 550, 159, 391, 538, 119, 280, 333, 580, 174, 122, 777, 339, 200, 554, 180, 657, 354, 284, 541, 313, 449, 582, 229, 394, 773, 123, 175, 673, 555, 785, 204, 562, 395, 182, 341, 583, 557, 64, 296, 286, 233, 125, 183, 206, 287, 300, 355, 212, 402, 186, 397, 587, 345, 594, 647, 528, 96, 563, 241, 644, 207, 705, 328, 586, 403, 536, 214, 357, 308, 419, 565, 801, 589, 187, 302, 646, 112, 569, 303, 595, 361, 228, 650, 772, 418, 540, 215, 405, 310, 189, 450, 332, 218, 610, 597, 552, 651, 160, 230, 120, 334, 409, 311, 421, 219, 542, 369, 658, 231, 774, 392, 176, 556, 314, 833, 340, 221, 611, 653, 335, 451, 778, 124, 543, 342, 601, 425, 234, 659, 235, 775, 315, 613, 126, 674, 356, 184, 584, 288, 558, 396, 564, 661, 242, 779, 559, 317, 346, 617, 675, 897, 404, 343, 398, 188, 453, 208, 433, 786, 237, 588, 566, 665, 781, 347, 362, 127, 243, 358, 706, 406, 677, 590, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 410, 652, 370, 835, 411, 709, 232, 614, 316, 573, 365, 660, 423, 336, 222, 689, 452, 793, 371, 612, 426, 602, 236, 805, 413, 654, 481, 834, 223, 713, 344, 603, 318, 544, 454, 655, 427, 615, 373, 776, 434, 560, 238, 899, 618, 348, 809, 244, 721, 455, 666, 319, 605, 377, 662, 429, 780, 239, 676, 360, 837, 400, 626, 246, 663, 678, 435, 568, 458, 817, 350, 619, 459, 788, 466, 782, 898, 364, 667, 408, 592, 128, 621, 437, 737, 351, 679, 572, 247, 682, 250, 627, 461, 708, 841, 412, 783, 366, 790, 441, 600, 424, 669, 629, 467, 901, 251, 849, 804, 372, 791, 192, 710, 482, 574, 690, 414, 683, 367, 604, 794, 469, 714, 374, 711, 253, 575, 656, 483, 807, 415, 685, 905, 375, 616, 224, 633, 806, 428, 795, 865, 430, 691, 473, 715, 836, 456, 810, 378, 606, 620, 436, 664, 722, 485, 797, 320, 693, 913, 431, 607, 717, 240, 811, 379, 839, 668, 438, 818, 622, 460, 838, 723, 248, 697, 381, 738, 680, 462, 813, 628, 489, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 826, 501, 688, 446, 933, 847, 636, 963, 733, 937, 476, 854, 827, 447, 746, 868, 638, 908, 800, 488, 696, 747, 829, 858, 754, 855, 916, 965, 478, 910, 720, 505, 749, 945, 639, 755, 870, 256, 911, 700, 859, 479, 918, 871, 728, 494, 874, 969, 932, 702, 816, 861, 500, 757, 492, 875, 732, 923, 824, 977, 919, 934, 744, 761, 882, 495, 703, 922, 877, 935, 828, 848, 734, 503, 883, 938, 384, 964, 748, 506, 856, 925, 993, 735, 502, 830, 966, 939, 885, 946, 750, 860, 756, 480, 967, 831, 889, 941, 751, 872, 507, 971, 912, 758, 947, 970, 862, 978, 448, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024];

sequence S17: [1, 2, 5, 9, 3, 17, 33, 7, 65, 513, 4, 13, 6, 19, 129, 10, 34, 18, 11, 257, 21, 35, 25, 66, 37, 8, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 161, 70, 50, 75, 43, 521, 273, 193, 71, 45, 132, 82, 16, 289, 51, 135, 74, 515, 24, 134, 321, 53, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 164, 268, 386, 325, 305, 537, 769, 533, 209, 154, 151, 107, 56, 166, 387, 578, 329, 549, 270, 114, 155, 80, 225, 167, 276, 109, 579, 271, 60, 115, 196, 157, 88, 547, 62, 278, 292, 520, 279, 117, 198, 178, 642, 171, 282, 92, 553, 202, 199, 389, 294, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 211, 185, 534, 401, 306, 301, 643, 156, 110, 327, 539, 116, 168, 593, 158, 111, 307, 548, 330, 213, 771, 226, 118, 172, 551, 331, 227, 649, 388, 309, 159, 609, 417, 338, 535, 217, 272, 550, 119, 280, 538, 333, 390, 174, 580, 122, 180, 777, 200, 229, 554, 339, 657, 313, 541, 391, 123, 582, 394, 284, 773, 233, 673, 555, 785, 175, 341, 705, 449, 562, 354, 801, 395, 204, 182, 528, 583, 557, 296, 286, 64, 125, 206, 241, 644, 586, 563, 287, 300, 355, 183, 402, 212, 397, 345, 587, 833, 565, 96, 186, 207, 328, 646, 536, 403, 214, 594, 357, 308, 419, 187, 589, 569, 302, 647, 228, 303, 897, 595, 361, 112, 650, 772, 418, 540, 215, 405, 310, 189, 450, 332, 160, 218, 610, 597, 552, 651, 230, 120, 334, 409, 542, 774, 611, 658, 311, 421, 601, 219, 369, 176, 653, 392, 231, 314, 340, 543, 335, 234, 556, 775, 124, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 350, 619, 128, 788, 246, 782, 898, 437, 667, 466, 592, 408, 621, 364, 737, 351, 679, 572, 247, 682, 250, 627, 461, 708, 841, 412, 783, 366, 790, 441, 600, 375, 669, 629, 424, 901, 467, 849, 804, 251, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 443, 845, 631, 475, 686, 851, 484, 692, 712, 380, 866, 796, 416, 825, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 844, 491, 632, 730, 701, 383, 742, 846, 921, 472, 823, 852, 731, 498, 881, 743, 444, 904, 688, 826, 501, 933, 847, 446, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 639, 755, 256, 969, 479, 384, 870, 492, 911, 816, 918, 728, 871, 874, 702, 932, 861, 500, 757, 732, 824, 923, 875, 977, 919, 503, 934, 744, 761, 882, 495, 703, 922, 848, 993, 448, 502, 877, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021, 1016, 1008, 1020, 1022, 1023, 1024];

sequence S18: [1, 2, 3, 5, 9, 17, 33, 4, 6, 65, 7, 10, 11, 129, 18, 13, 19, 34, 257, 21, 35, 25, 66, 37, 67, 513, 8, 12, 130, 41, 69, 14, 20, 131, 49, 15, 73, 258, 22, 133, 36, 81, 23, 259, 26, 137, 38, 261, 97, 145, 27, 514, 39, 515, 265, 68, 42, 29, 161, 70, 43, 517, 50, 71, 273, 45, 521, 529, 16, 132, 74, 193, 51, 289, 545, 24, 75, 53, 134, 82, 321, 77, 135, 28, 57, 83, 138, 260, 40, 98, 385, 85, 30, 139, 262, 146, 31, 99, 516, 44, 89, 141, 263, 147, 101, 266, 72, 46, 162, 518, 577, 519, 52, 149, 522, 47, 76, 267, 163, 274, 523, 641, 105, 54, 153, 78, 269, 194, 165, 275, 55, 84, 530, 525, 531, 136, 58, 113, 195, 290, 79, 169, 277, 59, 86, 100, 87, 140, 61, 197, 90, 291, 281, 546, 769, 142, 177, 91, 102, 148, 143, 533, 547, 537, 32, 103, 264, 106, 322, 293, 201, 323, 578, 150, 297, 48, 93, 209, 549, 579, 268, 386, 325, 305, 164, 151, 107, 56, 154, 225, 387, 329, 270, 114, 520, 553, 642, 80, 166, 109, 155, 276, 60, 271, 115, 167, 524, 581, 561, 157, 196, 170, 198, 171, 278, 292, 279, 117, 88, 62, 178, 282, 526, 643, 532, 527, 63, 92, 585, 770, 144, 389, 294, 199, 104, 337, 173, 283, 202, 121, 179, 295, 94, 534, 645, 535, 593, 548, 771, 152, 324, 393, 298, 203, 108, 285, 181, 210, 538, 95, 205, 299, 353, 649, 609, 326, 185, 211, 401, 306, 301, 110, 156, 327, 116, 111, 773, 550, 657, 539, 551, 168, 213, 307, 330, 158, 226, 118, 172, 331, 227, 388, 309, 217, 417, 338, 159, 777, 272, 580, 119, 541, 554, 280, 333, 390, 174, 122, 200, 180, 229, 339, 313, 391, 64, 394, 284, 175, 123, 341, 449, 354, 395, 233, 204, 673, 555, 557, 562, 582, 296, 286, 182, 206, 125, 785, 705, 183, 287, 528, 583, 644, 586, 563, 300, 355, 212, 402, 186, 397, 345, 207, 302, 801, 96, 187, 241, 536, 587, 565, 646, 594, 328, 403, 214, 357, 308, 303, 833, 589, 647, 112, 540, 569, 595, 650, 772, 228, 418, 332, 215, 405, 310, 189, 552, 610, 897, 160, 218, 361, 419, 409, 369, 230, 450, 421, 542, 597, 651, 774, 658, 311, 120, 334, 219, 543, 611, 231, 392, 234, 314, 176, 340, 335, 221, 451, 425, 315, 556, 601, 653, 124, 775, 659, 613, 235, 288, 453, 126, 342, 396, 778, 584, 558, 674, 356, 343, 564, 661, 559, 617, 779, 675, 184, 398, 433, 317, 346, 242, 208, 404, 358, 786, 188, 588, 566, 665, 625, 781, 237, 127, 243, 347, 399, 706, 216, 677, 787, 590, 567, 648, 406, 359, 304, 570, 596, 362, 707, 190, 457, 349, 465, 802, 420, 407, 245, 410, 591, 681, 789, 571, 598, 363, 573, 220, 422, 599, 652, 612, 709, 602, 803, 370, 793, 312, 191, 654, 689, 603, 411, 232, 249, 365, 336, 423, 614, 660, 655, 316, 222, 371, 426, 452, 413, 481, 236, 223, 344, 318, 544, 373, 615, 427, 776, 128, 454, 238, 560, 834, 805, 713, 835, 662, 809, 605, 618, 721, 780, 434, 898, 319, 455, 837, 817, 676, 663, 348, 429, 400, 377, 244, 239, 458, 435, 360, 568, 619, 666, 737, 899, 841, 782, 626, 350, 246, 459, 592, 678, 621, 667, 788, 572, 783, 627, 679, 408, 364, 351, 192, 247, 437, 466, 412, 461, 250, 366, 600, 708, 574, 669, 682, 790, 804, 791, 710, 683, 629, 441, 690, 794, 604, 575, 467, 424, 372, 251, 482, 414, 469, 367, 374, 656, 901, 806, 711, 428, 415, 253, 616, 849, 685, 795, 714, 633, 691, 807, 606, 483, 473, 224, 664, 836, 905, 810, 715, 620, 797, 693, 375, 485, 430, 456, 722, 607, 717, 811, 865, 838, 697, 723, 913, 818, 378, 436, 813, 320, 622, 240, 431, 460, 379, 668, 839, 489, 438, 628, 623, 462, 381, 439, 352, 497, 680, 725, 819, 842, 670, 738, 630, 468, 248, 442, 463, 470, 443, 252, 684, 843, 739, 900, 821, 729, 929, 850, 671, 784, 631, 792, 845, 902, 686, 368, 634, 712, 254, 692, 741, 851, 825, 903, 687, 471, 416, 484, 445, 376, 474, 906, 796, 486, 635, 745, 853, 961, 866, 907, 716, 694, 808, 475, 798, 637, 695, 255, 718, 576, 799, 812, 867, 432, 380, 698, 914, 487, 724, 909, 857, 719, 477, 814, 608, 490, 699, 753, 840, 915, 726, 869, 820, 815, 440, 491, 624, 382, 498, 493, 464, 672, 930, 844, 740, 917, 822, 727, 632, 701, 873, 931, 921, 881, 730, 383, 499, 444, 446, 472, 962, 933, 823, 742, 846, 731, 447, 688, 904, 636, 826, 743, 852, 847, 256, 476, 733, 963, 937, 827, 746, 501, 488, 638, 505, 800, 696, 854, 908, 868, 855, 747, 910, 829, 858, 754, 720, 916, 870, 478, 700, 749, 639, 816, 965, 945, 755, 859, 911, 492, 479, 728, 918, 871, 384, 494, 500, 874, 702, 969, 495, 861, 502, 932, 919, 757, 922, 875, 732, 977, 934, 882, 761, 824, 703, 923, 744, 877, 848, 935, 828, 734, 883, 448, 938, 503, 964, 925, 993, 748, 735, 856, 885, 939, 506, 966, 507, 830, 750, 946, 860, 831, 967, 756, 941, 912, 872, 751, 889, 480, 970, 947, 862, 758, 971, 509, 920, 640, 876, 863, 759, 949, 978, 924, 973, 762, 878, 979, 496, 936, 704, 884, 953, 763, 504, 926, 879, 981, 994, 886, 940, 927, 765, 736, 887, 995, 942, 968, 985, 508, 890, 948, 832, 752, 943, 997, 972, 891, 1001, 510, 950, 974, 893, 951, 864, 760, 1009, 511, 980, 954, 764, 975, 955, 880, 982, 983, 928, 996, 766, 957, 888, 986, 998, 987, 944, 892, 999, 767, 512, 989, 1002, 952, 1003, 894, 976, 895, 1010, 956, 1005, 1011, 958, 984, 959, 988, 1013, 1000, 1017, 768, 990, 1004, 991, 1006, 1012, 1007, 1014, 896, 960, 1015, 1018, 1019, 992, 1021, 1008, 1016, 1020, 1022, 1023, 1024];

sequence S19: [1, 2, 3, 5, 9, 17, 33, 4, 257, 513, 6, 65, 7, 10, 11, 129, 18, 13, 19, 34, 21, 35, 25, 66, 37, 258, 8, 130, 67, 12, 41, 69, 514, 20, 14, 131, 49, 15, 73, 259, 22, 133, 36, 23, 81, 26, 137, 38, 27, 515, 261, 97, 39, 68, 42, 145, 29, 70, 43, 265, 50, 161, 71, 517, 45, 193, 132, 273, 74, 51, 134, 82, 75, 16, 289, 521, 24, 53, 135, 77, 57, 83, 260, 28, 138, 98, 529, 40, 262, 85, 139, 30, 146, 44, 321, 545, 99, 89, 141, 31, 263, 147, 46, 72, 516, 101, 266, 162, 52, 149, 47, 267, 769, 76, 105, 163, 385, 54, 153, 78, 518, 194, 274, 165, 55, 84, 269, 577, 136, 58, 113, 275, 79, 195, 519, 59, 290, 169, 86, 140, 277, 522, 100, 87, 291, 197, 142, 523, 61, 281, 90, 102, 322, 148, 641, 177, 91, 293, 143, 201, 530, 264, 32, 150, 386, 525, 103, 106, 93, 323, 48, 531, 164, 268, 151, 209, 546, 297, 107, 154, 325, 533, 166, 56, 276, 114, 155, 547, 270, 80, 109, 537, 387, 225, 167, 305, 578, 60, 115, 271, 196, 549, 329, 170, 157, 278, 770, 88, 171, 389, 520, 117, 292, 198, 62, 642, 279, 178, 92, 579, 337, 199, 282, 144, 524, 63, 393, 121, 553, 294, 202, 283, 581, 173, 104, 353, 532, 179, 295, 94, 526, 203, 324, 181, 643, 298, 108, 401, 561, 152, 210, 285, 527, 95, 326, 205, 585, 299, 156, 771, 306, 211, 110, 534, 417, 168, 327, 645, 185, 301, 548, 116, 449, 226, 535, 388, 158, 593, 330, 111, 307, 538, 213, 118, 649, 390, 172, 338, 550, 227, 331, 539, 217, 272, 773, 159, 280, 609, 119, 309, 174, 551, 391, 122, 580, 333, 200, 554, 180, 229, 657, 313, 175, 541, 339, 123, 582, 284, 204, 394, 555, 64, 777, 182, 296, 562, 233, 341, 673, 395, 583, 125, 286, 557, 206, 402, 705, 183, 300, 644, 212, 785, 186, 345, 586, 241, 397, 563, 207, 287, 646, 96, 594, 403, 302, 587, 214, 328, 528, 187, 801, 357, 112, 536, 418, 228, 565, 308, 647, 405, 215, 589, 303, 189, 569, 332, 595, 218, 361, 772, 419, 230, 540, 310, 650, 160, 409, 610, 334, 552, 120, 450, 774, 219, 597, 421, 231, 651, 311, 542, 340, 234, 392, 556, 314, 833, 176, 369, 611, 124, 601, 335, 451, 653, 221, 543, 315, 775, 184, 425, 342, 558, 235, 584, 396, 613, 356, 126, 778, 343, 674, 453, 564, 242, 398, 661, 208, 559, 317, 779, 346, 588, 188, 358, 617, 404, 675, 237, 897, 433, 566, 347, 665, 127, 590, 399, 457, 706, 243, 786, 288, 677, 406, 567, 190, 596, 359, 781, 362, 648, 216, 570, 349, 625, 304, 245, 787, 420, 591, 407, 707, 465, 220, 802, 363, 681, 410, 598, 191, 652, 422, 789, 312, 612, 249, 599, 370, 803, 411, 709, 336, 654, 232, 573, 365, 793, 481, 222, 423, 602, 316, 614, 371, 834, 236, 660, 452, 689, 426, 603, 413, 805, 223, 655, 344, 713, 427, 776, 238, 544, 373, 662, 454, 898, 318, 615, 244, 618, 605, 434, 835, 348, 560, 455, 676, 239, 780, 400, 663, 319, 721, 377, 809, 458, 619, 128, 666, 429, 837, 678, 360, 568, 435, 788, 246, 626, 350, 667, 459, 782, 592, 437, 621, 247, 899, 364, 737, 408, 679, 466, 817, 351, 627, 250, 783, 461, 708, 841, 412, 682, 467, 669, 366, 790, 192, 600, 683, 424, 901, 441, 629, 804, 372, 710, 482, 574, 251, 791, 690, 414, 604, 367, 849, 711, 469, 794, 374, 656, 428, 575, 905, 253, 633, 483, 806, 714, 473, 795, 415, 685, 616, 375, 865, 691, 224, 807, 430, 606, 715, 378, 836, 456, 693, 810, 436, 620, 913, 485, 664, 431, 722, 797, 240, 607, 838, 379, 717, 460, 811, 668, 320, 818, 723, 438, 622, 929, 489, 680, 381, 839, 697, 248, 813, 628, 462, 961, 738, 439, 900, 468, 842, 623, 442, 819, 725, 497, 630, 463, 902, 684, 252, 850, 739, 352, 843, 729, 784, 470, 792, 443, 631, 821, 368, 686, 903, 484, 634, 845, 471, 712, 692, 445, 741, 825, 474, 687, 851, 635, 254, 796, 716, 486, 906, 576, 416, 866, 694, 808, 376, 745, 853, 475, 907, 637, 487, 798, 718, 914, 490, 695, 812, 432, 724, 867, 698, 380, 857, 753, 477, 909, 719, 799, 255, 608, 915, 814, 440, 726, 840, 699, 491, 869, 624, 382, 930, 740, 820, 498, 917, 727, 815, 464, 701, 844, 730, 444, 873, 931, 742, 493, 822, 672, 921, 383, 846, 632, 962, 499, 731, 933, 743, 823, 446, 852, 746, 904, 472, 826, 688, 881, 501, 636, 847, 963, 733, 256, 827, 696, 937, 476, 854, 747, 908, 868, 447, 638, 855, 965, 754, 505, 910, 720, 829, 858, 488, 700, 870, 916, 478, 749, 945, 859, 639, 911, 492, 969, 755, 800, 918, 479, 702, 871, 874, 728, 494, 861, 816, 757, 932, 919, 500, 977, 732, 875, 922, 703, 495, 934, 824, 761, 882, 384, 923, 848, 744, 877, 993, 734, 502, 935, 828, 883, 748, 964, 503, 938, 925, 735, 856, 939, 750, 506, 885, 966, 830, 756, 946, 860, 448, 967, 751, 912, 831, 889, 970, 507, 640, 941, 872, 947, 758, 862, 971, 509, 949, 759, 876, 920, 978, 863, 762, 480, 973, 924, 979, 878, 704, 936, 953, 884, 496, 994, 763, 926, 879, 981, 886, 940, 765, 504, 995, 985, 927, 887, 736, 942, 890, 968, 948, 997, 508, 943, 752, 891, 972, 832, 950, 1001, 893, 760, 974, 951, 510, 980, 954, 1009, 975, 764, 864, 982, 955, 880, 996, 983, 957, 986, 511, 766, 998, 928, 888, 987, 999, 1002, 944, 892, 989, 767, 952, 1003, 894, 1010, 976, 956, 512, 1005, 895, 1011, 958, 984, 1013, 768, 988, 959, 1017, 1000, 990, 1004, 991, 1006, 1012, 1007, 896, 1014, 1015, 1018, 960, 1019, 1021, 992, 1008, 1016, 1020, 1022, 1023, 1024]; and sequence S20: [1, 2, 3, 5, 9, 17, 33, 4, 6, 513, 65, 7, 10, 11, 129, 18, 13, 19, 34, 257, 21, 35, 25, 66, 37, 67, 8, 12, 130, 41, 69, 14, 514, 20, 131, 49, 15, 73, 258, 22, 133, 36, 81, 23, 259, 26, 137, 38, 261, 515, 97, 145, 27, 39, 265, 68, 42, 29, 161, 70, 43, 50, 75, 517, 273, 193, 71, 45, 132, 16, 74, 289, 51, 24, 53, 521, 134, 82, 321, 77, 135, 28, 57, 83, 138, 260, 529, 40, 98, 385, 30, 85, 139, 262, 146, 545, 31, 99, 44, 89, 141, 263, 147, 72, 516, 266, 46, 101, 162, 52, 149, 47, 518, 76, 267, 163, 274, 105, 54, 153, 577, 78, 269, 194, 165, 275, 55, 519, 84, 136, 58, 113, 195, 290, 522, 79, 169, 277, 59, 86, 61, 523, 87, 140, 100, 197, 90, 641, 291, 281, 142, 177, 91, 102, 530, 148, 143, 32, 103, 264, 525, 106, 322, 293, 201, 531, 323, 150, 297, 48, 93, 546, 209, 268, 386, 325, 769, 305, 164, 151, 107, 533, 56, 154, 225, 387, 329, 547, 270, 114, 80, 537, 166, 109, 155, 276, 578, 60, 271, 115, 167, 549, 157, 196, 170, 198, 579, 171, 278, 292, 520, 279, 117, 88, 62, 524, 178, 282, 63, 642, 92, 144, 389, 294, 553, 199, 104, 337, 581, 173, 283, 202, 526, 121, 179, 295, 532, 94, 152, 324, 643, 393, 298, 203, 561, 108, 285, 181, 527, 210, 95, 205, 585, 299, 353, 326, 770, 185, 211, 534, 401, 306, 301, 645, 110, 156, 327, 548, 116, 111, 593, 168, 213, 307, 535, 330, 158, 771, 226, 118, 172, 538, 331, 227, 649, 388, 309, 217, 550, 417, 338, 773, 159, 272, 609, 119, 280, 657, 333, 390, 174, 539, 122, 200, 551, 180, 229, 777, 339, 313, 580, 391, 123, 554, 394, 284, 541, 64, 175, 341, 673, 449, 354, 582, 395, 233, 555, 204, 296, 562, 286, 587, 182, 206, 785, 125, 183, 705, 287, 300, 583, 355, 212, 557, 402, 186, 644, 397, 345, 528, 207, 302, 586, 96, 801, 187, 241, 563, 328, 403, 536, 214, 565, 357, 308, 646, 303, 112, 594, 228, 833, 418, 332, 589, 215, 405, 647, 310, 540, 189, 160, 569, 218, 361, 595, 419, 650, 409, 369, 772, 230, 552, 450, 421, 610, 311, 897, 120, 334, 542, 219, 597, 176, 651, 392, 231, 774, 314, 658, 124, 340, 543, 335, 611, 221, 451, 556, 425, 601, 315, 653, 234, 235, 775, 288, 659, 453, 584, 126, 778, 342, 396, 558, 356, 613, 343, 674, 184, 398, 564, 433, 661, 317, 559, 346, 588, 242, 208, 779, 404, 675, 358, 786, 188, 617, 237, 566, 127, 665, 243, 347, 590, 399, 781, 216, 706, 406, 677, 359, 787, 304, 567, 362, 596, 190, 648, 457, 570, 349, 465, 625, 420, 707, 407, 802, 245, 591, 410, 681, 363, 789, 220, 571, 422, 598, 370, 573, 312, 599, 191, 652, 411, 612, 232, 709, 249, 602, 365, 803, 336, 793, 423, 316, 222, 654, 371, 689, 426, 603, 452, 614, 413, 660, 481, 655, 236, 544, 223, 615, 344, 776, 318, 618, 373, 834, 427, 805, 128, 713, 454, 835, 238, 662, 809, 434, 560, 319, 605, 455, 721, 348, 780, 429, 898, 400, 837, 377, 817, 244, 676, 239, 663, 458, 619, 568, 435, 666, 360, 737, 350, 899, 246, 841, 459, 782, 626, 408, 592, 364, 678, 351, 621, 437, 667, 192, 788, 572, 247, 783, 466, 627, 412, 679, 669, 461, 708, 250, 682, 366, 710, 441, 683, 790, 467, 804, 424, 791, 629, 372, 600, 251, 574, 414, 690, 794, 367, 575, 469, 604, 656, 482, 901, 374, 806, 428, 711, 616, 415, 849, 253, 685, 795, 483, 714, 473, 633, 691, 224, 807, 606, 375, 664, 485, 836, 905, 430, 810, 456, 715, 620, 378, 797, 693, 436, 722, 320, 607, 717, 240, 811, 865, 431, 838, 460, 697, 723, 379, 913, 818, 489, 813, 622, 438, 668, 462, 839, 628, 381, 623, 680, 439, 725, 819, 352, 842, 670, 497, 738, 630, 468, 684, 843, 248, 739, 442, 900, 821, 463, 729, 929, 470, 850, 671, 784, 443, 631, 792, 252, 845, 902, 368, 686, 634, 254, 712, 692, 471, 741, 851, 416, 825, 903, 484, 635, 906, 796, 445, 576, 687, 376, 853, 961, 474, 866, 907, 745, 486, 716, 808, 475, 798, 694, 255, 718, 637, 695, 432, 799, 812, 380, 867, 724, 914, 487, 698, 909, 477, 857, 719, 814, 490, 608, 699, 753, 440, 840, 915, 726, 491, 869, 820, 382, 815, 624, 740, 498, 930, 844, 727, 493, 917, 822, 701, 464, 672, 730, 873, 383, 931, 921, 881, 499, 742, 962, 933, 444, 823, 632, 846, 731, 446, 688, 904, 743, 472, 826, 636, 852, 447, 847, 733, 963, 937, 256, 827, 746, 747, 476, 800, 965, 638, 854, 501, 908, 868, 855, 696, 488, 910, 945, 829, 858, 505, 754, 720, 916, 478, 870, 700, 749, 639, 755, 492, 859, 911, 728, 918, 479, 871, 816, 874, 702, 384, 969, 861, 977, 932, 919, 494, 757, 922, 875, 732, 934, 500, 882, 824, 703, 923, 495, 744, 761, 877, 848, 935, 828, 502, 734, 883, 938, 964, 925, 448, 993, 748, 735, 856, 830, 885, 503, 939, 640, 966, 750, 946, 831, 506, 967, 860, 941, 912, 889, 756, 507, 751, 970, 947, 872, 862, 758, 971, 480, 920, 876, 863, 949, 704, 759, 978, 509, 924, 973, 762, 878, 953, 979, 936, 884, 496, 763, 926, 879, 981, 994, 886, 940, 927, 504, 765, 995, 985, 736, 887, 997, 942, 968, 890, 948, 508, 832, 752, 943, 972, 891, 1001, 950, 974, 893, 951, 864, 510, 1009, 980, 760, 975, 982, 764, 880, 766, 983, 928, 996, 511, 957, 888, 986, 998, 987, 767, 944, 892, 999, 989, 1002, 952, 1003, 894, 1010, 1005, 976, 512, 895, 1011, 956, 958, 984, 959, 768, 988, 1013, 1000, 1017, 990, 1004, 991, 896, 1006, 1012, 1007, 1014, 960, 1015, 1018, 1019, 992, 1021, 1008, 1016, 1020, 1022, 1023, 1024].

The foregoing sequences with relatively good performance that are obtained through simulation may be compared by using a preset performance determining rule. Optionally, this embodiment of this application provides an example of a performance determining rule, but this is not limited thereto.

A possible performance determining rule is described as follows.

Evaluation measurement: signal-to-noise ratios (SNR) required when a block error rate (BLER) reaches $10^{-2}$ and $10^{-3}$.

Simulation assumption:

| Channel | Additive white Gaussian noise (AWGN) channel |
|---|---|
| Modulation mode | Quadrature phase shift keying (QPSK) |
| Information code block length K (K does not include a CRC bit) | $K = [8, \min(200, K_{max,N}), \text{ where } K_{max,N} = \lfloor 5N/6 - (J + J') \rfloor]$<br>$K = \min(200, K), K_{max,N}], K_{max,N},$ where $K_{max,N} = \lfloor 5N/6 - (J + J') \rfloor$<br>A K value that enables a bit rate to be less than 1/8 is not considered. |
| Code length N | {64, 128, 256, 512, 1024} |
| Decoding algorithm | LLR-based min-sum decoding algorithm for a list-X |
| Size of a list X | 1, 2, 4, 8, and 16 (CRC check is performed by using only eight best paths) |
| Construction method | CA polar |
| Quantity of (J + J') | 19 bits (0b10100010101101111001, where a last bit is d19) |

SNR values required when a BLER reaches $10^{-2}$ and $10^{-3}$ are respectively evaluated. To be specific, sequences A and B are given. Each combination (N, K) is investigated based on the simulation parameter in the foregoing table. For example, N=64, and K=10. An SNR value required when BLER=$10^{-2}$ by a polar code using the sequence A is denoted as HA, and an SNR value required when BLER=$10^{-2}$ by a polar code using the sequence B is denoted as HB. An interpolation HA-HB of the SNR values is compared with a given threshold. If the interpolation HA-FIB is greater than the threshold, it is recorded that the sequence B wins, a win count of the sequence B is incremented by 1, and a fail count of the sequence A is incremented by 1. If the interpolation HA-HB is less than a negative threshold, it is recorded that the sequence A wins, a win count of the sequence A is incremented by 1, and a fail count of the sequence B is incremented by 1. If the interpolation HA-HB is less than or equal to the threshold or greater than or equal to the negative threshold, it is recorded that the two sequences have same performance, and neither of the win counts of the two sequences is incremented. Further, SNR values required by the sequences A and B when BLER=$10^{-3}$ is reached are further investigated, an interpolation is compared with a threshold, and an operation is further performed on a win count.

Steps of determining the foregoing threshold are as follows.

When a length K of to-be-coded information is less than or equal to 200, PerfThresh_K=0.1 dB; or when K is greater than 200, PerfThresh_K=0.3 dB.

When a quantity of decoding lists is L=1, PerfThresh_L=0.4 dB; when L=2, PerfThresh_L=0.2 dB; or when L is another value, PerfThresh_L=0.1 dB.

A larger value in the two thresholds is selected as a final threshold, that is, PerfThresh=max (PerfThresh_K, PerfThresh_L).

A specific sequence comparison procedure is as follows.

Step 1: Calculate a win count, a fail count, and an overall fail count for each sequence. The sequence A is selected, and the sequence A is compared with the sequence B in each simulation case. For each simulation case, if performance of A is worse than that of B by PerfThresh, a fail count FailCount_AB of A versus B is incremented by 1; or if performance of A is better than that of B by PerfThresh, a win count WinCountAB of A versus B is incremented by 1. If (FailCount_AB−WinCountAB)/a total quantity of simulation cases >2%, an overall fail count OverallFail_A of A is incremented by 1. The sequence A is compared with a sequence C in each simulation case. For each simulation case, if the performance of A is worse than that of C by PerfThresh, a fail count FailCount_AC of A versus C is incremented by 1; or if the performance of A is better than that of C by PerfThresh, a quantity of win times WinCount_AC of A versus C is incremented by 1. If (FailCount_AC−WinCount_AC)/a total quantity of simulation cases >2%, the overall fail count OverallFail_A of A is incremented by 1. The process is repeated for sequences D to N. The sequence B is selected, and the sequence B is compared with the sequence B in each simulation case, and so on. The sequence N is selected, and the sequence N is compared with the sequence A, and so on. A sequence with a minimum overall fail count OverallFail is selected.

Step 2: If a plurality of sequences A to M each have a minimum overall fail count OverallFail, for the sequence A, the sequence A is compared with the sequence B in each simulation case. For each simulation case, if the performance of A is better than that of B by PerfThresh, the win count WinCount_AB of A versus B is incremented by 1. The sequence A is compared with the sequence C in each simulation case. For each simulation case, if the performance of A is better than that of C, by PerfThresh, the win count WinCount_AC of A versus C is incremented by 1, and an overall win count of A is WinCount A=ΣWinCount_ AB . . . AM. The process is repeated until the sequence A is compared with the sequence M. The process is repeated for sequences B to M. A sequence with a maximum overall win count WinCount is selected, and it is assumed that the sequence is a sequence W.

Step 3: The sequence W with a maximum overall win count is given. If there is a sequence x and a win count of x for W is greater than a win count of W for x, namely WinCount_xW>WinCount Wx, the sequence x is also selected to enter a next round.

Step 4: If a plurality of sequences are selected, a final sequence is determined through voting.

It should be noted that the foregoing sequences S1 to S20 may be applied in the polar coding method shown in FIG. 2 in this embodiment of this application. In any sequence, adjustments or equivalent replacements including but not limited to the following several aspects may be made without affecting an overall effect of the sequence.

1. Locations of a few elements in a sorting sequence are mutually exchanged. For example, a location of a sequence number may be adjusted within a specified amplitude. For example, the specified amplitude is 5, and a location of an element whose sequence number is 10 may be adjusted within a range from five locations on the left of the element to five locations on the right of the element.

2. Some elements in the sorting sequence are adjusted, but sets of channels that are used to transmit T-bit information and that are selected based on the sorting sequence may be the same or similar.

3. The sorting sequence includes N elements from 1 to N, and the N elements from 1 to N represent sequence numbers of N polarized channels. Actually, the sequence numbers of the N polarized channels may begin with 0 and end with N−1, and the sequence numbers may be obtained by subtracting 1 from each sequence number in the sorting sequence. This is also a form of a sequence number in the foregoing calculation manner. Certainly, another manner may alternatively be used to represent the sequence numbers or identifiers of the polarized channels, and the specific expression manner does not affect specific locations of the polarized channels represented in the sorting sequence.

4. The sequence numbers of the N polarized channels in the sorting sequence are arranged in descending order of reliability of the N polarized channels. Actually, the sequence numbers of the N polarized channels may alternatively be arranged in ascending order of reliability of the N polarized channels. Elements in the sorting sequence are arranged in a reverse order.

5. The sorting sequence may further be represented by using a sorting sequence of normalized reliability or equivalent reliability of all the channels. For example, if a sorting location of a channel x in the sequence is y (a minimum sequence number in the sorting sequence is denoted as 1), reliability of the channel may be represented by y or normalized y/N, where N is a length of the sorting sequence.

Figure 3:
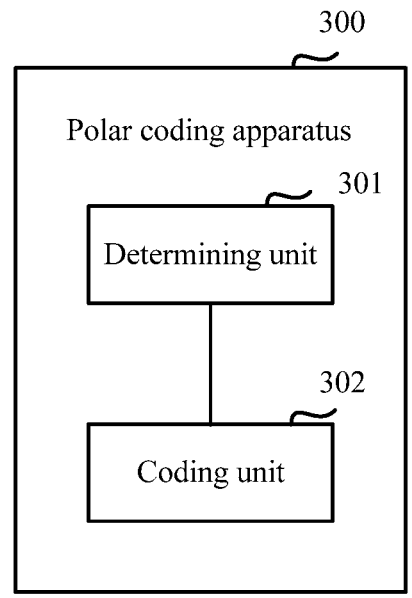
FIG. 3 is a first schematic structural diagram of a polar coding apparatus according to an embodiment of this application.

Based on the polar coding method shown in FIG. 2, as shown in FIG. 3, an embodiment of this application further provides a polar coding apparatus 300. The polar coding apparatus 300 is configured to perform the polar coding method shown in FIG. 2. The Polar coding apparatus 300 includes:

a determining unit 301, configured to determine a sequence used to code to-be-coded bits, where the sequence is used to represent a reliability order of N polarized channels, N is a mother code length of a polar code, and N is a positive integer power of 2; and a coding unit 302, configured to perform polar coding on the to-be-coded bits by using the sequence to obtain coded bits.

Optionally, a length of the to-be-coded bits is K, the K to-be-coded bits are mapped to K polarized channels in the N polarized channels, and reliability of the K polarized channels is higher than reliability of remaining N−K polarized channels.

Optionally, the sequence may be a part or all of any one of the sequences (1) to (30) in the foregoing method, or may be a part or all of any one of the sequences S1 to S20 in the foregoing method.

Figure 4:
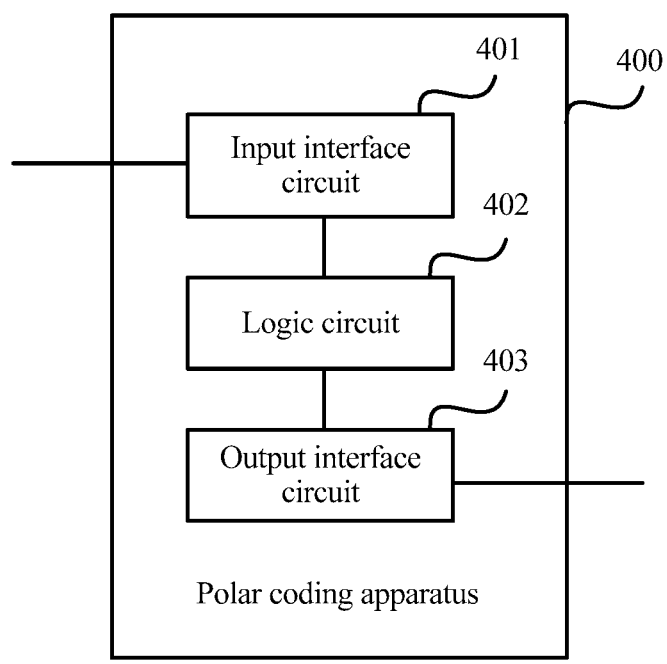
FIG. 4 is a second schematic structural diagram of a polar coding apparatus according to an embodiment of this application.

Based on a same inventive concept as the polar coding method shown in FIG. 2, as shown in FIG. 4, an embodiment of this application further provides a polar coding apparatus 400. The polar coding apparatus 400 is configured to perform the polar coding method shown in FIG. 2. A part or all of the polar coding method shown in FIG. 2 may be implemented by hardware or may be implemented by software. When the method is implemented by using hardware, the polar coding apparatus 400 includes: an input interface circuit 401, configured to obtain to-be-coded bits; a logic circuit 402, configured to perform the polar coding method shown in FIG. 2, where reference may be made to the description in the foregoing method embodiment and details are not described herein again; and an output interface circuit 403, configured to output a coded bit sequence.

Optionally, in a specific implementation, the polar coding apparatus 400 may be a chip or an integrated circuit.

Figure 5:
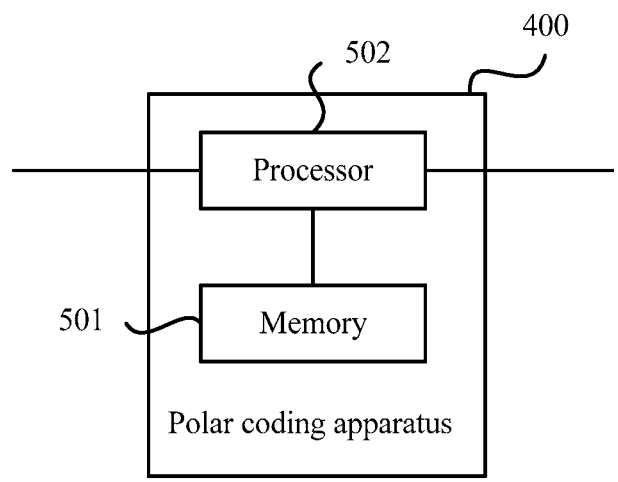
FIG. 5 is a third schematic structural diagram of a polar coding apparatus according to an embodiment of this application.

Optionally, when a part or all of the polar coding method in the foregoing embodiment are implemented by using software, as shown in FIG. 5, the polar coding apparatus 400 includes: a memory 501, configured to store a program; and a processor 502, configured to execute the program stored in the memory 501. When the program is executed, the polar coding apparatus 400 may implement the polar coding method provided in the foregoing embodiment in FIG. 2.

Figure 6:
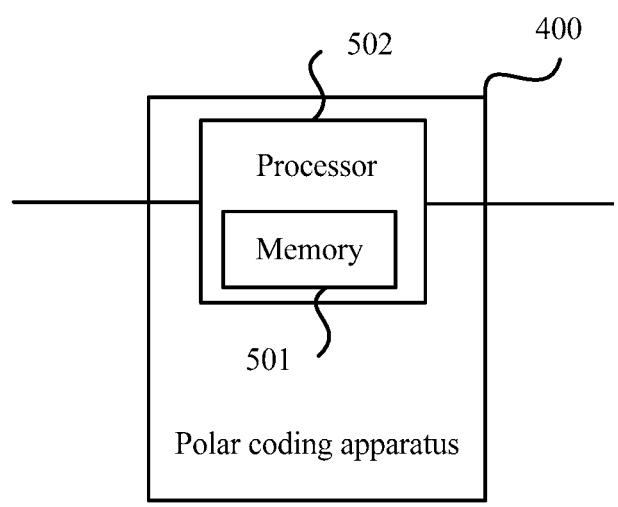
FIG. 6 is a fourth schematic structural diagram of a polar coding apparatus according to an embodiment of this application.

Optionally, the memory 501 may be a physically independent unit, or as shown in FIG. 6, the memory 501 is integrated into the processor 502.

Optionally, when a part or all of the coding method in the foregoing embodiment in FIG. 2 are implemented by using software, the polar code transmission apparatus 400 may include only the processor 502. The memory 501 configured to store a program is located outside the polar code transmission apparatus 400. The processor 502 is connected to the memory 501 by using a circuit/wire, and is configured to read and execute the program stored in the memory 501.

The processor 502 may be a central processing unit (CPU), a network processor (NP), or a combination of a CPU and an NP.

The processor 502 may further include a hardware chip. The hardware chip may be an application-specific integrated circuit (ASIC), a programmable logic device (PLD), or a combination thereof. The PLD may be a complex programmable logical device (CPLD), a field-programmable gate array (FPGA), generic array logic (GAL), or any combination thereof.

The memory 501 may include a volatile memory, such as a random access memory (RAM); the memory 501 may include a nonvolatile memory, such as a flash memory, a hard disk drive (HDD), or a solid-state drive (SSD); or the memory 501 may include a combination of the foregoing types of memories.

An embodiment of this application further provides a computer storage medium. The computer storage medium stores a computer program, and the computer program includes an instruction used to perform the polar coding method shown in FIG. 2.

An embodiment of this application further provides a computer program product including an instruction. When the computer program product runs on a computer, the computer performs the polar coding method shown in FIG. 2.

A person skilled in the art should understand that the embodiments of this application may be provided as a method, a system, or a computer program product. Therefore, this application may use a form of hardware-only embodiments, software-only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some embodiments of this application have been described, a person skilled in the art can make changes and modifications to these embodiments once they learn the basic inventive concept. Therefore, the following claims are intended to be construed as to cover the preferred embodiments and all changes and modifications falling within the scope of this application.

Obviously, a person skilled in the art can make various modifications and variations to the embodiments of this application without departing from the spirit and scope of the embodiments of the present invention. This application is intended to cover these modifications and variations provided that they fall within the scope of protection defined by the following claims and their equivalent technologies.

The invention claimed is:

1. A polar decoding method, comprising:
   obtaining to-be-decoded bits;
   determining a sequence with a length N based on a preset sequence, wherein the sequence comprises N sequence numbers of N polarized channels, the N sequence numbers are arranged in the sequence based on reliability of the N polarized channels, an order of N sequence numbers in the preset sequence is same as an order of the N sequence numbers in another sequence, the another sequence comprises 1024 sequence numbers of 1024 polarized channels, the 1024 sequence numbers are arranged in the another sequence based on reliability of the 1024 polarized channels, the another sequence is [1, 2, $L_1^{(m=3)}$ 17, 33, $L_2^{(m=1011)}$, $L_3^{(m=2)}$, 1020, 1022, 1023, 1024], wherein $L_n^{(m)}$ is a subsequence in the preset sequence, wherein n is a sequence number of the subsequence in preset sequence, wherein n∈{1, 2, 3}, wherein m indicates a length of an $n^{th}$ subsequence, and wherein locations of elements in the subsequence are able to be mutually exchanged in the subsequence, and N is one of the following values: 64, 128, 256, 512, or 1024; and
   performing polar decoding on the to-be-decoded bits by using the sequence with the length N to obtain decoded bits.

2. The method according to claim 1, wherein a length of the to-be-decoded bits is K, and wherein the K to-be-decoded bits are mapped to K polarized channels in the N polarized channels.

3. The method according to claim 1, wherein $L_n^{(m)}$ meets at least one of the following conditions: $L_1^{(m=3)}$=(5, 9, 3); $L_2^{(m=1011)}$=(7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021); and $L_3^{(m=2)}$=(1016, 1008).

4. A polar decoding apparatus, comprising:
at least one processor; and
one or more memories coupled to the at least one processor and storing programming instructions for execution by the at least one processor to:
obtain to-be-decoded bits;
determine a sequence with a length N based on a preset sequence, wherein the sequence comprises N sequence numbers of N polarized channels, the N sequence numbers are arranged in the sequence based on reliability of the N polarized channels, an order of N sequence numbers in the preset sequence is same as an order of the N sequence numbers in another sequence, the another sequence comprises 1024 sequence numbers of 1024 polarized channels, the 1024 sequence numbers are arranged in the another sequence based on reliability of the 1024 polarized channels, the another sequence is [1, 2, $L_1^{(m=3)}$ 17, 33, $L_2^{(m=1011)}$, $L_3^{(m=2)}$, 1020, 1022, 1023, 1024], wherein $L_n^{(m)}$ is a subsequence in the preset sequence, wherein n is a sequence number of the subsequence in the preset sequence, wherein n∈{1, 2, 3}, wherein m indicates a length of an $n^{th}$ subsequence, and wherein locations of elements in the subsequence are able to be mutually exchanged in the subsequence, and N is one of the following values: 64, 128, 256, 512, or 1024; and
perform polar decoding on the to-be-decoded bits by using the sequence with the length N to obtain decoded bits.

5. The apparatus according to claim 4, wherein a length of the to-be-decoded bits is K, and wherein the K to-be-decoded bits are mapped to K polarized channels in the N polarized channels.

6. The apparatus according to claim 4, wherein $L_n^{(m)}$ meets at least one of the following conditions: $L_1^{(m=3)}$=(5, 9, 3); $L_2^{(m=1011)}$=(7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021); and $L_3^{(m=2)}$=(1016, 1008).

7. The apparatus according to claim 4, wherein the polar decoding apparatus is a chip or an integrated circuit.

8. A polar decoding apparatus, comprising:
an input interface circuit, the input interface circuit configured to obtain to-be-decoded bits;
a logic circuit, the logic circuit configured to perform:
determining a sequence with a length N based on a preset sequence based on a preset sequence, wherein the sequence comprises N sequence numbers of N polarized channels, the N sequence numbers are arranged in the sequence based on reliability of the N polarized channels, an order of N sequence numbers in the preset sequence is same as an order of the N sequence numbers in another sequence, the another sequence comprises 1024 sequence numbers of 1024 polarized channels, the 1024 sequence numbers are arranged in the another sequence based on reliability of the 1024 polarized channels, the another sequence is [1, 2, $L_1^{(m=3)}$ 17, 33, $L_2^{(m=1011)}$, $L_3^{(m=2)}$, 1020, 1022, 1023, 1024], wherein $L_n^{(m)}$ is a subsequence in the preset sequence, wherein n is a sequence number of the subsequence in the preset sequence, wherein n∈{1, 2, 3}, wherein m indicates a length of an $n^{th}$ subsequence, and wherein locations of elements in the subsequence are able to be mutually exchanged in the subsequence, and N is one of the following values: 64, 128, 256, 512, or 1024; and
performing polar decoding on the to-be-decoded bits by using the sequence with the length N to obtain decoded bits; and
an output interface circuit, the output interface circuit configured to output the decoded bits.

9. The apparatus according to claim 8, wherein a length of the to-be-decoded bits is K, and wherein the K to-be-decoded bits are mapped to K polarized channels in the N polarized channels.

10. The apparatus according to claim 8, wherein $L_n^{(m)}$ meets at least one of the following conditions: $L_1^{(m=3)}$=(5, 9, 3); $L_2^{(m=1011)}$=(7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021); and $L_3^{(m=2)}$=(1016, 1008).

11. A non-transitory computer storage medium, wherein the non-transitory computer storage medium stores a computer program, and wherein the computer program comprises programming instructions for execution by at least one processor to:
obtain to-be-decoded bits;
determine a sequence with a length N based on a preset sequence based on a preset sequence, wherein the sequence comprises N sequence numbers of N polarized channels, the N sequence numbers are arranged in the sequence based on reliability of the N polarized channels, an order of N sequence numbers in the preset sequence is same as an order of the N sequence numbers in another sequence, the another sequence comprises 1024 sequence numbers of 1024 polarized channels, the 1024 sequence numbers are arranged in the another sequence based on reliability of the 1024 polarized channels, the another sequence is [1, 2, $L_1^{(m=3)}$ 17, 33, $L_2^{(m=1011)}$, $L_3^{(m=2)}$, 1020, 1022, 1023, 1024], wherein $L_n^{(m)}$ is a subsequence in the preset sequence, wherein n is a sequence number of the subsequence in the preset sequence, wherein n∈{1, 2, 3}, wherein m indicates a length of an $n^{th}$ subsequence, and wherein locations of elements in the subsequence are able to be mutually exchanged in the subsequence, and N is one of the following values: 64, 128, 256, 512, or 1024; and
perform polar decoding on the to-be-decoded bits by using the sequence with the length N to obtain decoded bits.

12. The non-transitory computer storage medium according to claim 11, wherein a length of the to-be-decoded bits is K, and wherein the K to-be-decoded bits are mapped to K polarized channels in the N polarized channels.

13. The non-transitory computer storage medium according to claim 11, wherein $L_n^{(m)}$ meets at least one of the following conditions: $L_1^{(m=3)}$=(5, 9, 3); $L_2^{(m=1011)}$=(7, 65, 513, 4, 13, 6, 19, 129, 10, 34, 18, 11, 257, 21, 35, 25, 66, 8, 37, 67, 130, 12, 41, 20, 133, 514, 14, 69, 49, 15, 73, 258, 22, 131, 27, 36, 81, 259, 137, 39, 23, 261, 517, 38, 26, 97, 68, 265, 42, 145, 29, 70, 50, 75, 161, 43, 521, 273, 193, 71, 45, 132, 82, 16, 289, 51, 135, 74, 515, 24, 53, 321, 134, 77, 83, 138, 57, 28, 260, 529, 98, 40, 385, 139, 85, 30, 262, 146, 545, 44, 99, 141, 31, 89, 263, 147, 72, 519, 266, 162, 46, 101, 149, 52, 47, 577, 76, 267, 105, 274, 165, 194, 54, 516, 163, 269, 78, 153, 275, 55, 525, 84, 58, 113, 86, 136, 290, 518, 195, 79, 291, 59, 277, 169, 531, 100, 140, 197, 87, 177, 641, 61, 90, 281, 102, 148, 293, 522, 142, 322, 143, 91, 201, 546, 32, 103, 264, 106, 530, 323, 150, 297, 48, 523, 93, 209, 268, 386, 325, 305, 537, 769, 533, 164, 154, 151, 107, 56, 166, 387, 578, 329, 549, 270, 114, 155, 80, 225, 167, 276, 109, 579, 271, 60, 115, 196, 170, 157, 88, 547, 62, 278, 292, 520, 279, 117, 171, 198, 642, 178, 282, 92, 553, 202, 389, 294, 199, 524, 63, 144, 337, 585, 173, 283, 121, 645, 104, 179, 295, 532, 203, 94, 324, 561, 393, 298, 152, 581, 210, 285, 181, 526, 108, 95, 205, 770, 299, 353, 326, 527, 156, 110, 534, 401, 306, 301, 643, 211, 185, 327, 539, 116, 168, 593, 158, 226, 307, 548, 330, 111, 771, 213, 118, 172, 551, 331, 227, 649, 388, 309, 159, 609, 417, 338, 535, 217, 272, 550, 119, 280, 538, 333, 390, 174, 580, 122, 200, 777, 180, 229, 554, 339, 657, 313, 541, 391, 175, 582, 394, 284, 773, 123, 673, 555, 785, 64, 341, 705, 449, 562, 354, 801, 395, 233, 204, 528, 583, 557, 296, 286, 182, 125, 206, 241, 644, 586, 563, 287, 300, 355, 183, 402, 212, 397, 345, 587, 833, 565, 96, 186, 207, 328, 646, 536, 403, 594, 187, 357, 589, 569, 308, 647, 419, 214, 302, 228, 303, 897, 595, 361, 112, 650, 772, 418, 540, 215, 405, 310, 189, 450, 332, 218, 160, 610, 597, 552, 651, 120, 230, 334, 409, 542, 774, 611, 658, 311, 421, 601, 219, 369, 231, 653, 392, 176, 314, 340, 543, 335, 124, 556, 775, 234, 315, 659, 613, 342, 778, 451, 221, 425, 356, 674, 584, 126, 235, 184, 396, 242, 558, 661, 617, 317, 343, 346, 779, 564, 404, 288, 398, 453, 675, 559, 786, 433, 188, 358, 208, 665, 588, 781, 706, 677, 237, 347, 566, 362, 127, 243, 590, 406, 216, 399, 567, 304, 598, 359, 802, 420, 625, 457, 787, 349, 245, 570, 190, 591, 220, 648, 312, 707, 363, 596, 465, 803, 407, 681, 422, 789, 249, 599, 191, 571, 370, 652, 410, 835, 411, 709, 481, 614, 232, 573, 316, 660, 365, 423, 336, 689, 371, 793, 222, 612, 452, 602, 426, 805, 413, 654, 454, 834, 318, 713, 236, 603, 344, 544, 373, 655, 223, 615, 427, 776, 434, 560, 238, 899, 618, 348, 809, 244, 721, 455, 666, 319, 605, 377, 662, 429, 780, 239, 676, 360, 837, 459, 626, 400, 663, 678, 435, 568, 458, 817, 246, 619, 350, 788, 128, 782, 898, 408, 667, 437, 592, 364, 621, 466, 737, 351, 679, 572, 247, 682, 250, 627, 461, 708, 841, 412, 783, 366, 790, 441, 600, 375, 669, 629, 424, 901, 467, 849, 804, 251, 791, 372, 710, 192, 574, 690, 482, 683, 414, 604, 794, 367, 714, 469, 711, 374, 575, 656, 428, 807, 415, 685, 905, 253, 616, 483, 633, 806, 430, 795, 865, 224, 691, 456, 715, 836, 473, 810, 378, 606, 620, 436, 664, 722, 320, 797, 485, 693, 913, 431, 607, 717, 489, 811, 460, 839, 668, 240, 818, 622, 379, 838, 723, 438, 697, 462, 738, 680, 381, 813, 628, 248, 900, 842, 442, 623, 929, 352, 725, 784, 470, 630, 819, 439, 670, 463, 739, 684, 252, 843, 850, 497, 902, 821, 729, 468, 634, 903, 368, 671, 792, 443, 845, 631, 475, 686, 851, 484, 692, 712, 380, 866, 796, 416, 825, 961, 741, 254, 906, 635, 445, 694, 745, 486, 808, 687, 907, 471, 576, 716, 376, 867, 914, 474, 853, 637, 798, 432, 695, 812, 487, 753, 724, 799, 490, 857, 909, 255, 718, 608, 931, 477, 698, 726, 915, 440, 820, 840, 869, 493, 719, 699, 382, 814, 624, 815, 499, 873, 740, 930, 672, 917, 822, 464, 727, 962, 844, 491, 632, 730, 701, 383, 742, 846, 921, 472, 823, 852, 731, 498, 881, 743, 444, 904, 688, 826, 501, 446, 933, 847, 636, 746, 827, 733, 447, 963, 937, 476, 854, 868, 638, 908, 488, 696, 747, 829, 754, 855, 858, 916, 965, 478, 910, 720, 800, 700, 494, 505, 749, 945, 859, 874, 639, 755, 256, 969, 870, 492, 479, 384, 911, 816, 918, 728, 871, 702, 932, 861, 500, 757, 732, 824, 923, 875, 977, 919, 503, 934, 744, 761, 882, 495, 703, 922, 877, 502, 848, 993, 448, 734, 828, 883, 935, 964, 506, 938, 748, 856, 925, 735, 830, 966, 939, 885, 507, 750, 946, 860, 756, 480, 967, 831, 889, 941, 751, 872, 971, 912, 758, 947, 970, 862, 978, 876, 920, 640, 759, 949, 863, 762, 509, 973, 924, 878, 953, 887, 936, 979, 763, 504, 884, 704, 994, 926, 879, 981, 942, 765, 496, 927, 886, 995, 736, 940, 985, 968, 890, 948, 832, 508, 943, 752, 974, 997, 891, 950, 760, 893, 972, 1001, 954, 510, 864, 982, 951, 975, 764, 1009, 980, 880, 955, 987, 996, 892, 928, 511, 766, 957, 998, 983, 888, 986, 944, 999, 1002, 767, 989, 952, 1005, 894, 1011, 958, 976, 512, 1003, 895, 984, 1010, 956, 988, 1013, 959, 1000, 1006, 990, 1017, 991, 1012, 768, 1004, 1015, 1007, 1018, 896, 1014, 992, 1019, 960, 1021); and $L_3^{(m=2)}$=(1016, 1008).

* * * * *